US011871641B2

United States Patent
Yamazaki et al.

(10) Patent No.: US 11,871,641 B2
(45) Date of Patent: Jan. 9, 2024

(54) DISPLAY DEVICE, DISPLAY MODULE, AND ELECTRONIC DEVICE

(71) Applicant: SEMICONDUCTOR ENERGY LABORATORY CO., LTD., Atsugi (JP)

(72) Inventors: Shunpei Yamazaki, Tokyo (JP); Daisuke Kubota, Kanagawa (JP); Ryo Hatsumi, Kanagawa (JP); Taisuke Kamada, Saitama (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 551 days.

(21) Appl. No.: 17/258,391

(22) PCT Filed: Jul. 18, 2019

(86) PCT No.: PCT/IB2019/056135
§ 371 (c)(1),
(2) Date: Jan. 6, 2021

(87) PCT Pub. No.: WO2020/021399
PCT Pub. Date: Jan. 30, 2020

(65) Prior Publication Data
US 2021/0296409 A1    Sep. 23, 2021

(30) Foreign Application Priority Data
Jul. 27, 2018  (JP) ................................. 2018-140905

(51) Int. Cl.
*H10K 59/60* (2023.01)
*H10K 50/858* (2023.01)
(Continued)

(52) U.S. Cl.
CPC ........... *H10K 59/60* (2023.02); *H10K 50/858* (2023.02); *H10K 59/124* (2023.02); *H10K 59/65* (2023.02)

(58) Field of Classification Search
CPC .... H10K 59/60; H10K 50/858; H10K 59/124; H10K 59/65; H10K 59/123; H10K 65/00;
(Continued)

(56) References Cited

U.S. PATENT DOCUMENTS 9,817,520 B2    11/2017  Ikeda et al.
10,020,355 B2    7/2018  Ito
(Continued)

FOREIGN PATENT DOCUMENTS

CN    105304673 A    2/2016
CN    107563317 A    1/2018
(Continued)

OTHER PUBLICATIONS

International Search Report (Application No. PCT/IB2019/056135) dated Oct. 8, 2019.
(Continued)

*Primary Examiner* — Douglas W Owens
(74) *Attorney, Agent, or Firm* — Fish & Richardson P.C.

(57) ABSTRACT

A display device having a function of sensing light is provided. A highly convenient display device is provided. The display device includes a first substrate, a second substrate, a light-receiving element, a transistor, and a light-emitting element in a display portion. The light-receiving element, the transistor, and the light-emitting element are each positioned between the first substrate and the second substrate. The light-receiving element is positioned closer to the first substrate than the transistor is. The light-emitting element is positioned closer to the second substrate than the transistor is. The light-receiving element includes a layer
(Continued)

containing an organic compound. The transistor is electrically connected to the light-emitting element. The display device preferably further includes a lens and light transmitted through the lens preferably enters the light-receiving element.

16 Claims, 24 Drawing Sheets

(51) Int. Cl.
*H10K 59/65* (2023.01)
*H10K 59/124* (2023.01)

(58) Field of Classification Search
CPC .... H10K 30/00; H10K 30/20; H10K 50/8426; H10K 50/865; H10K 59/351; H10K 59/353; Y02E 10/549; G02B 3/00; G02B 5/20; G09F 9/30
See application file for complete search history.

(56) References Cited

U.S. PATENT DOCUMENTS

| | | | |
|---|---|---|---|
| 10,503,954 | B2 | 12/2019 | Xu et al. |
| 10,592,722 | B2 | 3/2020 | Xu et al. |
| 2002/0044208 | A1 | 4/2002 | Yamazaki et al. |
| 2011/0122108 | A1 | 5/2011 | Kozuma et al. |
| 2012/0002090 | A1 | 1/2012 | Aoki et al. |
| 2013/0299789 | A1 | 11/2013 | Yamazaki et al. |
| 2013/0321366 | A1 | 12/2013 | Kozuma et al. |
| 2014/0340363 | A1 | 11/2014 | Ikeda et al. |
| 2015/0261352 | A1 | 9/2015 | Miyake |
| 2015/0364527 | A1 | 12/2015 | Wang et al. |
| 2015/0380450 | A1 | 12/2015 | Okamoto et al. |
| 2016/0126275 | A1 | 5/2016 | Kurokawa |
| 2016/0301034 | A1* | 10/2016 | Hsu ................. H10K 50/858 |
| 2017/0288001 | A1 | 10/2017 | Ito |
| 2018/0033399 | A1 | 2/2018 | Kawashima et al. |
| 2018/0052363 | A1* | 2/2018 | Yamazaki ........... H04N 1/6066 |
| 2019/0065812 | A1 | 2/2019 | Xu et al. |
| 2020/0127064 | A1 | 4/2020 | Ikeda et al. |

FOREIGN PATENT DOCUMENTS

| | | |
|---|---|---|
| JP | 2008-241827 A | 10/2008 |
| JP | 2013-181103 A | 9/2013 |
| JP | 2014-197522 A | 10/2014 |
| JP | 2015-005280 A | 1/2015 |
| JP | 2017-188522 A | 10/2017 |
| JP | 2018-025775 A | 2/2018 |
| KR | 2015-0142816 A | 12/2015 |
| TW | 201816766 | 5/2018 |

OTHER PUBLICATIONS

Written Opinion (Application No. PCT/IB2019/056135) dated Oct. 8, 2019.

* cited by examiner

FIG. 1A
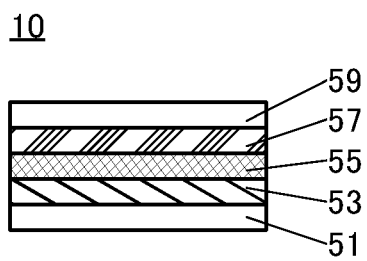
FIG. 1B  FIG. 1C  FIG. 1D
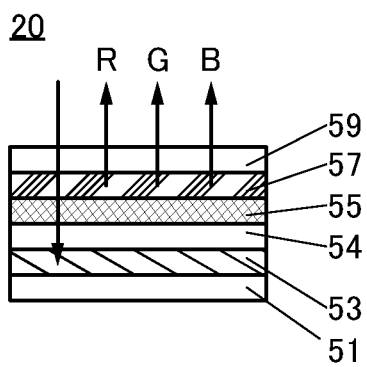 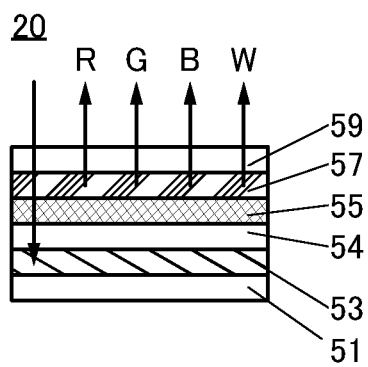 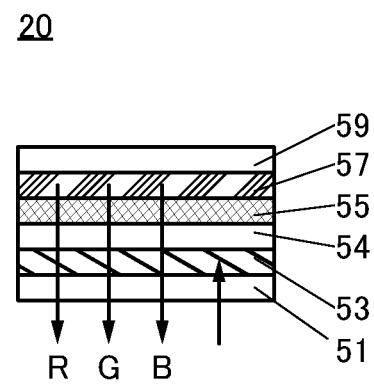
FIG. 1E  FIG. 1F  FIG. 1G  FIG. 1H
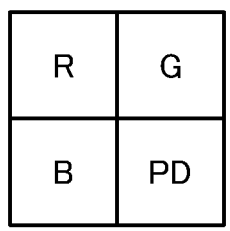 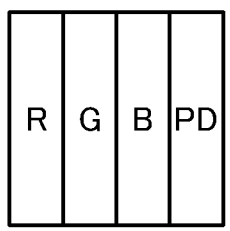 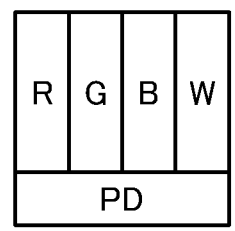 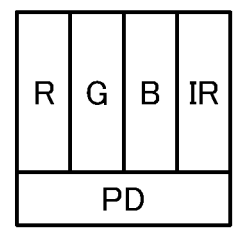

110A

110B

100A

110A

DISPLAY DEVICE, DISPLAY MODULE, AND ELECTRONIC DEVICE

CROSS REFERENCE TO RELATED APPLICATIONS

This application is a U.S. National Phase Application under 35 U.S.C. § 371 of International Application PCT/IB2019/056135, filed on Jul. 18, 2019, which is incorporated by reference and claims the benefit of a foreign priority application filed in Japan on Jul. 27, 2018, as Application No. 2018-140905.

TECHNICAL FIELD

One embodiment of the present invention relates to a display device, a display module, and an electronic device. One embodiment of the present invention relates to a display device including a light-receiving element and a light-emitting element.

Note that one embodiment of the present invention is not limited to the above technical field. Examples of the technical field of one embodiment of the present invention include a semiconductor device, a display device, a light-emitting device, a power storage device, a memory device, an electronic device, a lighting device, an input device (e.g., a touch sensor), an input/output device (e.g., a touch panel), a driving method thereof, or a manufacturing method thereof.

BACKGROUND ART

In recent years, application of display devices to a variety of uses has been expected. Examples of uses for a large display device include a television device for home use (also referred to as a TV or a television receiver), digital signage, and a PID (Public Information Display). In addition, a smartphone and a tablet terminal including a touch panel are being developed as portable information terminals.

Light-emitting devices including light-emitting elements have been developed as display devices. Light-emitting elements (also referred to as EL elements) utilizing electroluminescence (hereinafter referred to as EL) have features such as ease of reduction in thickness and weight, high-speed response to an input signal, and driving with a direct-current low voltage source, and have been applied to display devices. For example, Patent Document 1 discloses a flexible light-emitting device including an organic EL element.

REFERENCE

Patent Document

[Patent Document 1] Japanese Published Patent Application No. 2014-197522

SUMMARY OF THE INVENTION

Problems to be Solved by the Invention

An object of one embodiment of the present invention is to provide a display device having a function of sensing light. An object of one embodiment of the present invention is to provide a highly convenient display device. An object of one embodiment of the present invention is to provide a multifunctional display device. An object of one embodiment of the present invention is to provide a novel display device.

Note that the descriptions of these objects do not disturb the existence of other objects. One embodiment of the present invention does not need to achieve all of these objects. Other objects can be derived from the descriptions of the specification, the drawings, and the claims.

Means for Solving the Problems

One embodiment of the present invention is a display device including a first substrate, a second substrate, a light-receiving element, a transistor, and a light-emitting element in a display portion. The light-receiving element, the transistor, and the light-emitting element are each positioned between the first substrate and the second substrate. The light-emitting element is positioned closer to the first substrate than the transistor is. The light-emitting element is positioned closer to the second substrate than the transistor is. The light-receiving element includes a layer containing an organic compound. The transistor is electrically connected to the light-emitting element.

It is preferable that the display portion further include an insulating layer. The insulating layer is preferably positioned between the transistor and the light-receiving element.

In the case where the display portion includes the insulating layer, light preferably enters the light-receiving element through the insulating layer. In this case, it is preferable that the display portion further include a lens. The lens is preferably positioned over the insulating layer. Light transmitted through the lens preferably enters the light-receiving element through the insulating layer.

Alternatively, in the case where the display portion includes the insulating layer, light emitted from the light-emitting element is preferably extracted to the outside through the insulating layer. In this case, it is preferable that the display portion further include a coloring layer and a lens. Light emitted from the light-emitting element is preferably extracted to the outside through the coloring layer. Light transmitted through the lens preferably enters the light-receiving element.

One embodiment of the present invention is a display device including a light-receiving element, a first insulating layer over the light-receiving element, a first transistor over the first insulating layer, a second transistor over the first insulating layer, a second insulating layer over the first transistor, and a light-emitting element over the second insulating layer. The light-receiving element includes a layer containing an organic compound. The first insulating layer includes a first opening. The second insulating layer includes a second opening. The first transistor is electrically connected to the light-receiving element through the first opening. The second transistor is electrically connected to the light-emitting element through the second opening. The display device preferably further includes a lens. Light transmitted through the lens preferably enters the light-receiving element.

One embodiment of the present invention is a display device including a first transistor, a first insulating layer over the first transistor, a light-receiving element over the first insulating layer, an adhesive layer over the light-receiving element, a second insulating layer over the adhesive layer, a second transistor over the second insulating layer, a third insulating layer over the second transistor, and a light-emitting element over the third insulating layer. The light-receiving element includes a layer containing an organic compound. The first insulating layer includes a first opening. The third insulating layer includes a second opening. The first transistor is electrically connected to the light-receiving element through the first opening. The second transistor is electrically connected to the light-emitting element through the second opening. The display device preferably further includes a lens. Light transmitted through the lens preferably enters the light-receiving element.

One embodiment of the present invention is a module including the display device having any of the above-described structures, where a connector such as a flexible printed circuit (hereinafter also referred to as FPC) or a TCP (Tape Carrier Package) is attached or an integrated circuit (IC) is implemented by a COG (Chip On Glass) method, a COF (Chip On Film) method, or the like.

One embodiment of the present invention is an electronic device including the above display module and at least any one of an antenna, a battery, a housing, a camera, a speaker, a microphone, and an operation button.

Effect of the Invention

According to one embodiment of the present invention, a display device having a function of sensing light can be provided. According to one embodiment of the present invention, a highly convenient display device can be provided. According to one embodiment of the present invention, a multifunctional display device can be provided. According to one embodiment of the present invention, a novel display device can be provided.

Note that the descriptions of these effects do not disturb the existence of other effects. One embodiment of the present invention does not need to have all of these effects. Other effects can be derived from the descriptions of the specification, the drawings, and the claims.

BRIEF DESCRIPTION OF THE DRAWINGS

FIG. 1(A) to FIG. 1(D) are cross-sectional views each showing an example of a display device. FIG. 1(E) to FIG. 1(H) are top views each showing an example of a pixel.

MODE FOR CARRYING OUT THE INVENTION

Figure 2A:
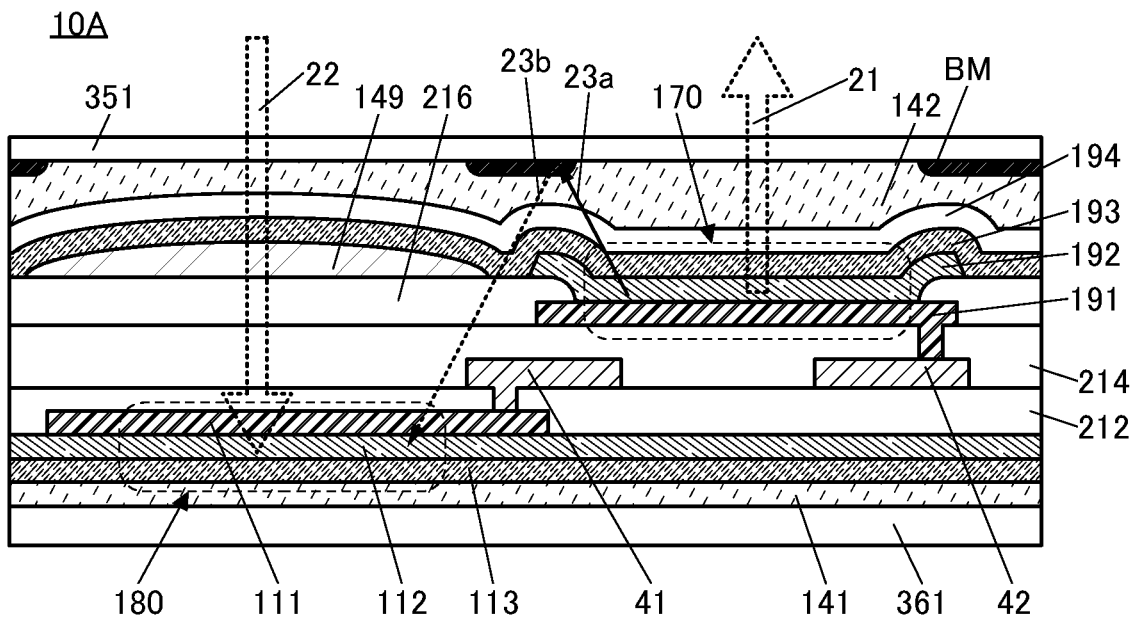
FIG. 2(A) and FIG. 2(B) are cross-sectional views each showing an example of a display device.

Embodiments are described in detail with reference to the drawings. Note that the present invention is not limited to the following description, and it is readily appreciated by those skilled in the art that modes and details of the present invention can be modified in various ways without departing from the spirit and scope of the present invention. Thus, the present invention should not be construed as being limited to the description in the following embodiments.

Note that in structures of the invention described below, the same portions or portions having similar functions are denoted by the same reference numerals in different drawings, and a description thereof is not repeated. Furthermore, the same hatch pattern is used for the portions having similar functions, and the portions are not especially denoted by reference numerals in some cases.

In addition, the position, size, range, or the like of each structure shown in drawings does not represent the actual position, size, range, or the like in some cases for easy understanding. Thus, the disclosed invention is not necessarily limited to the position, size, range, or the like disclosed in the drawings.

Note that the term "film" and the term "layer" can be interchanged with each other depending on the case or circumstances. For example, the term "conductive layer" can be changed into the term "conductive film". As another example, the term "insulating film" can be changed into the term "insulating layer".

Embodiment 1

In this embodiment, a display device of one embodiment of the present invention is described with reference to FIG. 1 to FIG. 18.

[Overview]

The display device of this embodiment includes a light-receiving element and a light-emitting element in its display portion. Specifically, light-emitting elements are arranged in a matrix in the display portion, and an image can be displayed on the display portion. In addition, light-receiving elements are arranged in a matrix in the display portion, and the display portion has a function of a light-receiving portion. The light-receiving portion can be used as an image sensor or a touch sensor. That is, by sensing light with the light-receiving portion, an image can be captured and the approach or contact of an object (e.g., a finger or a stylus) can be detected.

In the display device of this embodiment, when an object reflects light emitted from the light-emitting element included in the display portion, the light-receiving element can sense the reflected light; thus, imaging and touch (including near touch) detection are possible even in a dark place.

The display device of this embodiment has a function of displaying an image with the use of the light-emitting element. That is, the light-emitting element functions as a display element.

As the light-emitting element, an EL element such as an OLED (Organic Light Emitting Diode) or a QLED (Quantum-dot Light Emitting Diode) is preferably used. As a light-emitting substance included in the EL element, a substance emitting fluorescence (a fluorescent material), a substance emitting phosphorescence (a phosphorescent material), an inorganic compound (e.g., a quantum dot material), and a substance exhibiting thermally activated delayed fluorescence (a thermally activated delayed fluorescent (TADF) material) can be given as examples. Alternatively, an LED such as a micro-LED (Light Emitting Diode) can be used as the light-emitting element.

The display device of this embodiment has a function of sensing light with the use of the light-receiving element.

In the case where the light-receiving element is used as the image sensor, the display device of this embodiment can capture an image using the light-receiving element.

For example, data on a fingerprint, a palm print, an iris, or the like can be acquired with the image sensor. That is, a biological authentication sensor can be incorporated into the display device of this embodiment. When the display device incorporates a biological authentication sensor, the number of components of an electronic device can be reduced as compared to the case where a biological authentication sensor is provided separately from the display device; thus, the size and weight of the electronic device can be reduced.

In addition, data on facial expression, eye movement, change of the pupil diameter, or the like of the user can be acquired with the image sensor. By analysis of the data, data on the user's physical and mental state can be acquired. Changing the output contents of one or both of display and sound on the basis of the data allows the user to safely use a device for VR (Virtual Reality), a device for AR (Augmented Reality), or a device for MR (Mixed Reality), for example.

In the case where the light-receiving element is used as the touch sensor, the display device of this embodiment can detect the approach or contact of an object using the light-receiving element.

As the light-receiving element, a PN or PIN photodiode can be used, for example. The light-receiving element functions as a photoelectric conversion element that senses light entering the light-receiving element and generates charge. The amount of generated charge depends on the amount of incident light.

It is particularly preferable to use an organic photodiode including a layer containing an organic compound as the light-receiving element. An organic photodiode, which is easily made thin, lightweight, and large in area and has a high degree of freedom for shape and design, can be used in a variety of display devices.

FIG. 1(A) to FIG. 1(D) are cross-sectional views of display devices of one embodiment of the present invention.

A display device 10 shown in FIG. 1(A) includes a layer 53 including a light-receiving element, a layer 55 including a transistor, and a layer 57 including a light-emitting element between a substrate 51 and a substrate 59. The light-receiving element is positioned closer to the substrate 51 than the transistor is, and the light-emitting element is positioned closer to the substrate 59 than the transistor is.

A display device 20 shown in FIG. 1(B) to FIG. 1(D) includes an insulating layer 54 between the layer 53 including the light-receiving element and the layer 55 including the transistor, in addition to the components of the display device 10.

The display device 20 shown in FIG. 1(B) and FIG. 1(C) has a structure in which light enters the light-receiving element through the insulating layer 54. In this structure, the layer 57 including the light-emitting element is positioned closer to a display surface of the display device 20 than the layer 53 including the light-receiving element is.

The display device 20 shown in FIG. 1(D) has a structure in which light emitted from the light-emitting element is extracted to the outside through the insulating layer 54. In this structure, the layer 57 including the light-emitting element is positioned farther from a display surface of the display device 20 than the layer 53 including the light-receiving element is.

The display device 20 shown in FIG. 1(B) and FIG. 1(D) has a structure in which light of red (R), green (G), and blue (B) is emitted from the layer 57 including the light-emitting element. The display device 20 shown in FIG. 1(C) has a structure in which white (W) light is emitted from the layer 57 including the light-emitting element in addition to R, G, and B light.

The display device of one embodiment of the present invention includes a plurality of pixels arranged in a matrix. Each of the pixels includes one or more subpixels. Each of the subpixels includes one light-emitting element. For example, each pixel can employ three subpixels (e.g., three colors of R, G, and B, or three colors of yellow (Y), cyan (C), and magenta (M)), or four subpixels (e.g., four colors of R, G, B, and W, or four colors of R, G, B, and Y). The pixel further includes a light-receiving element. The light-receiving element may be provided in all the pixels or in some of the pixels. In addition, one pixel may include a plurality of light-receiving elements.

FIG. 1(E) to FIG. 1(H) show examples of pixels.

The pixels shown in FIG. 1(E) and FIG. 1(F) includes three subpixels (three light-emitting elements) of R, G, and B and a light-receiving element PD. FIG. 1(E) shows an example in which the three subpixels and the light-receiving element PD are arranged in a 2×2 matrix, and FIG. 1(F) shows an example in which the three subpixels and the light-receiving element PD are arranged in one row.

The pixel shown in FIG. 1(G) includes four subpixels (four light-emitting elements) of R, G, B, and W and the light-receiving element PD.

The pixel shown in FIG. 1(H) includes three subpixels of R, G, and B, a light-emitting element IR that emits infrared light, and the light-receiving element PD. Here, the light-receiving element PD preferably has a function of sensing infrared light. The light-emitting element PD may have a function of sensing both visible light and infrared light. The wavelength of light that the light-receiving element PD senses can be determined depending on the application of the sensor.

The detailed structure of the display device of one embodiment of the present invention is described below with reference to FIG. 2 to FIG. 4.

[Display Device 10A]

FIG. 2(A) shows a cross-sectional view of a display device 10A.

The display device 10A includes a light-emitting element 170, a light-receiving element 180, a transistor 41, a transistor 42, and the like between a pair of substrates (a substrate 351 and a substrate 361). It is preferable that the display device 10A further include a lens 149. With the lens 149, the amount of incident light on the light-receiving element 180 can be increased.

The light-emitting element 170 includes an electrode 191, an EL layer 192, and an electrode 193. The EL layer 192 is positioned between the electrode 191 and the electrode 193. The EL layer 192 contains at least a light-emitting substance. The electrode 193 has a function of transmitting visible light. The electrode 191 preferably has a function of reflecting visible light.

The light-emitting element 170 has a function of emitting visible light. Specifically, the light-emitting element 170 is an electroluminescent element that emits light to the substrate 351 side (see emitted light 21) by applying voltage between the electrode 191 and the electrode 193.

The electrode 191 is electrically connected to a source or a drain included in the transistor 42 through an opening provided in an insulating layer 214. The electrode 191 has a function of a pixel electrode. End portions of the electrode 191 are covered with an insulating layer 216.

It is preferable that the EL layer 192 be formed not to overlap with a light-receiving region of the light-receiving element 180. Accordingly, it is possible to inhibit the EL layer 192 from absorbing light 22, so that the amount of light with which the light-receiving element 180 is irradiated can be increased.

The light-emitting element 170 is preferably covered with a protective layer 194. In FIG. 2(A), the protective layer 194 is provided in contact with the electrode 193. With the protective layer 194, entry of impurities such as water into the light-emitting element 170 can be inhibited, leading to an increase in the reliability of the light-emitting element 170. The protective layer 194 and the substrate 351 are bonded to each other with an adhesive layer 142.

The light-receiving element 180 includes an electrode 111, an organic layer 112, and an electrode 113. The organic layer 112 is positioned between the electrode 111 and the electrode 113. The organic layer 112 includes, for example, a p-type semiconductor layer and an n-type semiconductor layer. The electrode 111 has a function of transmitting visible light. The electrode 113 preferably has a function of reflecting visible light.

The electrode 111 is electrically connected to a source or a drain included in the transistor 41 through an opening provided in an insulating layer 212. The electrode 111 has a function of as a pixel electrode. The substrate 361 is bonded to the electrode 113 with an adhesive layer 141. The electrode 113 may be covered with a protective layer, and the protective layer and the substrate 361 may be bonded to the adhesive layer 141. Thus, entry of impurities into the light-receiving element 180 can be inhibited, leading to an increase in the reliability of the light-receiving element 180.

A light-blocking layer BM is provided on a surface of the substrate 351 on the substrate 361 side. The light-blocking layer BM has openings at a position overlapping with the light-receiving element 180 and at a position overlapping with the light-emitting element 170. Providing the light-blocking layer BM can control a range where light is sensed by the light-receiving element 180.

Here, the light-receiving element 180 senses light that is emitted from the light-emitting element 170 and then reflected by an object. However, in some cases, light emitted from the light-emitting element 170 is reflected inside display device and enters the light-receiving element 180 without through an object. The light-blocking layer BM can inhibit the influence of such stray light. For example, in the case where the light-blocking layer BM is not provided, light 23a emitted from the light-emitting element 170 is reflected by the substrate 351, and reflected light 23b enters the light-receiving element 180 in some cases. Providing the light-blocking layer BM can inhibit entry of the reflected light 23b into the light-receiving element 180. Thus, the sensitivity of the sensor using the light-receiving element 180 can be increased.

The lens 149 is provided over the insulating layer 216. The lens 149 is provided at a position overlapping with the light-receiving element 180. With the lens 149, it is possible to collect light to the light-receiving element 180 with high efficiency, so that the amount of light with which the light-receiving element 180 is irradiated can be increased.

The lens 149 can be arranged to have a size for its purpose. For example, the case where a display device in which the optical path length of the substrate 351 is 400 µm, the definition of the display portion is 326 ppi, and a pixel arrangement has the structure shown in FIG. 1(E) is considered. In this case, the size of one pixel is 78 µm square and an area occupied by one pixel is 39 µm square. When the optical path length between the lens 149 and the light-receiving element 180 is 30 µm, it is preferable that a hemispherical lens having a diameter of 28 µm and using a material with a refractive index of 1.5 be used as the lens 149 according to the Gaussian imaging formula. When the area of the light-receiving element 180 is 5 µm square, the light-receiving element 180 can acquire data from a range of 67 µm square at a point apart from the lens 149 toward a display surface side of the display device by an optical path length of 400 µm, that is, at a surface of the display device, and can acquire data from a range smaller than the size of one pixel. By providing the lens 149 and the light-receiving element 180 in this manner, the light-receiving portion can have a resolution of 326 dpi and thus can be used for a biological authentication sensor such as a finger print sensor, or a touch sensor.

In the display device having the above structure, when the light-receiving element 180 captures data at a point apart from the lens 149 toward the display surface side of the display device by an optical path length of 50000 µm, one light-receiving element 180 acquires data from a range of approximately 8333 µm square. In this case, analyzing the difference in the amount of received light between the adjacent light-receiving elements 180 leads to a high resolution of data. By acquiring data at a point apart from the display device in this manner, the display device can be used for acquiring a near touch or image data around the display device (e.g., data on facial expression or eye of the user in a device for VR or a device for AR).

The light-receiving element 180 has a function of sensing light. Specifically, the light-receiving element 180 is a photoelectric conversion element that receives the light 22 entering from the outside of the display device 10A and converts the light 22 into an electric signal. The light 22 can also be expressed as light that is emitted from the light-emitting element 170 and then reflected by an object. The light 22 preferably enters the light-receiving element 180 through the lens 149.

The transistor 41 and the transistor 42 are on and in contact with the same layer (the insulating layer 212 in FIG. 2(A)). The transistor 41 is electrically connected to the light-receiving element 180. The transistor 42 has a function of controlling the driving of the light-emitting element 170.

At least part of a circuit electrically connected to the light-receiving element 180 is preferably formed using the same material and the same process as a circuit electrically connected to the light-emitting element 170. Accordingly, the thickness of the display device can be smaller than that in the case where the two circuits are separately formed, and the manufacturing process can be simplified.

Here, an example of a method for manufacturing the display device 10A shown in FIG. 2(A) is described. Note that the details of the method for manufacturing the display device of this embodiment are described later. The electrode 111 is formed over a formation substrate first, the transistor 41 and the transistor 42 are formed, and then the lens 149 and the light-emitting element 170 are formed. Next, the formation substrate and the substrate 351 are bonded to each other. The substrate 351 is bonded to the formation substrate so that the surface where the light-blocking layer BM is provided is positioned on the light-emitting element 170 side. After that, the formation substrate and the substrate 351 are separated from each other, so that the electrode 111, the transistor 41, the transistor 42, the lens 149, the light-emitting element 170, and the like are transferred from the formation substrate to the substrate 351. Then, the electrode 111 is exposed, and the organic layer 112 and the electrode 113 are formed over the electrode 111. After that, the electrode 113 and the substrate 361 are bonded to each other with the adhesive layer 141, whereby the display device 10A can be manufactured.

[Display Device 10B]

Figure 2B:
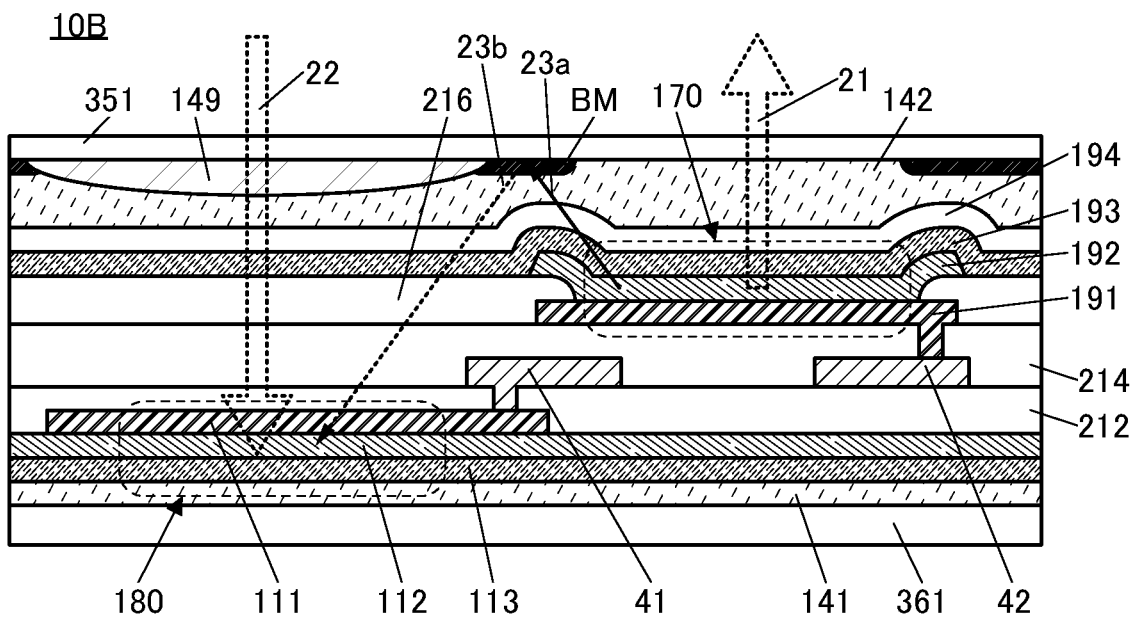

FIG. 2(B) shows a cross-sectional view of a display device 10B. Note that in the following description of display devices, components similar to those of the above display device are not described in some cases.

The display device 10B is different from the display device 10A (FIG. 2(A)) in that the lens 149 is provided in contact with the substrate 351. The other components are similar to those of the display device 10A.

The lens 149 included in the display device 10A has a convex surface on the substrate 351 side, and the lens 149 included in the display device 10B has a convex surface on the substrate 361 side. The lens 149 may have a convex surface on one or the other side.

In the case where both the light-blocking layer BM and the lens 149 are formed on the same surface of the substrate 351, their formation order is not limited. Although FIG. 2(B) shows an example in which the lens 149 is formed first, the light-blocking layer BM may be formed first. In FIG. 2(B), end portions of the lens 149 are covered with the light-blocking layer BM.

[Display Device 11A]

Figure 3A:
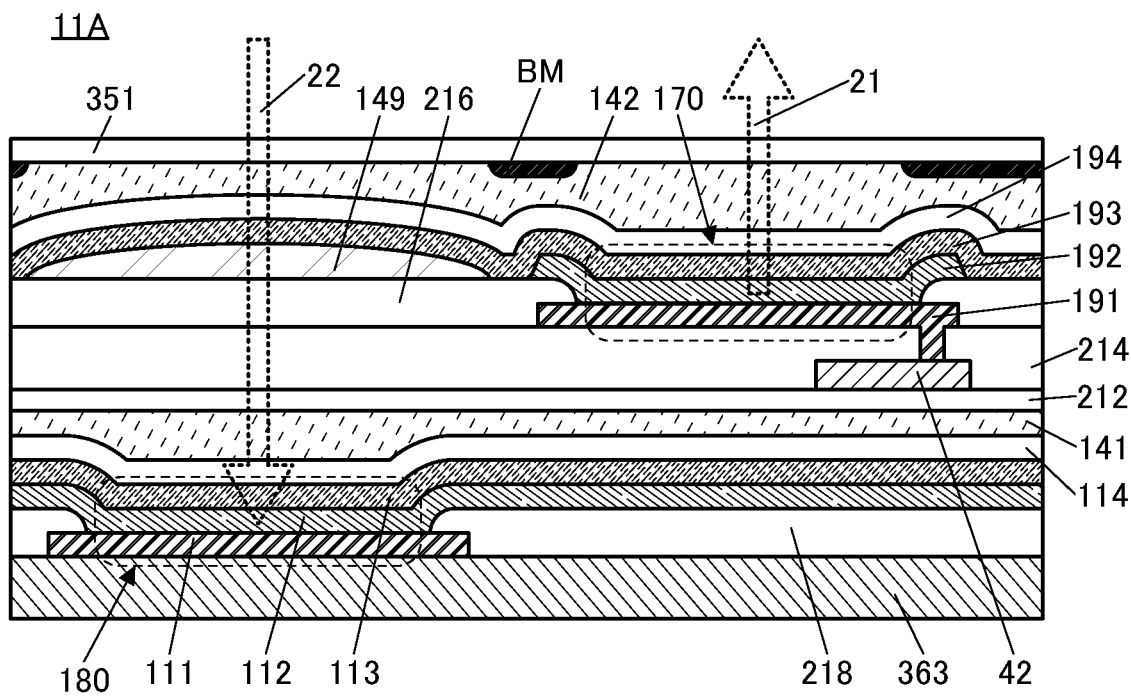
FIG. 3(A) and FIG. 3(B) are cross-sectional views each showing an example of a display device.

FIG. 3(A) shows a cross-sectional view of a display device 11A.

The display device 11A includes the light-emitting element 170, the light-receiving element 180, the transistor 42, and the like between a pair of substrates (the substrate 351 and a circuit board 363). It is preferable that the display device 11A further include the lens 149. With the lens 149, the amount of incident light on the light-receiving element 180 can be increased. The lens 149 included in the display device 11A has a convex surface on the substrate 351 side.

A circuit for a sensor using the light-receiving element 180, such as a transistor electrically connected to the light-receiving element 180, is formed over the circuit board 363.

The light-receiving element 180 is formed over the circuit board 363. The light-receiving element 180 includes the electrode 111, the organic layer 112, and the electrode 113. The organic layer 112 is positioned between the electrode 111 and the electrode 113. The organic layer 112 includes, for example, a p-type semiconductor layer and an n-type semiconductor layer. The electrode 113 has a function of transmitting visible light. The electrode 111 preferably has a function of reflecting visible light. The electrode 111 has a function of a pixel electrode. End portions of the electrode 111 are covered with an insulating layer 218.

The light-receiving element 180 is preferably covered with a protective layer 114. With the protective layer 194, entry of impurities such as water into the light-receiving element 180 can be inhibited, leading to an increase in the reliability of the light-receiving element 180. The protective layer 114 and the insulating layer 212 are bonded to each other with the adhesive layer 141.

The transistor electrically connected to the light-emitting element 170 and the transistor electrically connected to the light-receiving element 180 have different structures, whereby structures suitable for a pixel circuit including the light-emitting element 170 and the circuit for a sensor including the light-receiving element 180 can be used.

For example, a transistor containing a metal oxide in its channel formation region can be used as the transistor electrically connected to the light-emitting element 170, and a transistor containing silicon in its channel formation region can be used as the transistor electrically connected to the light-receiving element 180. In this case, the circuit board 363 is preferably provided with a transistor in which a channel is formed in a single crystal semiconductor substrate. For example, a transistor in which a channel is formed in single crystal silicon can be used as the transistor electrically connected to the light-receiving element 180.

The light-blocking layer BM is preferably provided on a surface of the substrate 351 on the circuit board 363 side.

Here, an example of a method for manufacturing the display device 110A shown in FIG. 3(A) is described. First, the insulating layer 212 and the transistor 42 are formed over a formation substrate, and then the lens 149 and the light-emitting element 170 are formed. Next, the formation substrate and the substrate 351 are bonded to each other. The substrate 351 is bonded to the formation substrate so that the surface where the light-blocking layer BM is provided is positioned on the light-emitting element 170 side. After that, the formation substrate and the substrate 351 are separated from each other, so that the insulating layer 212, the transistor 42, the lens 149, the light-emitting element 170, and the like are transferred from the formation substrate to the substrate 351. Then, the insulating layer 212 is exposed. A transistor and the like is formed on a single crystal semiconductor to form the circuit board 363, and then the light-emitting element 180 and the protective layer 114 are formed over the circuit board 363. After that, the protective layer 114 and the insulating layer 212 are bonded to each other with the adhesive layer 141, whereby the display device 110A can be manufactured. The display device 110A can be manufactured by bonding the light-emitting element 170 and a circuit, and the light-receiving element 180 and a circuit each formed over the different substrates as described above; thus, the display device 110A can be manufactured easily without complicated process.

[Display Device 11B]

Figure 3B:
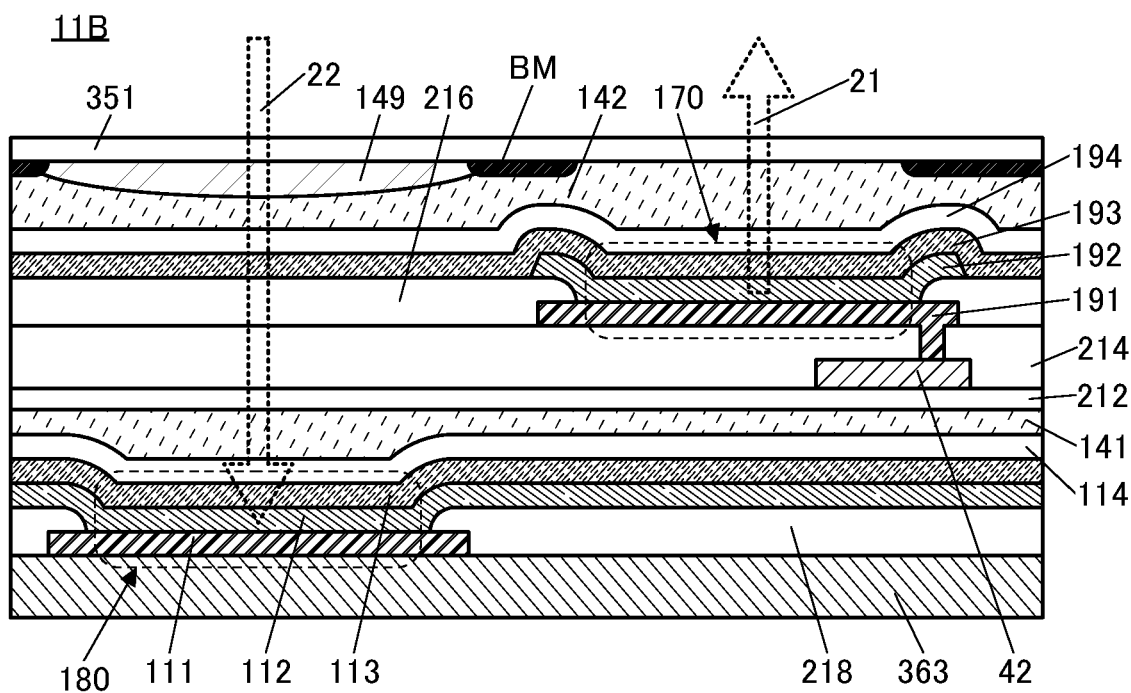

FIG. 3(B) shows a cross-sectional view of a display device 11B.

The display device 11B is different from the display device 11A (FIG. 3(A)) in that the lens 149 is provided in contact with the substrate 351. The other components are similar to those of the display device 11A.

The lens 149 included in the display device 11B has a convex surface on the circuit board 363 side.

FIG. 3(B) shows an example in which the lens 149 is formed after the light-blocking layer BM is formed. In FIG. 3(B), end portions of the light-blocking layer BM are covered with the lens 149. The lens 149 does not necessarily overlap with the light-blocking layer BM.

[Display Device 12A]

Figure 4A:
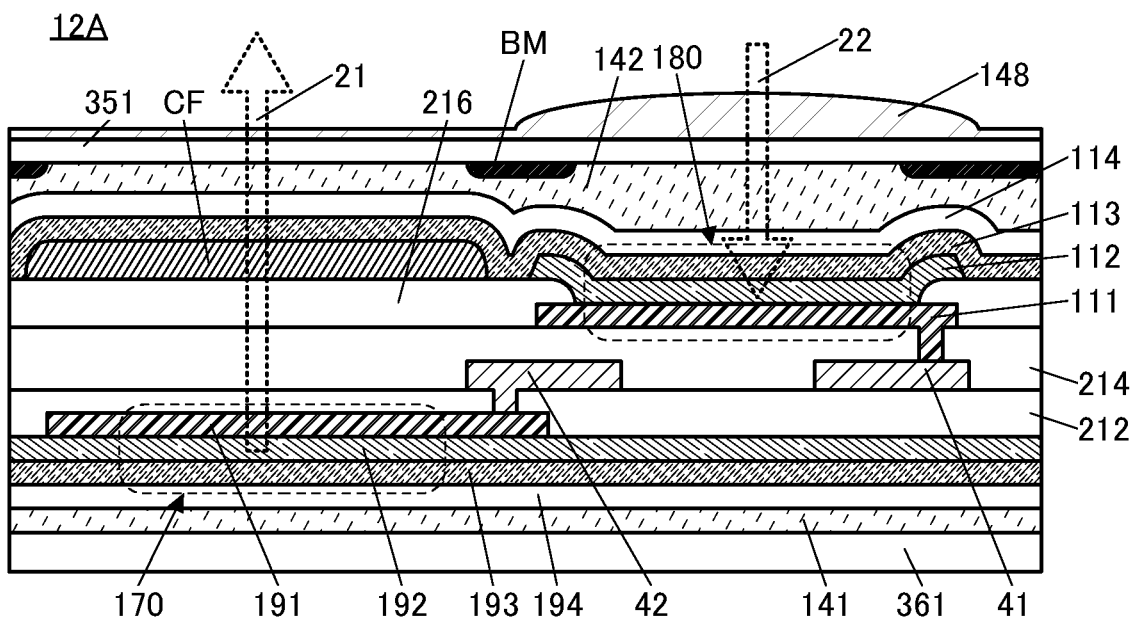
FIG. 4(A) and FIG. 4(B) are cross-sectional views each showing an example of a display device.

FIG. 4(A) shows a cross-sectional view of a display device 12A.

The display device 12A includes the light-emitting element 170, the light-receiving element 180, the transistor 41, the transistor 42, and the like between a pair of substrates (the substrate 351 and the substrate 361). It is preferable that the display device 12A further include a lens array 148 over the substrate 351. With the lens array 148, the amount of incident light on the light-receiving element 180 can be increased. The lens array 148 included in the display device 12A has a convex surface on the user side.

The light-emitting element 170 includes the electrode 191, the EL layer 192, and the electrode 193. The EL layer 192 is provided over a plurality of subpixels and a plurality of pixels. The electrode 191 has a function of transmitting visible light. The electrode 193 preferably has a function of reflecting visible light.

A coloring layer CF is provided over the insulating layer 216. The coloring layer CF is provided at a position overlapping with the light-emitting element 170. It is preferable that the coloring layer CF not overlap with the organic layer 112. Accordingly, it is possible to inhibit the coloring layer CF from absorbing the light 22, so that the amount of light with which the light-receiving element 180 is irradiated can be increased. A red coloring layer CF is provided in a red subpixel, a green coloring layer CF is provided in a green subpixel, and a blue coloring layer CF is provided in a blue subpixel, for example.

The light-emitting element 170 preferably emits white light. The light emitted from the light-emitting element 170 is emitted to the substrate 351 side through the coloring layer CF. When the subpixels of the respective colors include coloring layers CF for different colors, full-color display can be achieved.

In the display device 12A, since the light-receiving element 180 is positioned closer to a display surface than the light-emitting element 170 is, the light 22 is not blocked by the EL layer 192 even when the EL layer 192 is provided to overlap with the light-receiving element 180. Thus, the EL layer 192 can be provided over a plurality of pixels and the light-emitting element 170 is not necessarily formed separately for the subpixels of different colors, so that the manufacturing process can be simplified The electrode 191 is electrically connected to a source or a drain included in the transistor 42 through an opening provided in the insulating layer 212. The electrode 191 has a function of a pixel electrode. The electrodes 191 of the adjacent light-emitting elements 170 are insulated from each other by the insulating layer 212.

The light-emitting element 170 is preferably covered with the protective layer 194. In FIG. 4(A), the protective layer 194 is provided in contact with the electrode 193. With the protective layer 194, entry of impurities into the light-emitting element 170 can be inhibited, leading to an increase in the reliability of the light-emitting element 170. The substrate 361 is bonded to the protective layer 194 with the adhesive layer 141.

The light-receiving element 180 includes the electrode 111, the organic layer 112, and the electrode 113. The electrode 113 has a function of transmitting visible light. The electrode 111 preferably has a function of reflecting visible light.

It is preferable that the organic layer 112 be formed not to overlap with a light-emitting region of the light-emitting element 170. Thus, the organic layer 112 can be inhibited from absorbing the emitted light 21, leading to an increase of the light extraction efficiency.

The electrode 111 is electrically connected to the source or the drain included in the transistor 41 through an opening provided in the insulating layer 214. The electrode 111 has a function of a pixel electrode.

The light-receiving element 180 is preferably covered with the protective layer 114. In FIG. 4(A), the protective layer 114 is provided in contact with the electrode 113. With the protective layer 114, entry of impurities into the light-receiving element 180 can be inhibited, leading to an increase in the reliability of the light-receiving element 180. The substrate 351 is bonded to the protective layer 114 with the adhesive layer 142.

The lens array 148 is provided on a display surface side of the substrate 351. A lens included in the lens array 148 is provided at a position overlapping with the light-receiving element 180. The light-blocking layer BM is preferably provided on a surface of the substrate 351 on the substrate 361 side.

As a method for forming the lens used in the display device of this embodiment, a lens such as a microlens may be formed directly over the substrate, or a lens array manufactured separately, such as a microlens array, may be bonded to the substrate.

[Display Device 12B]

Figure 4B:
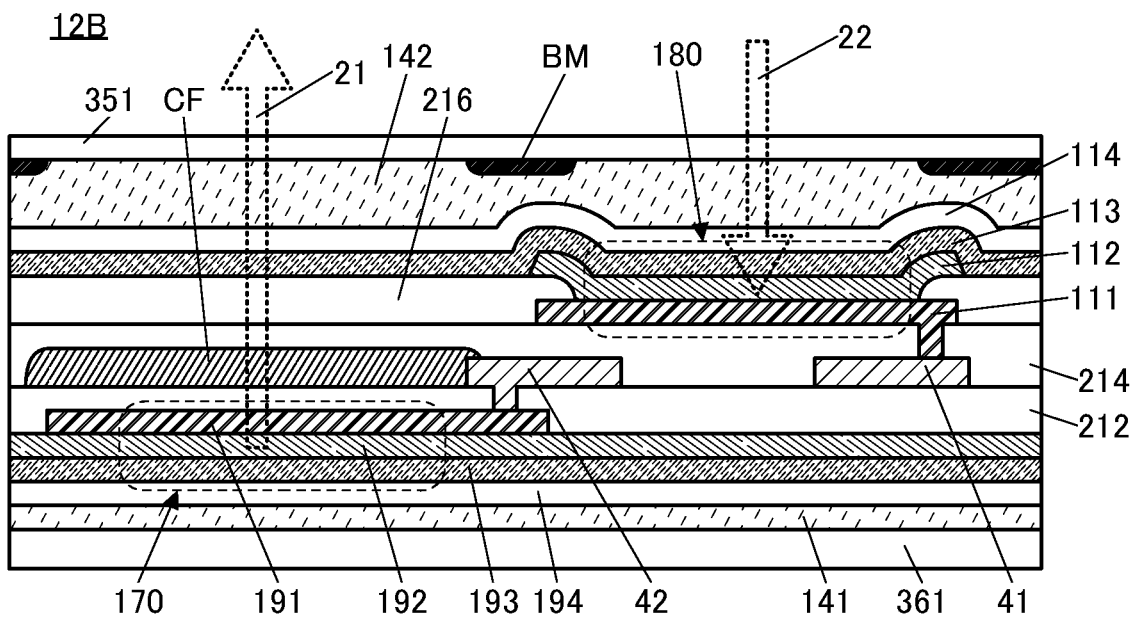

FIG. 4(B) shows a cross-sectional view of a display device 12B.

The display device 12B is different from the display device 12A (FIG. 4(A)) in that the lens array 148 is not provided and the coloring layer CF is provided over the insulating layer 212. The other components are similar to those of the display device 12A.

The display device of this embodiment does not need to include a lens as in the display device 12B.

There is no particular limitation on the position of the coloring layer CF as long as the coloring layer CF is provided between the light-emitting element 170 and the substrate 351. In the case where a transistor and the coloring layer CF are formed over the same substrate, the coloring layer CF is preferably formed after the transistor and a protective layer of the transistor are formed. Thus, the temperature applied during the manufacturing process of the transistor can be higher than the upper temperature limit of the coloring layer CF, leading to an increase in the reliability of the transistor. In addition, when the protective layer of the transistor is provided, entry of impurities into the transistor at the time of forming the coloring layer CF can be inhibited. FIG. 4(A) shows an example in which the coloring layer CF is provided on and in contact with the insulating layer 216, and FIG. 4(B) shows an example in which the coloring layer CF is provided over the insulating layer 212 and the transistor 42.

The detailed structure of the display device of one embodiment of the present invention is described below with reference to FIG. 5 to FIG. 12.

[Display Device 100A]

Figure 5:
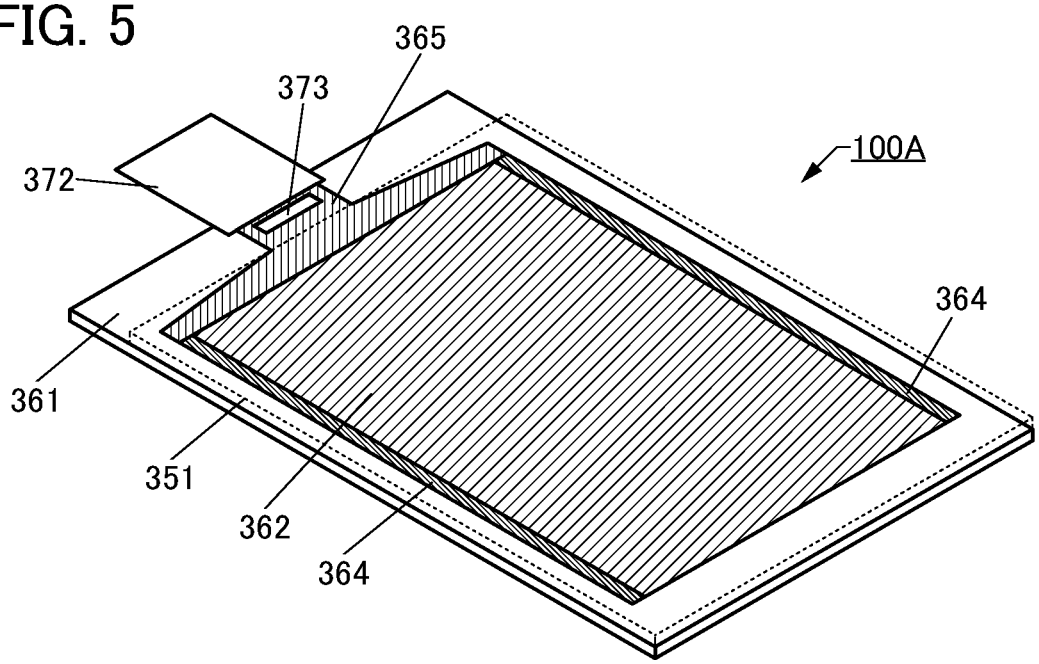
FIG. 5 is a perspective view showing an example of a display device.
Figure 6:
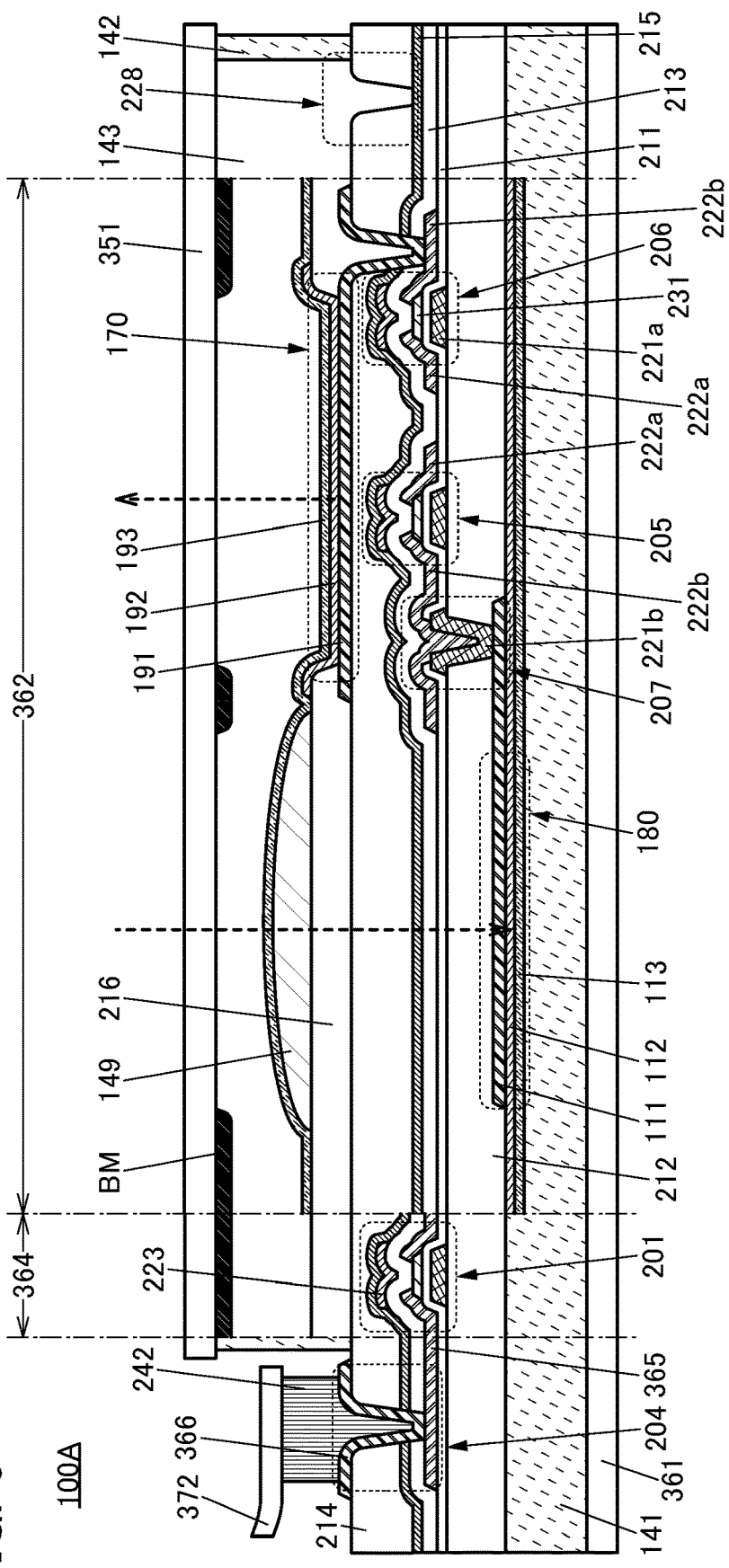
FIG. 6 is a cross-sectional view showing an example of a display device.

FIG. 5 shows a perspective view of a display device 100A and FIG. 6 shows a cross-sectional view of the display device 100A.

The display device 100A has a structure in which the substrate 351 and the substrate 361 are bonded to each other. In FIG. 5, the substrate 351 is denoted by a dashed line.

The display device 100A includes a display portion 362, a circuit 364, a wiring 365, and the like. FIG. 5 shows an example in which the display device 100A is provided with an IC (integrated circuit) 373 and an FPC 372. Thus, the structure shown in FIG. 5 can also be regarded as a display module including the display device 100A, the IC, and the FPC.

As the circuit 364, for example, a scan line driver circuit can be used.

The wiring 365 has a function of supplying a signal and power to the display portion 362 and the circuit 364. The signal and power are input to the wiring 365 from the outside through the FPC 372 or from the IC 373.

FIG. 5 shows an example in which the IC 373 is provided over the substrate 361 by a COG (Chip On Glass) method, a COF (Chip on Film) method, or the like. An IC including a scan line driver circuit, a signal line driver circuit, or the like can be used as the IC 373, for example. Note that the display device 100A and the display module may have a structure that is not provided with an IC. The IC may be mounted on the FPC by a COF method or the like.

FIG. 6 shows an example of cross-sections of part of a region including the FPC 372, part of a region including the circuit 364, part of a region including the display portion 362, and part of a region including an end portion of the display device 100A shown in FIG. 5.

The display device 100A shown in FIG. 6 includes a transistor 201, a transistor 205, a transistor 206, the light-emitting element 170, the light-receiving element 180, the lens 149, and the like between the substrate 351 and the substrate 361.

The substrate 361 and the insulating layer 212 are bonded to each other with the adhesive layer 141. The substrate 351 and the insulating layer 214 are bonded to each other with the adhesive layer 142. A solid sealing structure, a hollow sealing structure, or the like can be employed to seal the light-emitting element 170 and to seal the light-receiving element 180. In FIG. 6, the adhesive layer 141 is provided to overlap with the light-receiving element 180, and a solid sealing structure is employed. Furthermore, in FIG. 6, a hollow sealing structure is employed in which a space 143 surrounded by the substrate 351, the adhesive layer 142, and the insulating layer 214 is filled with an inert gas (e.g., nitrogen or argon). The adhesive layer 142 may be provided to overlap with the light-emitting element 170. The space 143 surrounded by the substrate 351, the adhesive layer 142, and the insulating layer 214 may be filled with a resin different from that of the adhesive layer 142.

The light-emitting element 170 has a stacked-layer structure in which the electrode 191, the EL layer 192, and the electrode 193 are stacked in this order from the insulating layer 214 side. The electrode 191 is connected to a conductive layer 222b included in the transistor 206 through an opening provided in the insulating layer 214. The transistor 206 has a function of controlling the driving of the light-emitting element 170. The insulating layer 216 covers an end portion of the electrode 191. The electrode 191 contains a material that reflects visible light and the electrode 193 contains a material that transmits visible light. Light emitted from the light-emitting element 170 is emitted to the substrate 351 side.

The light-receiving element 180 has a stacked-layer structure in which the electrode 111, the organic layer 112, and the electrode 113 are stacked in this order from the insulating layer 212 side. The electrode 111 is connected to a conductive layer 221b through an opening provided in the insulating layer 212. The conductive layer 221b is connected to the conductive layer 222b included in the transistor 205. That is, at a connection portion 207, the electrode 111 is electrically connected to the conductive layer 222b included in the transistor 205 through the conductive layer 221b. The electrode 111 contains a material that transmits visible light and the electrode 113 contains a material that reflects visible light. Light enters the light-receiving element 180 through the substrate 351, the space 143, the electrode 193, the lens 149, the insulating layer 216, the insulating layer 214, the insulating layer 212, and the like. For these layers, a material having a high transmitting property with respect to visible light is preferably used.

The electrode 111, which serves as the pixel electrode of the light-receiving element 180, is positioned opposite to the electrode 191, which serves as the pixel electrode of the light-emitting element 170, with an insulating layer 211 included in the transistor 205 and the transistor 206 interposed therebetween.

The light-blocking layer BM is provided on a surface of the substrate 351 on the substrate 361 side. The light-blocking layer BM has openings at a position overlapping with the light-receiving element 180 and at a position overlapping with the light-emitting element 170. Providing the light-blocking layer BM can control a range where light is sensed by the light-receiving element 180. Furthermore, the light-blocking layer BM can inhibit entry of light into the light-receiving element 180 from the light-emitting element 170 without through an object. Thus, a sensor with less noise and high sensitivity can be achieved.

For the light-blocking layer BM, a material that blocks light emitted from the light-emitting element can be used; for example, a black matrix can be formed using a metal material or a resin material containing pigment or dye. Note that it is preferable to provide the light-blocking layer BM in a region other than the display portion 362, such as the circuit 364, in which case undesired light leakage due to guided light or the like can be inhibited.

The lens 149 is provided on and in contact with the insulating layer 216. The lens 149 has a convex surface on the substrate 351 side. Here, it is preferable that a light-receiving region of the light-receiving element 180 overlap with the lens 149 and not overlap with the EL layer 192. Thus, the sensitivity and accuracy of a sensor using the light-receiving element 180 can be increased.

The transistor 201, the transistor 205, and the transistor 206 are formed over the insulating layer 212. These transistors can be manufactured using the same process.

The insulating layer 211, an insulating layer 213, an insulating layer 215, and the insulating layer 214 are provided in this order over the insulating layer 212. Part of the insulating layer 211 functions as a gate insulating layer of each transistor. Part of the insulating layer 213 functions as a gate insulating layer of each transistor. The insulating layer 215 is provided to cover the transistors. The insulating layer 214 is provided to cover the transistors and has a function of a planarization layer. Note that the number of insulating layers covering the transistors is not limited, and either a single layer or two or more layers may be employed.

A material through which impurities such as water and hydrogen do not easily diffuse is preferably used for at least one of the insulating layers that cover the transistors. Thus, such an insulating layer can function as a barrier layer. Such a structure can effectively inhibit diffusion of impurities into the transistors from the outside, and a highly reliable display device can be achieved.

Here, an organic insulating film often has a lower barrier property than an inorganic insulating film. Thus, the organic insulating film preferably has an opening in the vicinity of an end portion of the display device. This can inhibit entry of impurities from the end portion of the display device through the organic insulating film. Alternatively, the organic insulating film may be formed so that its end portion is positioned on the inner side compared to the end portion of the display device, to prevent the organic insulating film from being exposed at the end portion of the display device.

An organic insulating film is suitable for the insulating layer 214 functioning as a planarization layer. In a region 228 shown in FIG. 6, an opening is formed in the insulating layer 214. This can inhibit entry of impurities into the display portion 362 from the outside through the insulating layer 214 even when the organic insulating film is used as the insulating layer 214. Accordingly, the reliability of the display device 100A can be increased.

Each of the transistor 201, the transistor 205, and the transistor 206 includes a conductive layer 221a functioning as a gate, the insulating layer 211 functioning as the gate insulating layer, a conductive layer 222a and the conductive layer 222b functioning as a source and a drain, a semiconductor layer 231, the insulating layer 213 functioning as the gate insulating layer, and a conductive layer 223 functioning as a gate. Here, a plurality of layers obtained by processing the same conductive film are shown with the same hatching pattern. The insulating layer 211 is positioned between the conductive layer 221a and the semiconductor layer 231. The insulating layer 213 is positioned between the conductive layer 223 and the semiconductor layer 231.

There is no particular limitation on the structure of the transistor included in the display device of this embodiment. For example, a planar transistor, a staggered transistor, or an inverted staggered transistor can be used. A top-gate or a bottom-gate transistor structure may be used. Alternatively, gates may be provided above and below a semiconductor layer where a channel is formed.

The structure in which the semiconductor layer where a channel is formed is provided between the two gates is used for the transistor 201, the transistor 205, and the transistor 206. The two gates may be connected to each other and supplied with the same signal to operate the transistor. Alternatively, by applying a potential for controlling the threshold voltage to one of the two gates and a potential for driving to the other, the threshold voltage of the transistor may be controlled.

There is no particular limitation on the crystallinity of a semiconductor material used for the transistors, and an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used, in which case deterioration of the transistor characteristics can be inhibited.

It is preferable that the semiconductor layer of the transistors contain a metal oxide (also referred to as an oxide semiconductor). Alternatively, the semiconductor layer of the transistors may contain silicon. Examples of silicon include amorphous silicon and crystalline silicon (e.g., low-temperature polysilicon and single crystal silicon).

The semiconductor layer preferably contains indium, M (M is one kind or a plurality kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one kind or a plurality kinds selected from aluminum, gallium, yttrium, and tin.

It is particularly preferable to use an oxide containing indium (In), gallium (Ga), and zinc (Zn) (also referred to as IGZO) for the semiconductor layer.

In the case where the semiconductor layer is an In-M-Zn oxide, a sputtering target used for depositing the In-M-Zn oxide preferably has the atomic proportion of In higher than or equal to the atomic proportion of M Examples of the atomic ratio of the metal elements in such a sputtering target include In:M:Zn=1:1:1, In:M:Zn=1:1:1.2, In:M:Zn=2:1:3, In:M:Zn=3:1:2, In:M:Zn=4:2:4.1, In:M:Zn=5:1:6, In:M:Zn=5:1:7, In:M:Zn=5:1:8, In:M:Zn=6:1:6, and In:M:Zn=5:2:5.

A target containing a polycrystalline oxide is preferably used as the sputtering target, in which case the semiconductor layer having crystallinity is easily formed. Note that the atomic ratio in the deposited semiconductor layer varies in the range of ±40% from the above atomic ratios of the metal elements contained in the sputtering target. For example, in the case where the composition of a sputtering target used for the semiconductor layer is In:Ga:Zn=4:2:4.1 [atomic ratio], the composition of the deposited semiconductor layer is in the neighborhood of In:Ga:Zn=4:2:3 [atomic ratio] in some cases.

Note that when the atomic ratio is described as In:Ga:Zn=4:2:3 or in the neighborhood thereof, the case is included where the atomic proportion of Ga is greater than or equal to 1 and less than or equal to 3 and the atomic proportion of Zn is greater than or equal to 2 and less than or equal to 4 with the atomic proportion of In being 4. When the atomic ratio is described as In:Ga:Zn=5:1:6 or in the neighborhood thereof, the case is included where the atomic proportion of Ga is greater than 0.1 and less than or equal to 2 and the atomic proportion of Zn is greater than or equal to 5 and less than or equal to 7 with the atomic proportion of In being 5. When the atomic ratio is described as In:Ga:Zn=1:1:1 or in the neighborhood thereof, the case is included where the atomic proportion of Ga is greater than 0.1 and less than or equal to 2 and the atomic proportion of Zn is greater than 0.1 and less than or equal to 2 with the atomic proportion of In being 1.

The transistor included in the circuit 364 and the transistor included in the display portion 362 may have the same structure or different structures. A plurality of transistors included in the circuit 364 may have the same structure or two or more kinds of structures. Similarly, a plurality of transistors included in the display portion 362 may have the same structure or two or more kinds of structures.

A connection portion 204 is provided in a region where the substrate 361 and the substrate 351 do not overlap with each other. In the connection portion 204, the wiring 365 is electrically connected to the FPC 372 through a conductive layer 366 and a connection layer 242. On a top surface of the connection portion 204, the conductive layer 366 obtained by processing the same conductive film as the electrode 191 is exposed. Thus, the connection portion 204 and the FPC 372 can be electrically connected to each other through the connection layer 242.

A variety of optical members can be arranged on the outer side of the substrate 351. Examples of the optical members include a polarizing plate, a retardation plate, a light diffusion layer (e.g., a diffusion film), an anti-reflective layer, and a light-condensing film. Furthermore, an antistatic film suppressing the attachment of dust, a water repellent film suppressing the attachment of stain, a hard coat film suppressing generation of a scratch caused by the use, a shock absorption layer, or the like may be arranged on the outer side of the substrate 351.

For each of the substrate 351 and the substrate 361, glass, quartz, ceramic, sapphire, an organic resin, or the like can be used. When a flexible material is used for the substrate 351 and the substrate 361, the flexibility of the display device can be increased.

As the adhesive layer, a variety of curable adhesives, e.g., a photocurable adhesive such as an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. Alternatively, a two-component resin may be used. Alternatively, an adhesive sheet or the like may be used.

As the connection layer 242, an anisotropic conductive film (ACF), an anisotropic conductive paste (ACP), or the like can be used.

The light-emitting element 170 has a top-emission structure, a bottom-emission structure, a dual-emission structure, or the like. A conductive film that transmits visible light is used for the electrode through which light is extracted. Moreover, a conductive film that reflects visible light is preferably used for the electrode through which light is not extracted.

The EL layer 192 includes at least a light-emitting layer. In addition to the light-emitting layer, the EL layer 192 may further include a layer containing a substance with a high hole-injection property, a substance with a high hole-transport property, a hole-blocking material, a substance with a high electron-transport property, a substance with a high electron-injection property, a substance with a bipolar property (a substance with a high electron- and hole-transport property), or the like.

Either a low molecular compound or a high molecular compound can be used for the EL layer 192, and an inorganic compound may be contained. The layers included in the EL layer 192 can each be formed by a method such as an evaporation method (including a vacuum evaporation method), a transfer method, a printing method, an inkjet method, a coating method, or the like.

The EL layer 192 may contain an inorganic compound such as quantum dots. For example, when used for the light-emitting layer, the quantum dots can function as a light-emitting material.

The light-receiving element 180 includes an active layer between a pair of electrodes. The active layer includes a semiconductor. Examples of the semiconductor include an inorganic semiconductor such as silicon and an organic semiconductor including an organic compound. This embodiment shows an example in which an organic semiconductor is used as the semiconductor included in the active layer. The use of an organic semiconductor is preferable, in which case the EL layer 192 of the light-emitting element 170 and the organic layer 112 of the light-receiving element 180 can be formed by the same method (e.g., a vacuum evaporation method) and the same manufacturing apparatus can be used.

Examples of an n-type semiconductor material included in the organic layer 112 are electron-accepting organic semiconductor materials such as fullerene (e.g., $C_{60}$ and $C_{70}$) and derivatives thereof. Examples of a p-type semiconductor material included in the organic layer 112 are electron-donating organic semiconductor materials such as copper(II) phthalocyanine (CuPc) and tetraphenyldibenzoperiflanthene (DBP). The organic layer 112 may have a stacked-layer structure (a p-n stacked-layer structure) including an electron-accepting semiconductor material and an electron-donating semiconductor material, or a stacked-layer structure (a p-i-n stacked-layer structure) in which a bulk heterojunction layer formed by co-evaporation of an electron-accepting semiconductor material and an electron-donating semiconductor material is provided between these materials. Furthermore, a hole-blocking layer or an electron-blocking layer may be provided around (above or below) the p-n stacked-layer structure or the p-i-n stacked-layer structure, in order to inhibit dark current caused when light is not irradiated.

The lens 149 preferably has a refractive index of greater than or equal to 1.3 and less than or equal to 2.5. The lens 149 can be formed using an inorganic material or an organic material. For example, a material containing a resin can be used for the lens 149. A material containing an oxide or a sulfide can be used for the lens 149.

Specifically, a resin containing chlorine, bromine, or iodine, a resin containing a heavy metal atom, a resin having an aromatic ring, a resin containing sulfur, and the like can be used for the lens 149. Alternatively, a material containing a resin and nanoparticles of a material having a higher refractive index than the resin can be used for the lens 149. Titanium oxide, zirconium oxide, or the like can be used for the nanoparticles.

In addition, cerium oxide, hafnium oxide, lanthanum oxide, magnesium oxide, niobium oxide, tantalum oxide, titanium oxide, yttrium oxide, zinc oxide, an oxide containing indium and tin, an oxide containing indium, gallium, and zinc, and the like can be used for the lens 149. Alternatively, zinc sulfide and the like can be used for the lens 149.

As materials that can be used for conductive layers such as a variety of wirings and electrodes that form a display device, in addition to a gate, a source, and a drain of a transistor, metals such as aluminum, titanium, chromium, nickel, copper, yttrium, zirconium, molybdenum, silver, tantalum, and tungsten, or an alloy containing any of these metals as its main component can be given. A film containing any of these materials can be used in a single layer or as a stacked-layer structure.

As a light-transmitting conductive material, a conductive oxide such as indium oxide, indium tin oxide, indium zinc oxide, zinc oxide, or zinc oxide containing gallium, or graphene can be used. Alternatively, a metal material such as gold, silver, platinum, magnesium, nickel, tungsten, chromium, molybdenum, iron, cobalt, copper, palladium, or titanium, or an alloy material containing any of these metal materials can be used. Alternatively, a nitride of the metal material (e.g., titanium nitride) or the like may be used. Note that in the case of using the metal material or the alloy material (or the nitride thereof), the thickness is preferably set small enough to be able to transmit light. A stacked film of any of the above materials can be used for the conductive layers. For example, a stacked film of indium tin oxide and an alloy of silver and magnesium, or the like is preferably used because the conductivity can be increased. They can also be used for conductive layers such as a variety of wirings and electrodes that form a display device, and conductive layers (conductive layers functioning as a pixel electrode or a common electrode) included in a display element.

As an insulating material that can be used for each insulating layer, for example, a resin such as an acrylic resin or an epoxy resin, and an inorganic insulating material such as silicon oxide, silicon oxynitride, silicon nitride oxide, silicon nitride, or aluminum oxide can be given.

[Display Device 100B]

Figure 7:
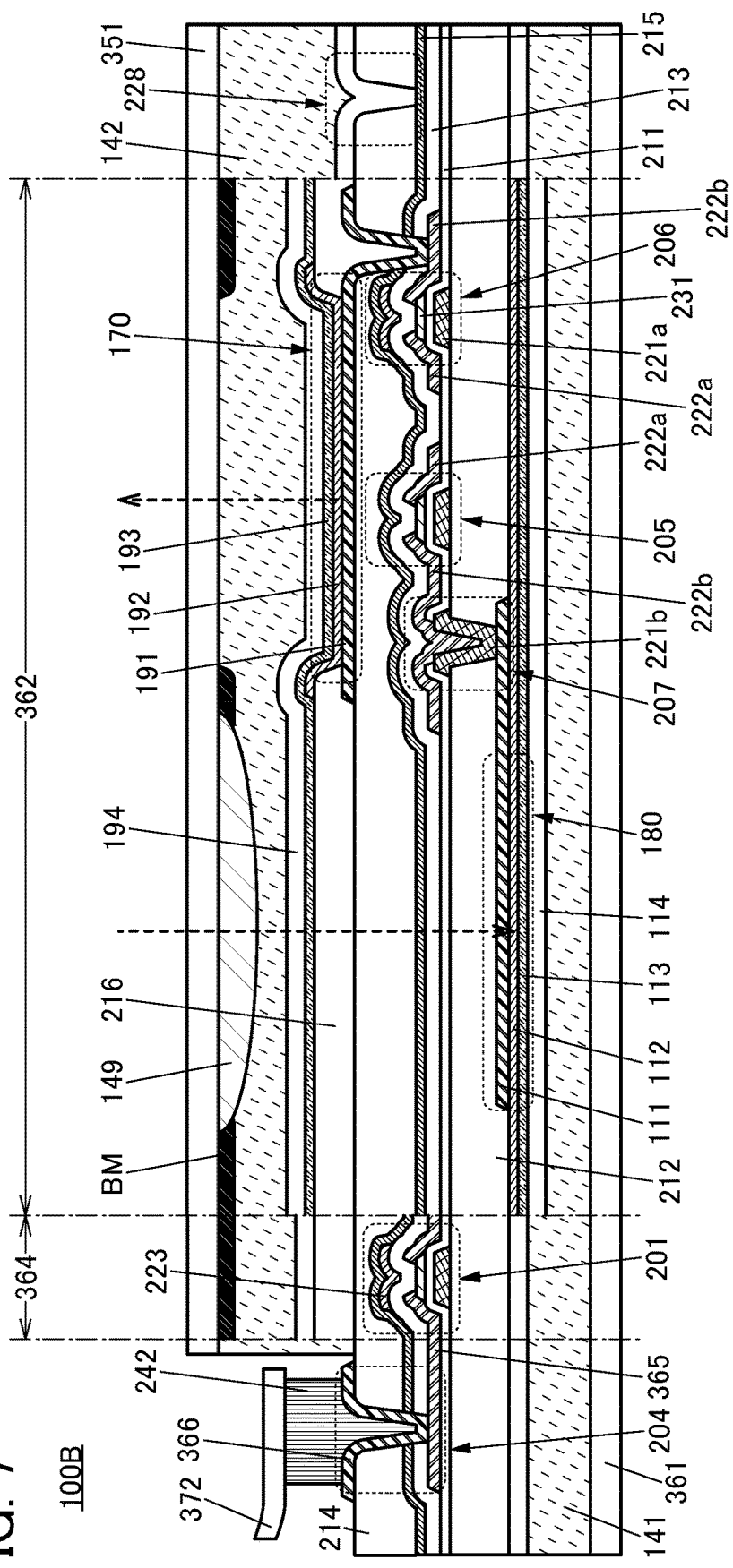
FIG. 7 is a cross-sectional view showing an example of a display device.

FIG. 7 shows a cross-sectional view of a display device 100B.

The display device 100B is different from the display device 100A mainly in that the protective layer 114 and the protective layer 194 are included, the conductive layer 223 is not included in the transistor 205, and the lens 149 is provided in contact with the substrate 351.

With the protective layer 114 covering the light-receiving element 180, entry of impurities into the light-receiving element 180 can be inhibited, leading to an increase in the reliability of the light-receiving element 180.

With the protective layer 194 covering the light-emitting element 170, entry of impurities into the light-emitting element 170 can be inhibited, leading to an increase in the reliability of the light-emitting element 170.

In the region 228 in the vicinity of an end portion of the display device 100B, the insulating layer 215 and the protective layer 194 are preferably in contact with each other through an opening in the insulating layer 214. In particular, an inorganic insulating film included in the insulating layer 215 and an inorganic insulating film included in the protective layer 194 are preferably in contact with each other. Thus, entry of impurities into the display portion 362 from the outside through an organic insulating film can be inhibited. Accordingly, the reliability of the display device 100B can be increased.

Furthermore, the lens 149 is provided on a surface of the substrate 351 on the substrate 361 side.

The transistor 201 and the transistor 206 each include the conductive layer 223 and the transistor 205 does not include the conductive layer 223. In this manner, transistors having two or more kinds of structures may be included in the display device.

[Display Device 100C]

Figure 8A:
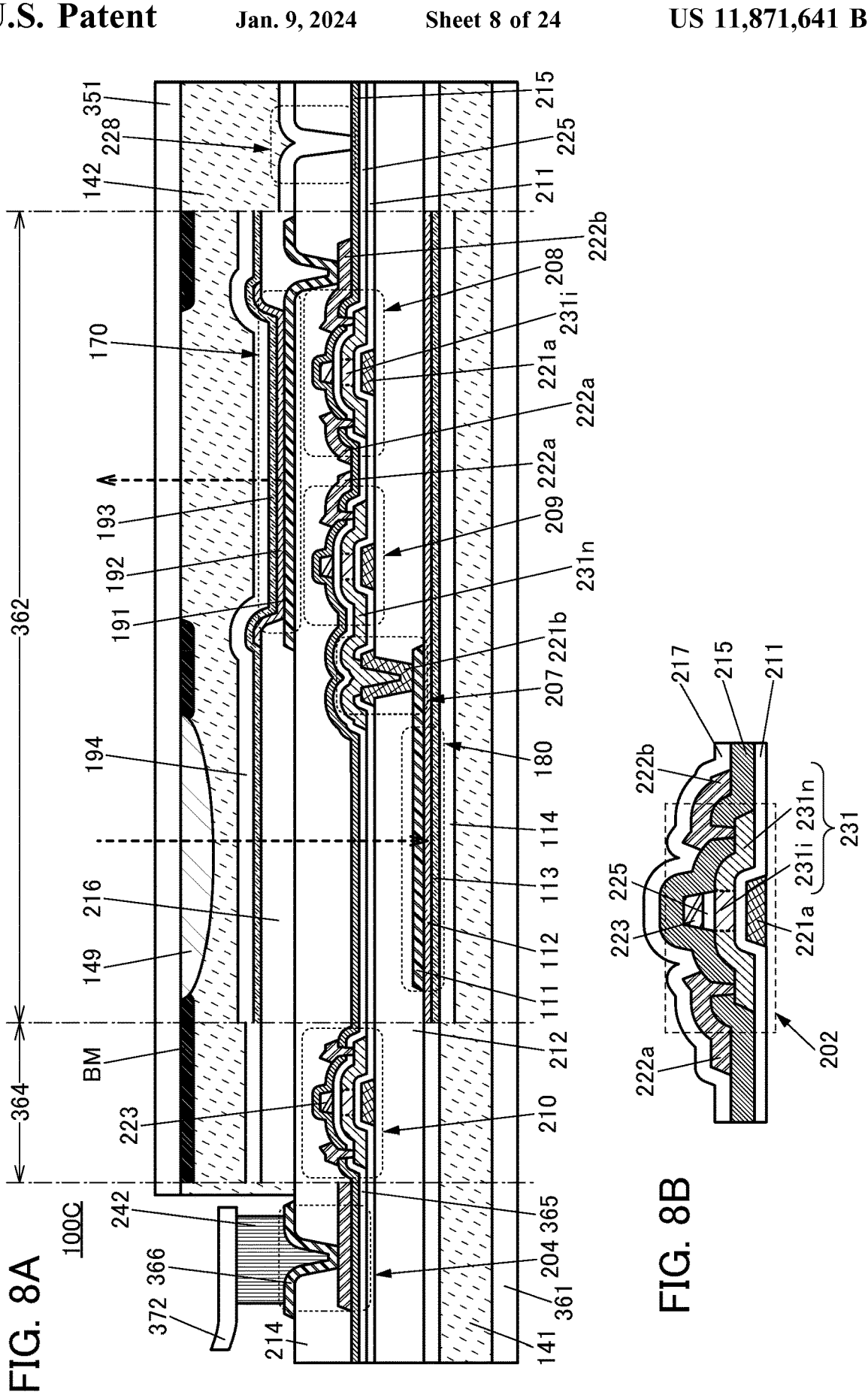
FIG. 8(A) is a cross-sectional view showing an example of a display device.

FIG. 8(A) shows a cross-sectional view of a display device 100C.

The display device 100C is different from the display device 100B mainly in the structure of a transistor. Transistors included in the display device 100C is described below.

The display device 100C includes a transistor 208, a transistor 209, and a transistor 210 over the insulating layer 212.

Each of the transistor 208, the transistor 209, and the transistor 210 includes the conductive layer 221a functioning as a gate, the insulating layer 211 functioning as a gate insulating layer, a semiconductor layer including a channel formation region 231i and a pair of low-resistance regions 231n, the conductive layer 222a connected to one of the pair of low-resistance regions 231n, an insulating layer 225 functioning as a gate insulating layer, the conductive layer 223 functioning as a gate, and the insulating layer 215 covering the conductive layer 223. Each of the transistor 208 and the transistor 210 further includes the conductive layer 222b connected to the other of the pair of low-resistance regions 231n. The insulating layer 211 is positioned between the conductive layer 221a and the channel formation region 231i. The insulating layer 225 is positioned between the conductive layer 223 and the channel formation region 231i.

The conductive layer 222a and the conductive layer 222b are connected to the respective low-resistance regions 231n through openings provided in the insulating layer 225 and the insulating layer 215. One of the conductive layer 222a and the conductive layer 222b functions as a source and the other functions as a drain.

The electrode 191 of the light-emitting element 170 is electrically connected to one of the pair of low-resistance regions 231n of the transistor 208 through the conductive layer 222b.

The electrode 111 of the light-receiving element 180 is electrically connected to the other of the pair of low-resistance regions 231n of the transistor 209 through the conductive layer 221b.

Figure 8B:
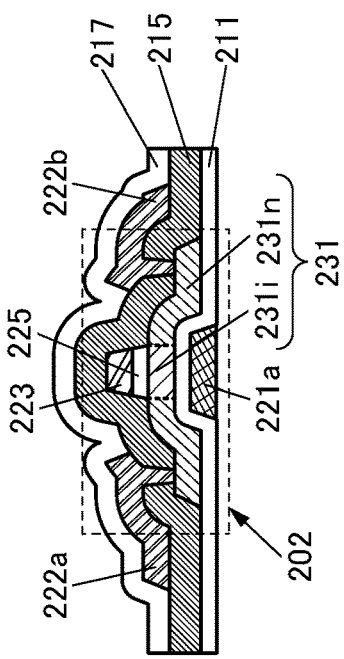
FIG. 8(B) is a cross-sectional view showing an example of a transistor.

FIG. 8(A) shows an example in which the insulating layer 225 covers a top surface and a side surface of the semiconductor layer. Meanwhile, in FIG. 8(B), the insulating layer 225 overlaps with the channel formation region 231i of the semiconductor layer 231 and does not overlap with the low-resistance regions 231n. The structure shown in FIG. 8(B) can be manufactured by processing the insulating layer 225 using the conductive layer 223 as a mask, for example. In FIG. 8(B), the insulating layer 215 is provided to cover the insulating layer 225 and the conductive layer 223, and the conductive layer 222a and the conductive layer 222b are connected to the low-resistance regions 231n through openings in the insulating layer 215. Furthermore, an insulating layer 217 covering the transistor may be provided.

[Display Device 110A]

Figure 9:
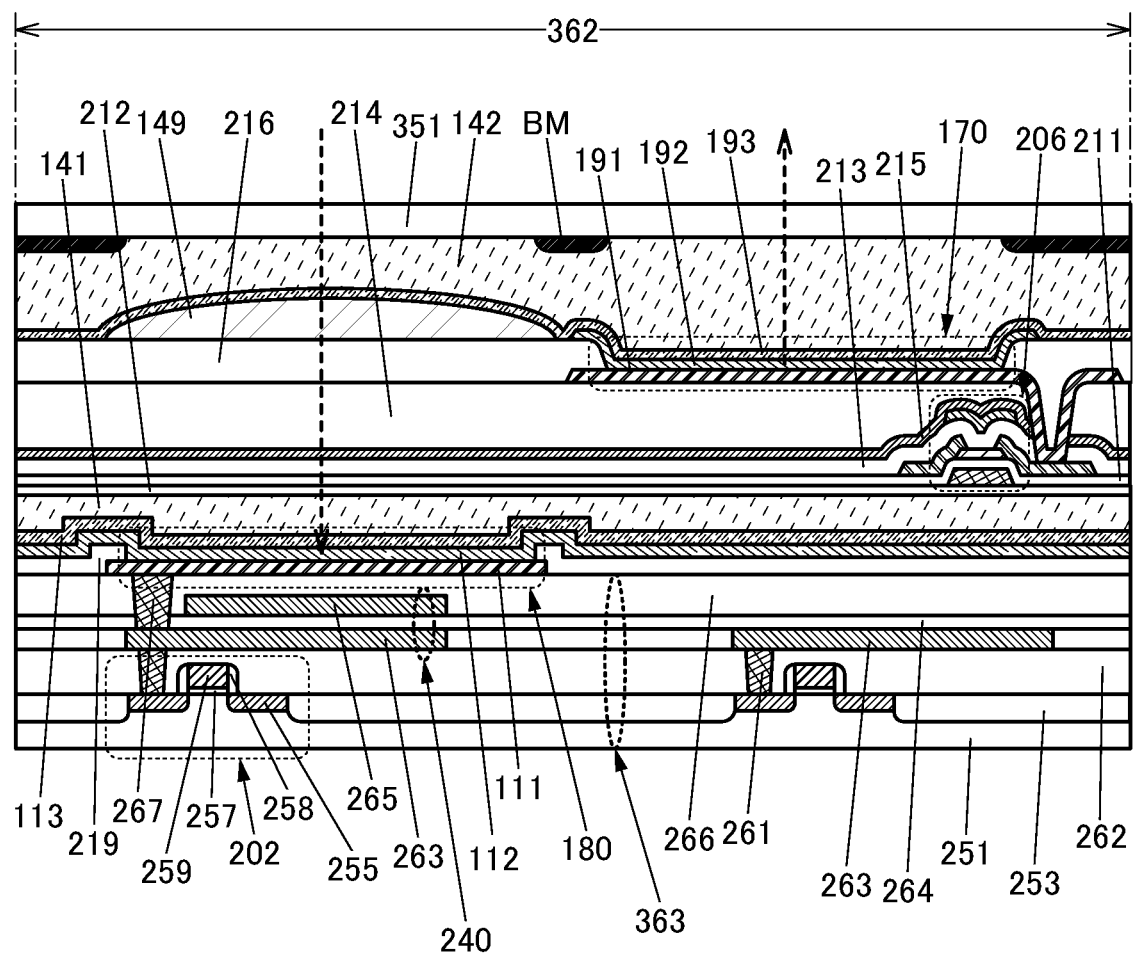
FIG. 9 is a cross-sectional view showing an example of a display device.

FIG. 9 shows a cross-sectional view of the display portion 362 of the display device 110A.

The display device 110A shown in FIG. 9 includes a transistor 202, the transistor 206, the light-emitting element 170, the light-receiving element 180, the lens 149, and the like between a semiconductor substrate 251 and the substrate 351.

The light-emitting element 170 is sealed with the substrate 351 and the adhesive layer 142. The structures of the transistor 206 and the light-emitting element 170 are similar to those in the display device 100A shown in FIG. 6.

The transistor 206 and the light-emitting element 170 are provided over the insulating layer 212. The light-receiving element 180 formed over the circuit board 363 is bonded to the insulating layer 212 with the adhesive layer 141.

The stacked-layer structure from the semiconductor substrate 251 to the insulating layer 266 corresponds to the circuit board 363 shown in FIG. 3(A).

The circuit board 363 shown in FIG. 9 includes the transistor 202 whose channel is formed in the semiconductor substrate 251. A single crystal silicon substrate is suitable for the semiconductor substrate 251. The transistor 202 includes a conductive layer 259, an insulating layer 257, an insulating layer 258, and a pair of low-resistance regions 255. The conductive layer 259 functions as a gate. The insulating layer 257 is positioned between the conductive layer 259 and the semiconductor substrate 251 and functions as a gate insulating layer. The insulating layer 258 is provided to cover a side surface of the conductive layer 259 and functions as a sidewall. The pair of low-resistance regions 255 are regions doped with an impurity in the semiconductor substrate 251, and one of the pair of low-resistance regions 255 functions as a source of the transistor 202 and the other functions as a drain of the transistor 202.

In addition, an element isolation layer 253 is provided between two adjacent transistors to be embedded in the semiconductor substrate 251.

An insulating layer 262 is provided to cover the transistor 202 and a capacitor 240 is provided over the insulating layer 262.

The capacitor 240 has a structure in which a conductive layer 263, an insulating layer 264, and a conductive layer 265 are stacked in this order from the insulating layer 262 side. In the capacitor 240, the conductive layer 263 functions as one electrode, the conductive layer 265 functions as the other electrode, and the insulating layer 264 functions as a dielectric.

The conductive layer 263 is electrically connected to one of the low-resistance regions 255 of the transistor 202 through a plug 261 provided in the insulating layer 262. The insulating layer 264 is provided to cover the conductive layer 263 and the conductive layer 265 overlaps with the conductive layer 263 with the insulating layer 264 therebetween.

The insulating layer 266 is provided to cover the capacitor 240 and the light-receiving element 180 is provided over the insulating layer 266.

The light-receiving element 180 has a stacked-layer structure in which the electrode 111, the organic layer 112, and the electrode 113 are stacked in this order from the insulating layer 266 side. The electrode 111 is electrically connected to the conductive layer 263 through a plug 267 provided in the insulating layer 264 and the insulating layer 266. The conductive layer 263 is electrically connected to one of the low-resistance regions 255 included in the transistor 202 through the plug 261. That is, the electrode 111 is electrically connected to the source or the drain of the transistor 202. An end portion of the electrode 111 is covered with an insulating layer 219. The electrode 111 contains a material that reflects visible light and the electrode 113 contains a material that transmits visible light. Light enters the light-receiving element 180 through the substrate 351, the adhesive layer 142, the electrode 193, the lens 149, the insulating layer 216, the insulating layer 214, the insulating layer 212, the adhesive layer 141, and the like. For these layers, a material having a high transmitting property with respect to visible light is preferably used.

The lens 149 is provided on and in contact with the insulating layer 216. The lens 149 has a convex surface on the substrate 351 side. Here, it is preferable that the light-receiving region of the light-receiving element 180 overlap with the lens 149 and not overlap with the EL layer 192. Thus, the sensitivity and accuracy of the sensor using the light-receiving element 180 can be increased.

The light-blocking layer BM is preferably provided on a surface of the substrate 351 on the circuit board 363 side.

[Display Device 110B]

Figure 10:
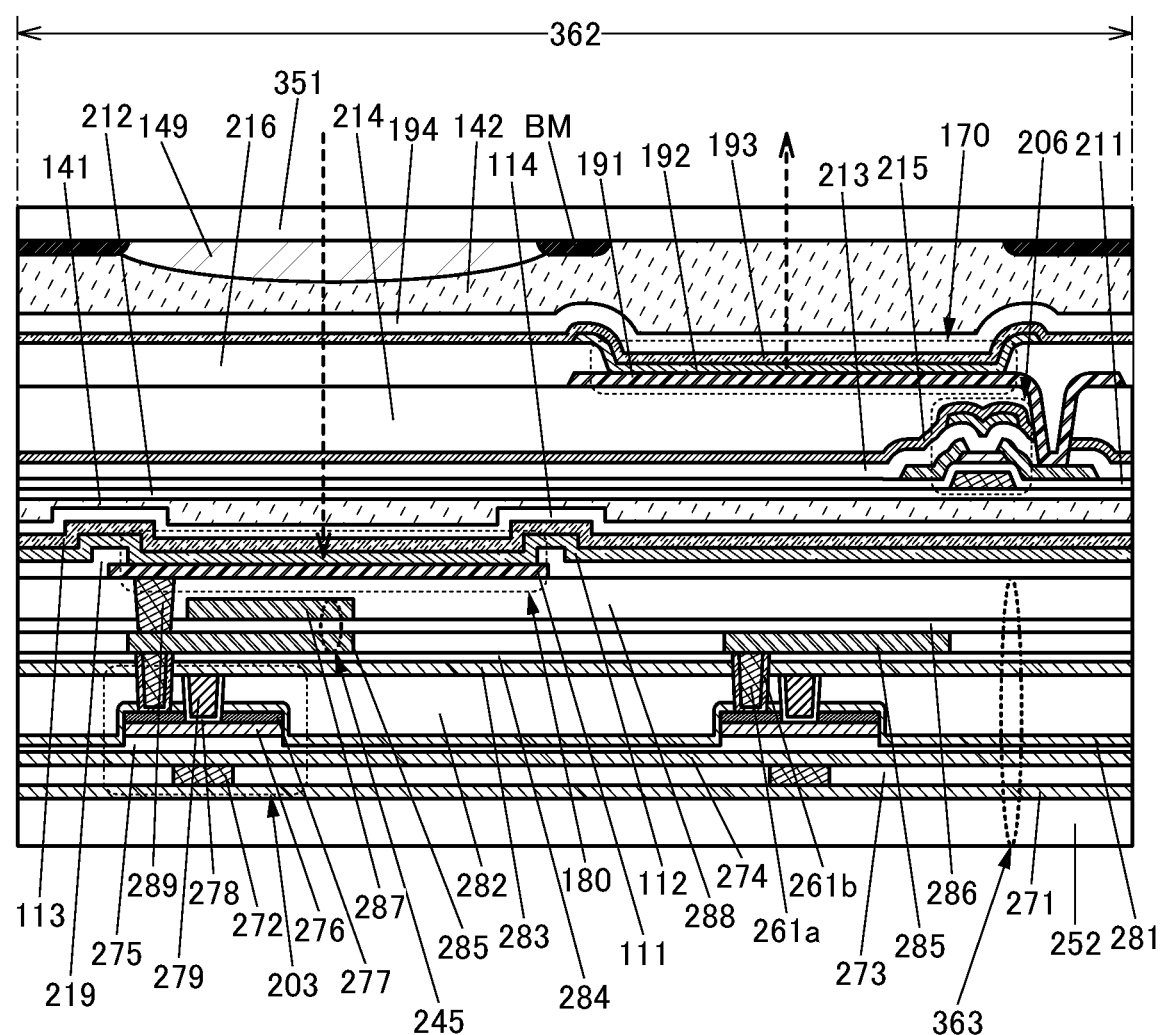
FIG. 10 is a cross-sectional view showing an example of a display device.

FIG. 10 shows a cross-sectional view of a display device 110B.

The display device 110B shown in FIG. 10 includes a transistor 203, the transistor 206, the light-emitting element 170, the light-receiving element 180, the lens 149, and the like between a substrate 252 and the substrate 351.

The light-emitting element 170 is covered with the protective layer 194 and is sealed with the substrate 351 and the adhesive layer 142. The structures of the transistor 206 and the light-emitting element 170 are similar to those in the display device 100B shown in FIG. 7.

The transistor 206 and the light-emitting element 170 are provided over the insulating layer 212. The light-receiving element 180 and the protective layer 114 formed over the circuit board 363 are bonded to the insulating layer 212 with the adhesive layer 141.

The stacked-layer structure from the substrate 252 to an insulating layer 288 corresponds to the circuit board 363 shown in FIG. 3(B).

The circuit board 363 shown in FIG. 10 includes the transistor 203 over the substrate 252.

An insulating substrate such as a glass substrate, a quartz substrate, a sapphire substrate, or a ceramic substrate; a single crystal semiconductor substrate or a polycrystalline semiconductor substrate using silicon, silicon carbide, or the like as a material; a compound semiconductor substrate of silicon germanium or the like; or a semiconductor substrate such as an SOI substrate can be used as the substrate 252.

An insulating layer 271 is provided over the substrate 252. The insulating layer 271 functions as a barrier layer that inhibits diffusion of impurities such as water and hydrogen from the substrate 252 into the transistor 203 and release of oxygen from a semiconductor layer 276 to the insulating layer 271 side. As the insulating layer 271, a film in which hydrogen or oxygen is less likely to be diffused than in a silicon oxide film, such as an aluminum oxide film, a hafnium oxide film, or a silicon nitride film, can be used, for example.

The transistor 203 includes a conductive layer 272, an insulating layer 273, an insulating layer 274, an insulating layer 275, the semiconductor layer 276, a pair of conductive layers 277, an insulating layer 278, a conductive layer 279, and the like. The semiconductor layer 276 preferably contains a metal oxide.

The conductive layer 272 and the insulating layer 273 are provided over the insulating layer 271, and the insulating layer 274 and the insulating layer 275 are provided to cover the conductive layer 272 and the insulating layer 273. The semiconductor layer 276 is provided over the insulating layer 275. The conductive layer 272 functions as a gate, and the insulating layer 274 and the insulating layer 275 each function as a gate insulating layer. The conductive layer 272 overlaps with the semiconductor layer 276 with the insulating layer 274 and the insulating layer 275 therebetween. The insulating layer 274 preferably functions as a barrier layer like the insulating layer 271. As the insulating layer 275 in contact with the semiconductor layer 276, an oxide insulating film such as a silicon oxide film is preferably used.

The pair of conductive layers 277 is provided to be apart from each other over the semiconductor layer 276. The pair of conductive layers 277 functions as a source and a drain. An insulating layer 281 is provided to cover the semiconductor layer 276 and the pair of conductive layers 277, and an insulating layer 282 is provided over the insulating layer 281. An opening reaching the semiconductor layer 276 is provided in the insulating layer 281 and the insulating layer 282, and the insulating layer 278 and the conductive layer 279 are embedded in the opening. An insulating layer 283 and an insulating layer 284 are provided to cover top surfaces of the insulating layer 282, the insulating layer 278, and the conductive layer 279. The conductive layer 279 functions as a gate and the insulating layer 278 functions as a gate insulating layer. The conductive layer 279 overlaps with the semiconductor layer 276 with the insulating layer 278 therebetween. The insulating layer 281 and the insulating layer 283 each preferably function as a barrier layer like the insulating layer 271. When the pair of conductive layers 277 is covered with the insulating layer 281, oxidation of the pair of conductive layers 277 due to oxygen contained in the insulating layer 282 can be inhibited.

A plug electrically connected to one of the pair of conductive layers 277 and a conductive layer 285 is embedded in an opening provided in the insulating layer 281, the insulating layer 282, the insulating layer 283, and the insulating layer 284. The plug preferably includes a conductive layer 261a in contact with a side surface of the opening and a top surface of the one of the pair of conductive layers 277, and a conductive layer 261b embedded on an inner side than the conductive layer 261a. In this case, a conductive material in which hydrogen and oxygen are unlikely to be diffused is preferably used for the conductive layer 261a.

A capacitor 245 is provided over the insulating layer 284.

The capacitor 245 has a structure in which the conductive layer 285, an insulating layer 286, and a conductive layer 287 are stacked in this order from the insulating layer 284 side. In the capacitor 245, the conductive layer 285 functions as one electrode, the conductive layer 287 functions as the other electrode, and the insulating layer 286 functions as a dielectric. The insulating layer 286 is provided to cover the conductive layer 285 and the conductive layer 287 overlaps with the conductive layer 285 with the insulating layer 286 therebetween.

The insulating layer 288 is provided to cover the capacitor 245 and the light-receiving element 180 is provided over the insulating layer 288.

The light-receiving element 180 has a stacked-layer structure in which the electrode 111, the organic layer 112, and the electrode 113 are stacked in this order from the insulating layer 288 side. The light-receiving element 180 is covered with the protective layer 114. The electrode 111 is electrically connected to the conductive layer 285 through a plug 289 provided in the insulating layer 286 and the insulating layer 288. The conductive layer 285 is electrically connected to the one of the pair of conductive layers 277 through the above-described plug. That is, the electrode 111 is electrically connected to the source or the drain of the transistor 203. The electrode 111 contains a material that reflects visible light and the electrode 113 contains a material that transmits visible light. Light enters the light-receiving element 180 through the substrate 351, the lens 149, the adhesive layer 142, the protective layer 194, the electrode 193, the insulating layer 216, the insulating layer 214, the insulating layer 212, the adhesive layer 141, and the like.

The lens 149 is provided on a surface of the substrate 351 on the substrate 252 side. The lens 149 has a convex surface on the substrate 252 side. Here, it is preferable that the light-receiving region of the light-receiving element 180 overlap with the lens 149 and not overlap with the EL layer 192. Thus, the sensitivity and accuracy of the sensor using the light-receiving element 180 can be increased.

The light-blocking layer BM is preferably provided on a surface of the substrate 351 on the circuit board 363 side.

[Display Device 120A]

Figure 11:
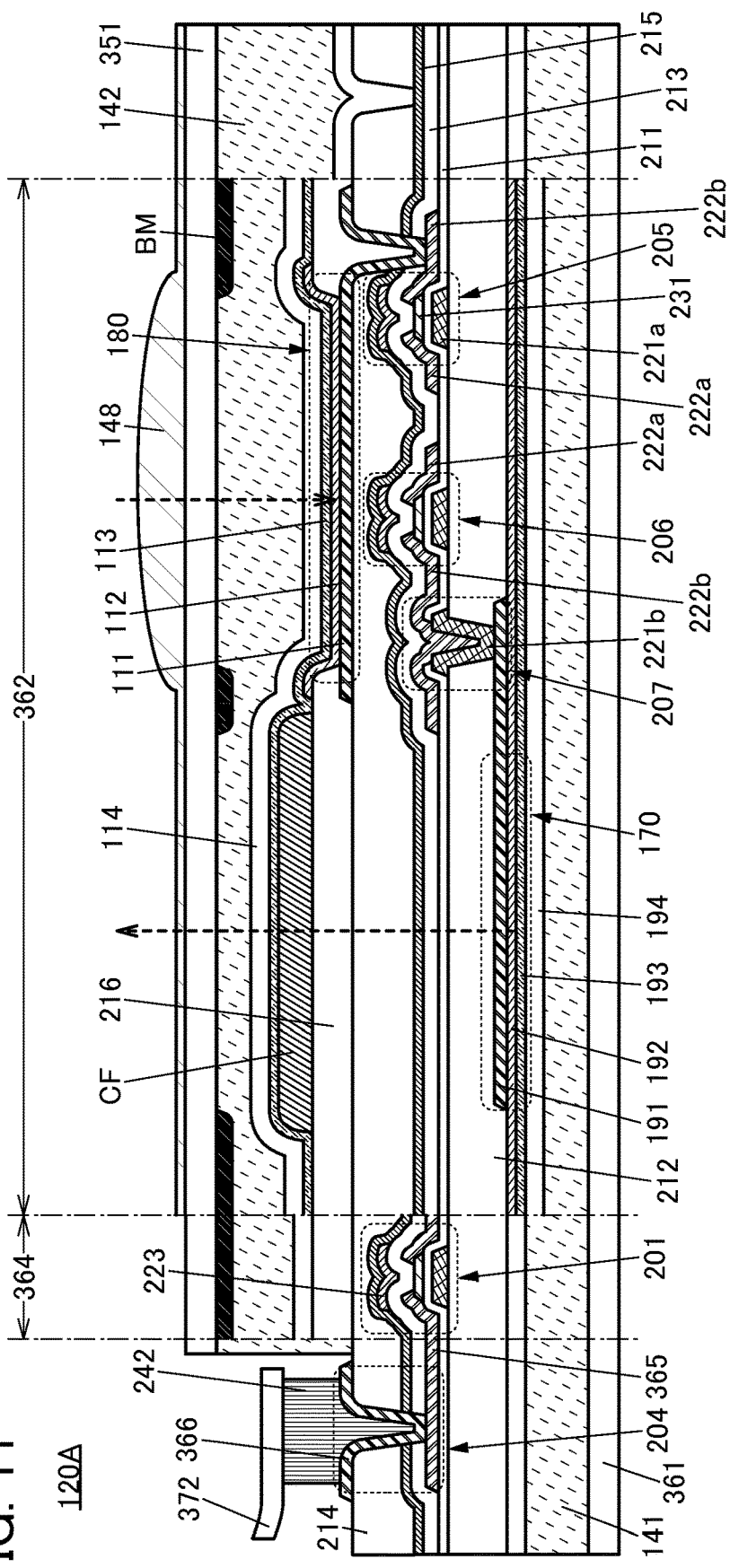
FIG. 11 is a cross-sectional view showing an example of a display device.

FIG. 11 shows a cross-sectional view of a display device 120A.

The display device 120A shown in FIG. 11 includes the transistor 201, the transistor 205, the transistor 206, the light-emitting element 170, the light-receiving element 180, the lens array 148, and the like between the substrate 351 and the substrate 361.

The substrate 361 and the protecting layer 194 are bonded to each other with the adhesive layer 141. The substrate 351 and the protecting layer 114 are bonded to each other with the adhesive layer 142. The lens array 148 is provided on a display surface side of the substrate 351. The light-blocking layer BM is preferably provided on a surface of the substrate 351 on the substrate 361 side.

The light-emitting element 170 has a stacked-layer structure in which the electrode 191, the EL layer 192, and the electrode 193 are stacked in this order from the insulating layer 212 side. The electrode 191 is connected to the conductive layer 221b through an opening provided in the insulating layer 212. The conductive layer 221b is connected to the conductive layer 222b included in the transistor 206. That is, at the connection portion 207, the electrode 191 is electrically connected to the conductive layer 222b included in the transistor 206 through the conductive layer 221b. The transistor 206 has a function of controlling the driving of the light-emitting element 170. The electrode 191 contains a material that transmits visible light and the electrode 193 contains a material that reflects visible light. Light emitted from the light-emitting element 170 is emitted to the substrate 351 side through the insulating layer 212, the insulating layer 214, the insulating layer 216, the coloring layer CF, the electrode 113, the protecting layer 114, the adhesive layer 142, and the like. For these layers, a material having a high transmitting property with respect to visible light is preferably used.

The light-receiving element 180 has a stacked-layer structure in which the electrode 111, the organic layer 112, and the electrode 113 are stacked in this order from the insulating layer 214 side. The electrode 111 is connected to the conductive layer 222b included in the transistor 205 through an opening provided in the insulating layer 214. The insulating layer 216 covers an end portion of the electrode 111. The electrode 111 contains a material that reflects visible light and the electrode 113 contains a material that transmits visible light. Light enters the light-receiving element 180 through the lens array 148, the substrate 351, the adhesive layer 142, and the like.

The coloring layer CF is provided on and in contact with the insulating layer 216. Here, it is preferable that the coloring layer CF overlap with the light-emitting element 170 and not overlap with the organic layer 112. Thus, the sensitivity and accuracy of the sensor using the light-receiving element 180 can be increased.

The coloring layer is a colored layer that transmits light in a specific wavelength range. For example, a color filter that transmits light in a red, green, blue, or yellow wavelength range can be used. As a material that can be used for the coloring layer, a metal material, a resin material, a resin material containing a pigment or dye, and the like can be given.

[Display Device 120B]

Figure 12:
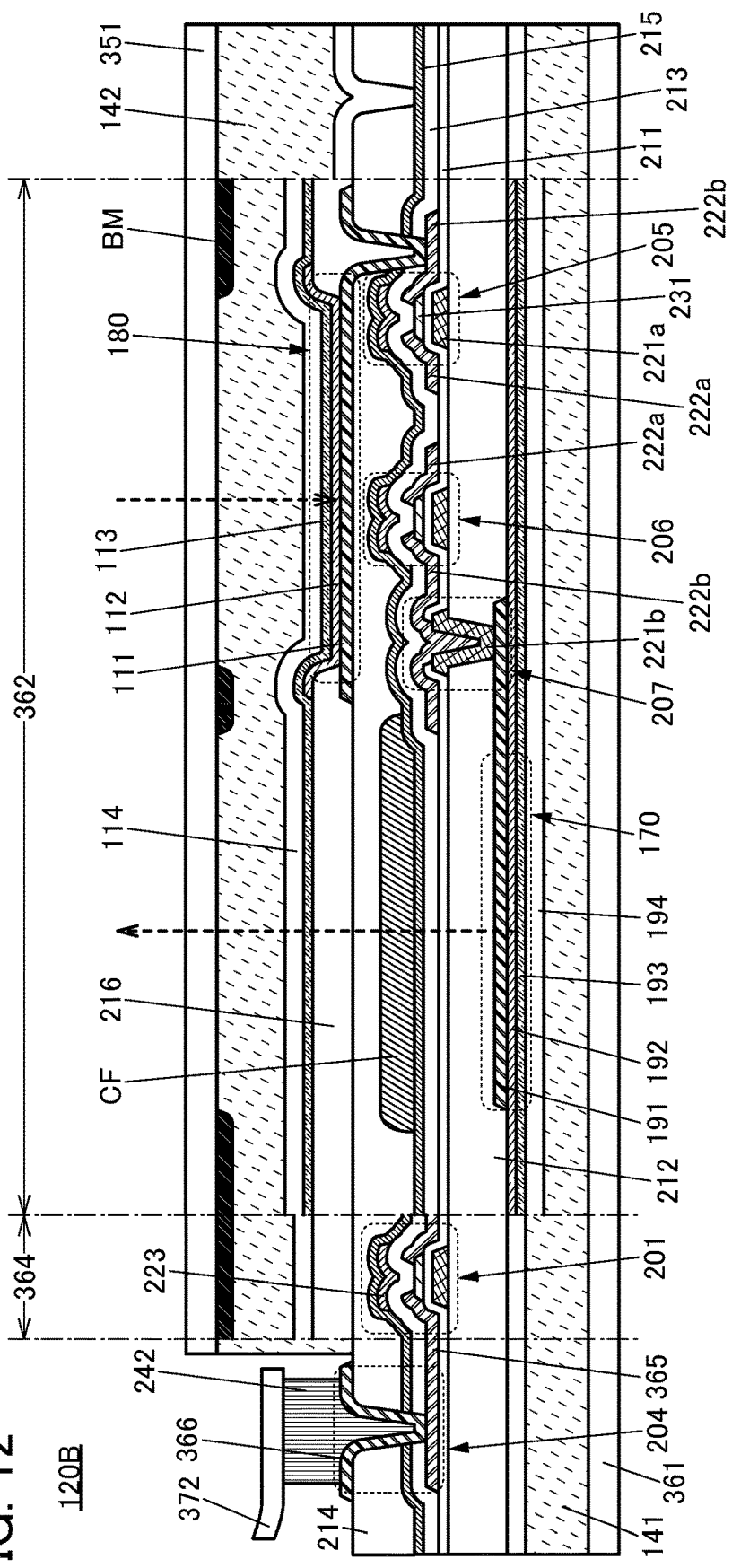
FIG. 12 is a cross-sectional view showing an example of a display device.

FIG. 12 shows a cross-sectional view of a display device 120B.

The display device 120B is different from the display device 120A (FIG. 11) in that the lens array 148 is not provided and the coloring layer CF is provided on and in contact with the insulating layer 215. The other components are similar to those of the display device 120A.

The coloring layer CF is preferably formed after the insulating layer 215 functioning as a barrier layer of a transistor is formed, in which case entry of impurities into the transistor in the process of manufacturing the coloring layer CF can be inhibited, leading to an increase in the reliability of the transistor.

[Metal Oxide]

A metal oxide that can be used for the semiconductor layer is described below.

Note that in this specification and the like, a metal oxide containing nitrogen is also collectively referred to as a metal oxide in some cases. A metal oxide containing nitrogen may be referred to as a metal oxynitride. For example, a metal oxide containing nitrogen, such as zinc oxynitride (ZnON), may be used for the semiconductor layer.

Note that in this specification and the like, CAAC (c-axis aligned crystal) and CAC (Cloud-Aligned Composite) might be stated. Note that CAAC refers to an example of a crystal structure and CAC refers to an example of a function or a material composition.

For example, a CAC-OS (Cloud-Aligned Composite Oxide Semiconductor) can be used for the semiconductor layer.

A CAC-OS or a CAC-metal oxide has a conducting function in part of the material and has an insulating function in another part of the material; as a whole, the CAC-OS or the CAC-metal oxide has a function of a semiconductor. Note that in the case where the CAC-OS or the CAC-metal oxide is used in an active layer of a transistor, the conducting function is a function that allows electrons (or holes) serving as carriers to flow, and the insulating function is a function that does not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

The CAC-OS or the CAC-metal oxide includes conductive regions and insulating regions. The conductive regions have the above-described conducting function and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, the conductive regions are observed to be coupled in a cloud-like manner with their boundaries blurred, in some cases.

In the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

The CAC-OS or the CAC-metal oxide includes components having different bandgaps. For example, the CAC-OS or the CAC-metal oxide includes a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, high current driving capability in an on state of the transistor, that is, a high on-state current and high field-effect mobility can be obtained.

In other words, the CAC-OS or the CAC-metal oxide can also be referred to as a matrix composite or a metal matrix composite.

Oxide semiconductors (metal oxides) can be classified into a single crystal oxide semiconductor and a non-single-crystal oxide semiconductor. Examples of a non-single-crystal oxide semiconductor include a CAAC-OS (c-axis aligned crystalline oxide semiconductor), a polycrystalline oxide semiconductor, an nc-OS (nanocrystalline oxide semiconductor), an a-like OS (amorphous-like oxide semiconductor), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear crystal grain boundary (also referred to as grain boundary) even in the vicinity of distortion in the CAAC-OS. That is, formation of a crystal grain boundary is inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

Furthermore, the CAAC-OS tends to have a layered crystal structure (also referred to as a layered structure) in which a layer containing indium and oxygen (hereinafter, In layer) and a layer containing an element M, zinc, and oxygen (hereinafter, (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is a metal oxide with high crystallinity. On the other hand, in the CAAC-OS, a reduction in electron mobility due to the crystal grain boundary is less likely to occur because it is difficult to observe a clear crystal grain boundary. Entry of impurities, formation of defects, or the like might decrease the crystallinity of a metal oxide; thus, it can be said that the CAAC-OS is a metal oxide that has small amounts of impurities and defects (e.g., oxygen vacancies (also referred to as $V_O$)). Thus, a metal oxide including a CAAC-OS is physically stable. Accordingly, the metal oxide including a CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor depending on the analysis method.

Note that an indium-gallium-zinc oxide (hereinafter referred to as IGZO) that is a kind of metal oxide containing indium, gallium, and zinc has a stable structure in some cases by being formed of the above-described nanocrystals. In some cases, an IGZO has a stable structure when formed of smaller crystals (e.g., the above-described nanocrystals) rather than larger crystals (here, crystals with a size of several millimeters or several centimeters) because crystal growth tends to hardly occur particularly in the air.

The a-like OS is a metal oxide having a structure between those of the nc-OS and the amorphous oxide semiconductor. The a-like OS contains a void or a low-density region. That is, the a-like OS has low crystallinity as compared with the nc-OS and the CAAC-OS.

An oxide semiconductor (metal oxide) has various structures with different properties. Two or more kinds of the amorphous oxide semiconductor, the polycrystalline oxide semiconductor, the a-like OS, the nc-OS, and the CAAC-OS may be included in the oxide semiconductor of one embodiment of the present invention.

A metal oxide film that functions as a semiconductor layer can be deposited using one or both of an inert gas and an oxygen gas. Note that there is no particular limitation on the flow rate ratio of oxygen (the partial pressure of oxygen) at the time of depositing the metal oxide film. However, to obtain a transistor having high field-effect mobility, the flow rate ratio of oxygen (the partial pressure of oxygen) at the time of depositing the metal oxide film is preferably higher than or equal to 0% and lower than or equal to 30%, further preferably higher than or equal to 5% and lower than or equal to 30%, still further preferably higher than or equal to 7% and lower than or equal to 15%.

The energy gap of the metal oxide is preferably 2 eV or more, further preferably 2.5 eV or more, still further preferably 3 eV or more. With the use of a metal oxide having such a wide energy gap, the off-state current of the transistor can be reduced.

[Method for Manufacturing Display Device 100A]

An example of a method for manufacturing the display device 100A shown in FIG. 5 and FIG. 6 is described below with reference to FIG. 13 to FIG. 16. The manufacturing method is described with reference to FIG. 13 to FIG. 16, particularly focusing on the display portion 362 of the display device 100A.

Note that thin films that form the display device (e.g., insulating films, semiconductor films, or conductive films) can be formed by a sputtering method, a chemical vapor deposition (CVD) method, a vacuum evaporation method, a pulsed laser deposition (PLD) method, an atomic layer deposition (ALD) method, or the like. As the CVD method, a plasma-enhanced chemical vapor deposition (PECVD) method or a thermal CVD method may be used. As an example of the thermal CVD method, a metal organic chemical vapor deposition (MOCVD: Metal Organic CVD) method may be used.

The thin films that form the display device (e.g., insulating films, semiconductor films, or conductive films) can be formed by a method such as spin coating, dipping, spray coating, ink-jetting, dispensing, screen printing, offset printing, a doctor knife, slit coating, roll coating, curtain coating, or knife coating.

When the thin films that form the display device are processed, a lithography method or the like can be used for the processing. Alternatively, island-shaped thin films may be formed by a deposition method using a blocking mask. Alternatively, a nanoimprinting method, a sandblasting method, a lift-off method, or the like may be used for the processing of the thin films. As a photolithography method, there are a method in which a resist mask is formed over a thin film to be processed, the thin film is processed by etching or the like, and the resist mask is removed, and a method in which a photosensitive thin film is formed, and then exposed to light and developed to be processed into a desired shape.

In the case of using light in the lithography method, for example, an i-line (a wavelength of 365 nm), a g-line (a wavelength of 436 nm), and an h-line (a wavelength of 405 nm), or combined light of any of them can be used for light exposure. Besides, ultraviolet light, KrF laser light, ArF laser light, or the like can be used. Furthermore, exposure may be performed by liquid immersion light exposure technique. Furthermore, as the light used for the exposure, extreme ultra-violet (EUV) light or X-rays may be used. Furthermore, instead of the light used for the exposure, an electron beam can also be used. It is preferable to use extreme ultra-violet light, X-rays, or an electron beam because extremely minute processing can be performed. Note that in the case of performing exposure by scanning of a beam such as an electron beam, a photomask is not needed.

For etching of the thin films, a dry etching method, a wet etching method, a sandblasting method, or the like can be used.

Figure 13A:
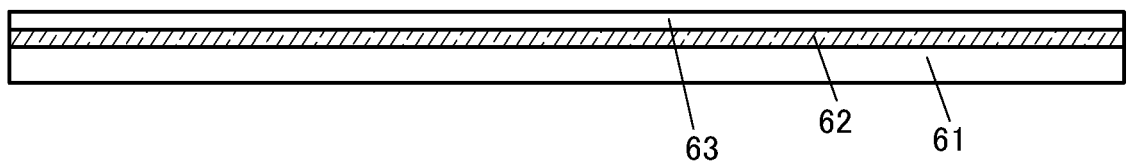
FIG. 13(A) to FIG. 13(C) are cross-sectional views showing an example of a method for manufacturing a display device.

First, a separation layer 62 is formed over a formation substrate 61 and an insulating layer 63 is formed over the separation layer 62 (FIG. 13(A)). Note that the insulating layer 63 is not necessarily provided. That is, a layer to be separated (a stacked-layer structure from the insulating layer 212 and the electrode 111 to the substrate 351 in FIG. 6) may be formed directly on the separation layer 62.

In this process, materials that would cause separation at an interface between the formation substrate 61 and the separation layer 62, an interface between the separation layer 62 and the insulating layer 63, or in the separation layer 62 when the formation substrate 61 is separated is selected. In this embodiment, an example in which separation occurs at the interface between the separation layer 62 and the insulating layer 63 is described; however, it is not limited to such an example depending on the combination of materials used for the separation layer 62 and the insulating layer 63.

The formation substrate 61 has rigidity high enough for easy transfer and has heat resistance to the temperature applied in the manufacturing process. Examples of a material that can be used for the formation substrate 61 include glass, quartz, ceramics, sapphire, a resin, a semiconductor, a metal, and an alloy. Examples of the glass include alkali-free glass, barium borosilicate glass, and aluminoborosilicate glass.

The separation layer 62 can be formed using one or both of an organic material and an inorganic material.

Examples of the inorganic material that can be used for the separation layer 62 include a metal, an alloy, and a compound, which contain an element selected from tungsten, molybdenum, titanium, tantalum, niobium, nickel, cobalt, zirconium, zinc, ruthenium, rhodium, palladium, osmium, iridium, and silicon. A crystal structure of a layer containing silicon may be any of amorphous, microcrystal, or polycrystal.

In the case where an inorganic material is used, the thickness of the separation layer 62 is greater than or equal to 1 nm and less than or equal to 1000 nm, preferably greater than or equal to 10 nm and less than or equal to 200 nm, further preferably greater than or equal to 10 nm and less than or equal to 100 nm.

In the case where an inorganic material is used, the separation layer 62 can be formed by, for example, a sputtering method, a CVD method, an ALD method, or an evaporation method.

Examples of an organic material that can be used for the separation layer 62 include a polyimide resin, an acrylic resin, an epoxy resin, a polyamide resin, a polyimide-amide resin, a siloxane resin, a benzocyclobutene-based resin, and a phenol resin.

In the case where an organic material is used, the thickness of the separation layer 62 is preferably greater than or equal to 0.01 µm and less than 10 µm, further preferably greater than or equal to 0.1 µm and less than or equal to 3 µm, still further preferably greater than or equal to 0.5 µm and less than or equal to 1 µm. When the thickness of the separation layer 62 is within the above range, the manufacturing cost can be reduced. Note that the thickness of the separation layer 62 is not limited thereto, and may be greater than or equal to 10 µm, for example, greater than or equal to 10 µm and less than or equal to 200 µm.

In the case where an organic material is used, examples of a method for forming the separation layer 62 include spin coating, dipping, spray coating, ink-jetting, dispensing, screen printing, offset printing, a doctor knife, a slit coating, a roll coating, a curtain coating, and a knife coating.

An inorganic insulating film is preferably used as the insulating layer 63. As the insulating layer 63, an inorganic insulating film such as a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may also be used. A stack including two or more of the above insulating films may also be used.

For example, a stacked-layer structure of a layer containing a high-melting-point metal material such as tungsten and a layer containing an oxide of the metal material may be used for the separation layer 62, and a stacked-layer structure of a plurality of inorganic insulating films containing silicon nitride, silicon oxynitride, silicon nitride oxide, or the like may be used for the insulating layer 63. The use of the high-melting-point metal material for the separation layer 62 can increase the formation temperature of a layer formed in a later process, which reduces impurity concentration and achieves a highly reliable display device. Note that a step for removing a layer unnecessary for the display device (e.g., the separation layer 62 or the insulating layer 63) may be performed after the separation. The separation layer 62 or the insulating layer 63 is not necessarily removed and may be used as a component of the display device.

For example, a structure in which a metal oxide film is used as the separation layer 62 and one or both of an inorganic insulating film and an organic insulating film are used as the insulating layer 63 can be employed. In this case, separation can occur at the interface between the separation layer 62 and the insulating layer 63, for example. Alternatively, a structure in which an organic insulating film is used as the separation layer 62 and an inorganic insulating film is used as the insulator layer 63 or the insulator layer 63 is not formed can be employed. In this case, separation can occur at the interface between the formation substrate 61 and the separation layer 62 or in the separation layer 62, for example.

Figure 13B:
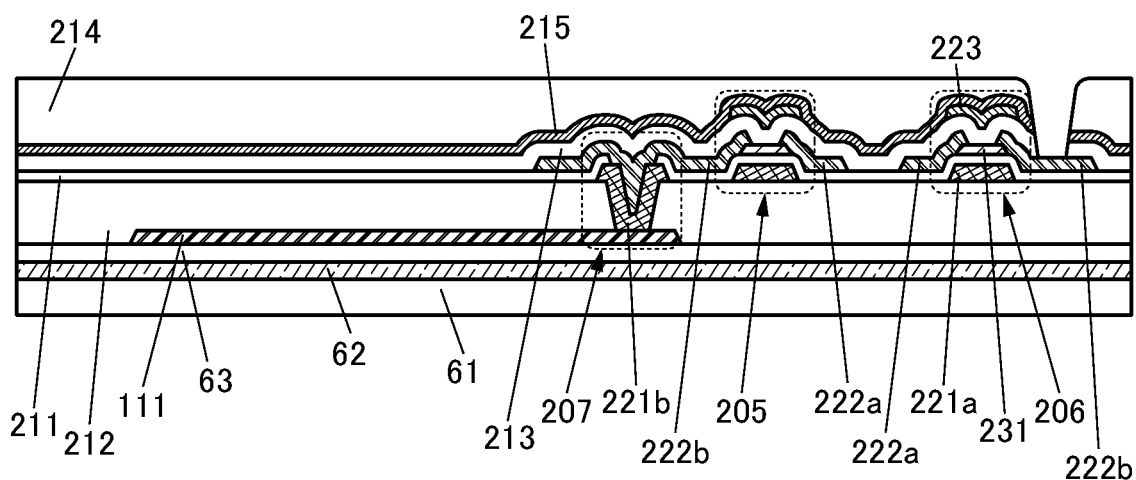

Next, the electrode 111 is formed over the insulating layer 63, the insulating layer 212 is formed over the electrode 111, and an opening reaching the electrode 111 is provided in the insulating layer 212 (FIG. 13(B)).

The electrode 111 can be formed in the following manner: after a conductive film is deposited, a resist mask is formed, the conductive film is etched, and then the resist mask is removed. The electrode 111 is formed using a conductive material that transmits visible light.

The insulating layer 212 can be used as a barrier layer that inhibits diffusion of impurities contained in the separation layer 62 into a transistor or a light-emitting element to be formed later. In the case of using an organic material for the separation layer 62, the insulating layer 212 preferably inhibits diffusion of moisture and the like contained in the separation layer 62 into the transistor and the light-emitting element when the separation layer 62 is heated. Thus, the insulating layer 212 preferably has a high barrier property.

An inorganic insulating film can be used as the insulating layer 212. As the inorganic insulating film, a silicon nitride film, a silicon oxynitride film, a silicon oxide film, a silicon nitride oxide film, an aluminum oxide film, an aluminum nitride film, or the like can be given. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may also be used. A stack including two or more of the above insulating films may also be used. An organic insulating material may be used as a material of the insulating layer 212. As the organic insulating material, a resin such as an acrylic resin or an epoxy resin can be given.

Next, the transistor 205 and the transistor 206 are formed over the insulating layer 212 (FIG. 13(B)).

Specifically, first, the conductive layer 221a and the conductive layer 221b are formed over the insulating layer 212. The conductive layer 221a and the conductive layer 221b can be formed in the following manner: after a conductive film is deposited, a resist mask is formed, the conductive film is etched, and then the resist mask is removed. At this time, the conductive layer 221b and the electrode 111 are connected to each other through an opening in the insulating layer 212.

Next, the insulating layer 211 is formed.

As the insulating layer 211, an inorganic insulating film such as a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may also be used. A stack including two or more of the above insulating films may also be used.

An inorganic insulating film is preferably formed at high temperatures because the film can have higher density and a higher barrier property as the film formation temperature becomes higher. The substrate temperature at the time of depositing the inorganic insulating film is preferably higher than or equal to room temperature (25° C.) and lower than or equal to 350° C., further preferably higher than or equal to 100° C. and lower than or equal to 300° C.

Next, the semiconductor layer 231 is formed. In this embodiment, an oxide semiconductor layer is formed as the semiconductor layer 231. The oxide semiconductor layer can be formed in the following manner: after an oxide semiconductor film is deposited, a resist mask is formed, the oxide semiconductor film is etched, and then the resist mask is removed.

The substrate temperature at the time of depositing the oxide semiconductor film is preferably lower than or equal to 350° C., further preferably higher than or equal to room temperature and lower than or equal to 200° C., still further preferably higher than or equal to room temperature and lower than or equal to 130° C. The substrate temperature at the time of depositing the oxide semiconductor film is preferably room temperature because productivity can be increased.

The oxide semiconductor film can be formed by a sputtering method. Alternatively, for example, a PLD method, a PECVD method, a thermal CVD method, an ALD method, or a vacuum evaporation method may be used.

Then, the conductive layer 222a and the conductive layer 222b are formed. The conductive layer 222a and the conductive layer 222b can be formed in the following manner: after a conductive film is deposited, a resist mask is formed, the conductive film is etched, and then the resist mask is removed. The conductive layer 222a and the conductive layer 222b are each connected to the semiconductor layer 231. Here, the conductive layer 222b included in the transistor 205 is electrically connected to the conductive layer 221b. Thus, the electrode 111 and the conductive layer 222b can be electrically connected to each other in the connection portion 207.

Note that during the processing of the conductive layer 222a and the conductive layer 222b, part of the semiconductor layer 231 that is not covered by the resist mask might be reduced in thickness by etching.

Next, the insulating layer 213 covering the conductive layer 222a, the conductive layer 222b, and the semiconductor layer 231 is formed, and the conductive layer 223 is formed over the insulating layer 213.

The insulating layer 213 can be formed by a method similar to that for the insulating layer 211.

The conductive layer 223 can be formed in the following manner: after a conductive film is deposited, a resist mask is formed, the conductive film is etched, and then the resist mask is removed.

In the above manner, the transistor 205 and the transistor 206 can be manufactured (FIG. 13(B)).

Next, the insulating layer 215 is formed to cover the transistor 205 and the transistor 206 and the insulating layer 214 is formed over the insulating layer 215 (FIG. 13(B)). The insulating layer 215 can be formed by a method similar to that for the insulating layer 211. The insulating layer 214 is a layer having a surface where a light-emitting element formed later is to be formed, and thus preferably functions as a planarization layer. For the insulating layer 214, the resin or the inorganic insulating film that can be used for the insulating layer 212 can be referred to.

Next, an opening reaching the conductive layer 222b included in the transistor 206 is formed in the insulating layer 214, the insulating layer 215, and the insulating layer 213 (FIG. 13(B)).

Figure 13C:
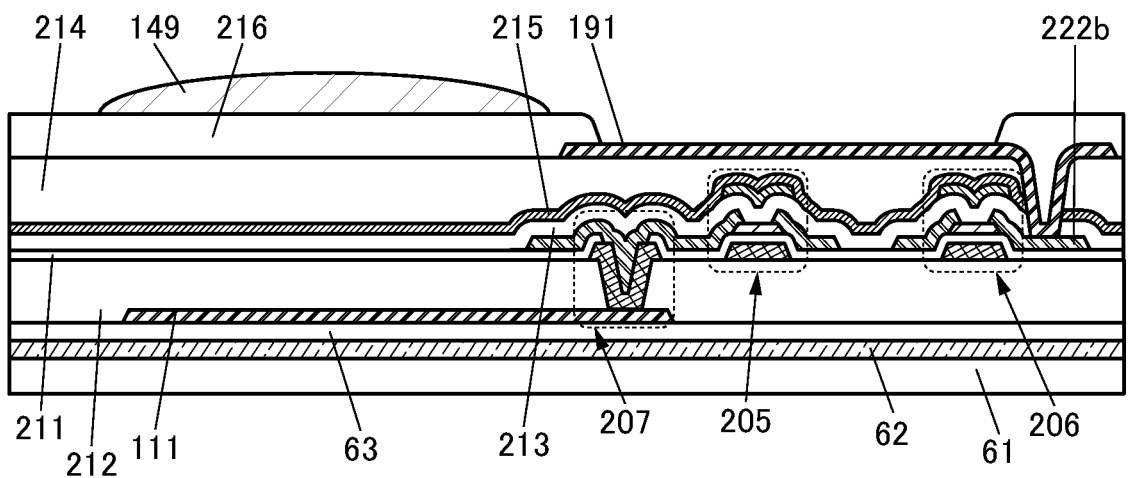

Next, the electrode 191 is formed (FIG. 13(C)). The electrode 191 can be formed in the following manner: after a conductive film is deposited, a resist mask is formed, the conductive film is etched, and then the resist mask is removed. Here, the conductive layer 222b included in the transistor 206 and the electrode 191 are connected to each other. The electrode 191 is preferably formed using a conductive material that reflects visible light.

Next, the insulating layer 216 covering an end portion of the electrode 191 is formed (FIG. 13(C)). For the insulating layer 216, a resin or an inorganic insulating film that can be used for an insulating layer 121 can be referred to. The insulating layer 216 has an opening in a portion overlapping with the electrode 191.

Next, the lens 149 is formed over the insulating layer 216 (FIG. 13(C)).

Figure 14A:
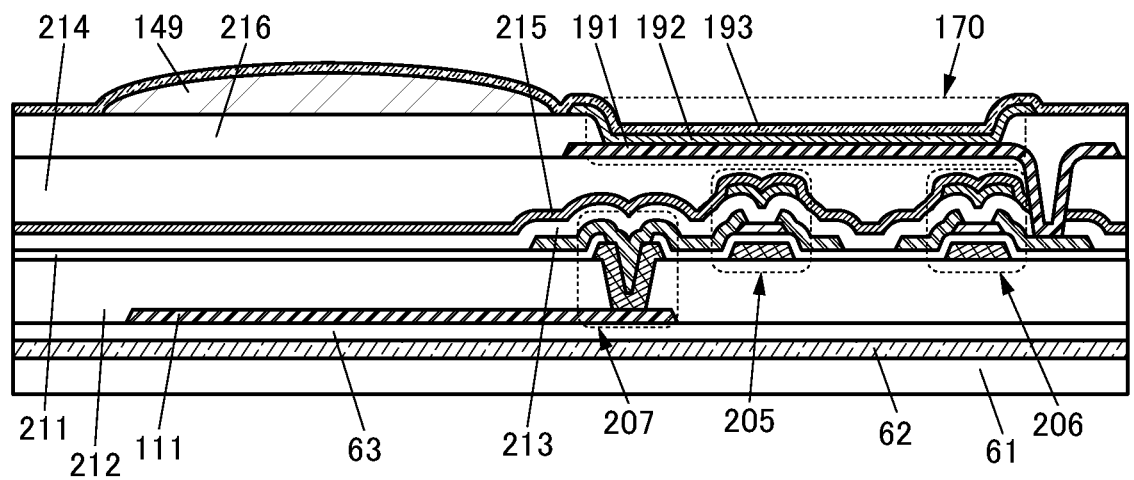
FIG. 14(A) and FIG. 14(B) are cross-sectional views showing an example of a method for manufacturing a display device.

Next, the EL layer 192 and the electrode 193 are formed (FIG. 14(A)). Part of the electrode 193 functions as a common electrode of the light-emitting element 170. The electrode 193 is formed using a conductive material that transmits visible light.

The EL layer 192 can be formed by a method such as an evaporation method, a coating method, a printing method, or a discharge method. The EL layer 192 is preferably formed so as not to overlap with the lens 149. In the case where the EL layer 192 is separately formed for each individual subpixel, it can be formed by an evaporation method using a shadow mask such as a metal mask, an ink-jet method, or the like.

Steps conducted after the formation of the EL layer 192 are performed such that the temperature applied to the EL layer 192 is lower than or equal to the upper temperature limit of the EL layer 192. The electrode 193 can be formed by an evaporation method, a sputtering method, or the like.

In the above manner, the light-emitting element 170 can be formed (FIG. 14(A)). Note that as in the display device 100B (FIG. 7), the protective layer 194 covering the light-emitting element 170 may be formed. In that case, the protecting layer 194 is preferably formed without exposure to the air after the electrode 193 is formed.

As the protecting layer 194, the inorganic insulating film that can be used as the above-described insulating layer 121 can be used, for example. It is particularly preferred that the protecting layer 194 include an inorganic insulating film with a high barrier property. A stack including an inorganic insulating film and an organic insulating film can also be used. The substrate temperature at the time of depositing the protecting layer 194 is preferably lower than or equal to the upper temperature limit of the EL layer 192.

Figure 14B:
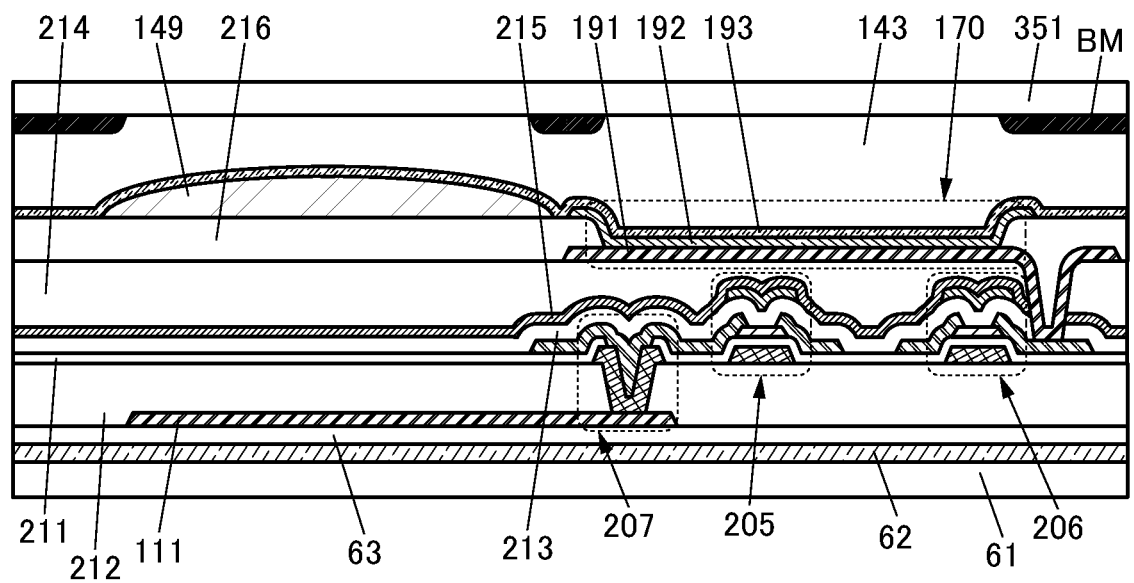

Next, the light-emitting element 170 is sealed with the adhesive layer 142 (see FIG. 6) and the substrate 351 (FIG. 14(B)). The space 143 surrounded by the substrate 351, the adhesive layer 142, and the insulating layer 214 is filled with an inert gas (such as nitrogen or argon) or a resin. The substrate 351 is bonded to the formation substrate 61 such that the surface where the light-blocking layer BM is provided is positioned on the light-emitting element 170 side.

Figure 15A:
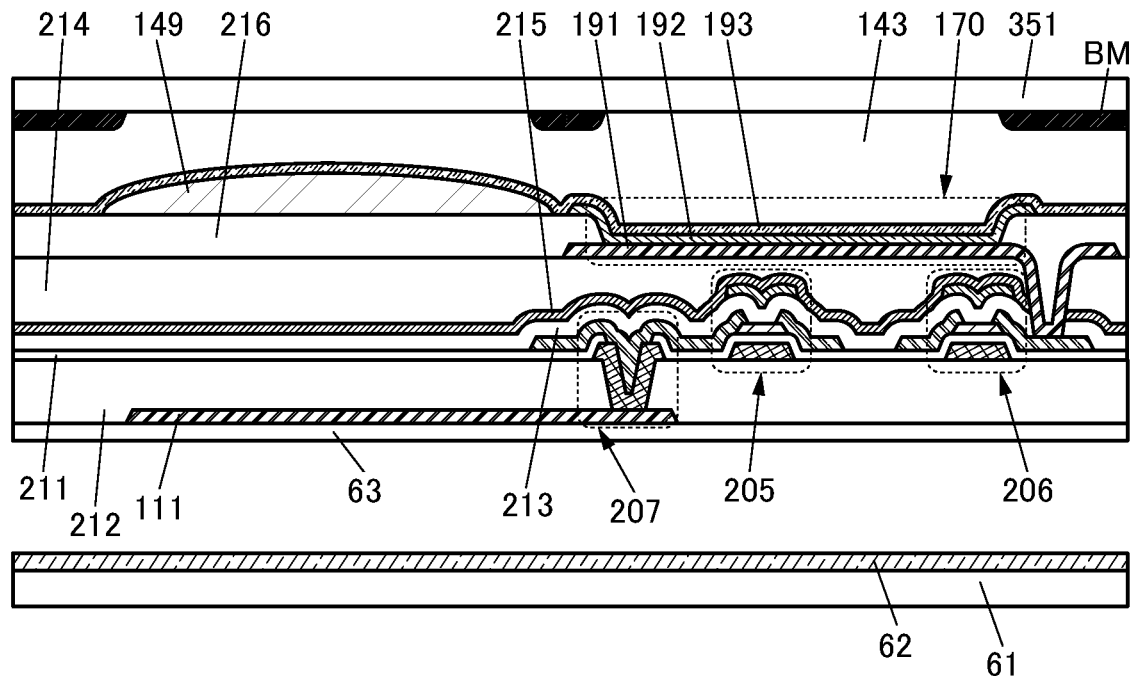
FIG. 15(A) and FIG. 15(B) are cross-sectional views showing an example of a method for manufacturing a display device.
Figure 15B:
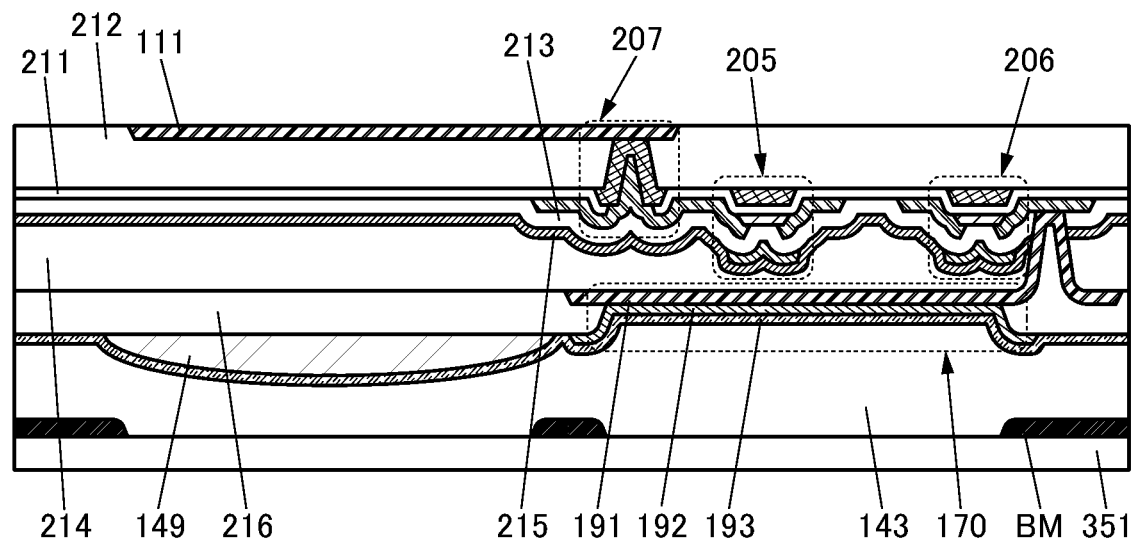

Next, the formation substrate 61 is separated (FIG. 15(A)). FIG. 15(A) shows an example in which the separation occurs at the interface between the separation layer 62 and the insulating layer 63. By the separation, the insulating layer 63 is exposed.

The position of the separation surface can vary depending on the materials, the formation methods, and the like of the insulating layer 63, the separation layer 62, the formation substrate 61, and the like. Note that the separation may occur at an interface between the separation layer 62 and the layer to be separated (here, an interface between the insulating layer 212 and the separation layer 62 and an interface between the electrode 111 and the separation layer 62) without providing the insulating layer 63.

Before the separation, a separation trigger may be formed in the separation layer 62. For example, part of or an entire surface of the separation layer 62 may be irradiated with laser light. Accordingly, the separation layer 62 can be embrittled or the adhesion between the separation layer 62 and the insulating layer 63 (or the formation substrate 61) can be lowered.

The formation substrate 61 can be separated by applying a perpendicular tensile force to the separation layer 62, for example. Specifically, part of a top surface of the substrate 351 is suctioned and pulled up, whereby the formation substrate 61 can be separated.

The separation trigger may be formed by inserting a sharp-shaped instrument such as a knife between the separation layer 62 and the insulating layer 63 (or the formation substrate 61). Alternatively, the separation trigger may be formed by cutting the separation layer 62 from the substrate 351 side with a sharp-shaped instrument.

Next, the insulating layer 63 is removed. The insulating layer 63 can be removed by a dry etching method, for example. In the case where the insulating layer 63 is an organic film, the insulating layer 63 may be removed by ashing. Accordingly, the electrode 111 is exposed (FIG. 15(B)).

Figure 16A:
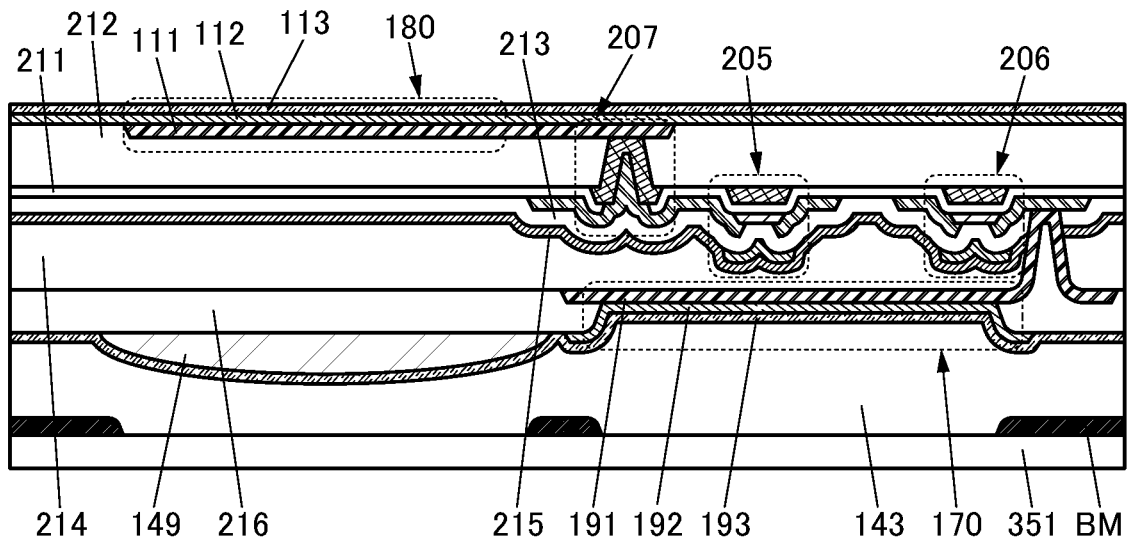
FIG. 16(A) and FIG. 16(B) are cross-sectional views showing an example of a method for manufacturing a display device.

Next, the light-receiving element 180 is formed by forming the organic layer 112 over the electrode 111 that is exposed and forming the electrode 113 over the organic layer 112 (FIG. 16(A)). The organic layer 112 can be formed by a method similar to that for the EL layer 192. The electrode 113 can be formed by an evaporation method, a sputtering method, or the like. The steps for forming the organic layer 112 and the electrode 113 are performed at a temperature that is lower than or equal to the upper temperature limit of the EL layer 192, the adhesive layer 142, the substrate 351, and the like.

Figure 16B:
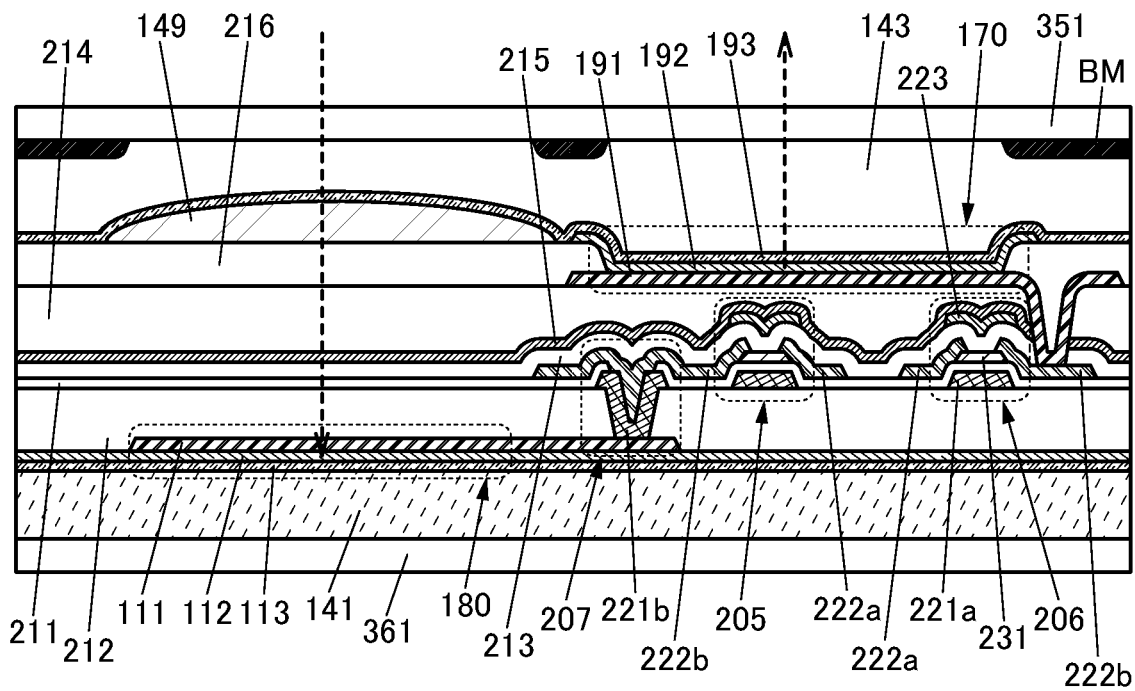

Then, the substrate 361 is bonded to the light-receiving element 180 with the adhesive layer 141 (FIG. 16(B)). Through the above steps, the display device 100A shown in FIG. 16(B) can be manufactured. Note that the FPC 372 is connected to the display device with the connection layer 242 as shown in FIG. 6.

[Method for Manufacturing Display Device 110A]

An example of a method for manufacturing the display device 110A shown in FIG. 9 is described below with reference to FIG. 17 and FIG. 18.

Figure 17A:
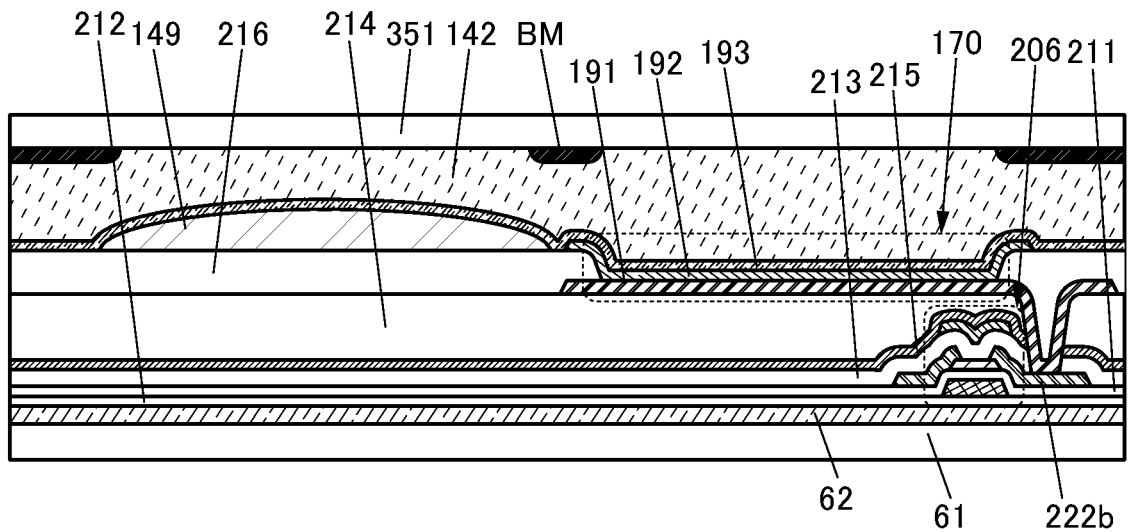
FIG. 17(A) and FIG. 17(B) are cross-sectional views showing an example of a method for manufacturing a display device.

First, the separation layer 62 is formed over the formation substrate 61. Note that although FIG. 17(A) shows an example in which the insulating layer 63 is not provided, the insulating layer 63 may be formed over the separation layer 62 as in FIG. 13(A). Next, the insulating layer 212 is formed over the separation layer 62 and the transistor 206 is formed over the insulating layer 212. Next, an opening reaching the conductive layer 222b included in the transistor 206 is formed in the insulating layer 214, the insulating layer 215, and the insulating layer 213. Next, the electrode 191, the insulating layer 216, the lens 149, the EL layer 192, and the electrode 193 are sequentially formed. Then, the light-emitting element 170 is sealed with the adhesive layer 142 and the substrate 351. For these steps, the description of the manufacturing method of the display device 100A can be referred to. Note that bonding of the substrate 351 is performed such that the surface where the light-blocking layer BM is provided is positioned on the light-emitting element 170 side. Through the above steps, the stacked-layer structure shown in FIG. 17(A) is manufactured.

Figure 17B:
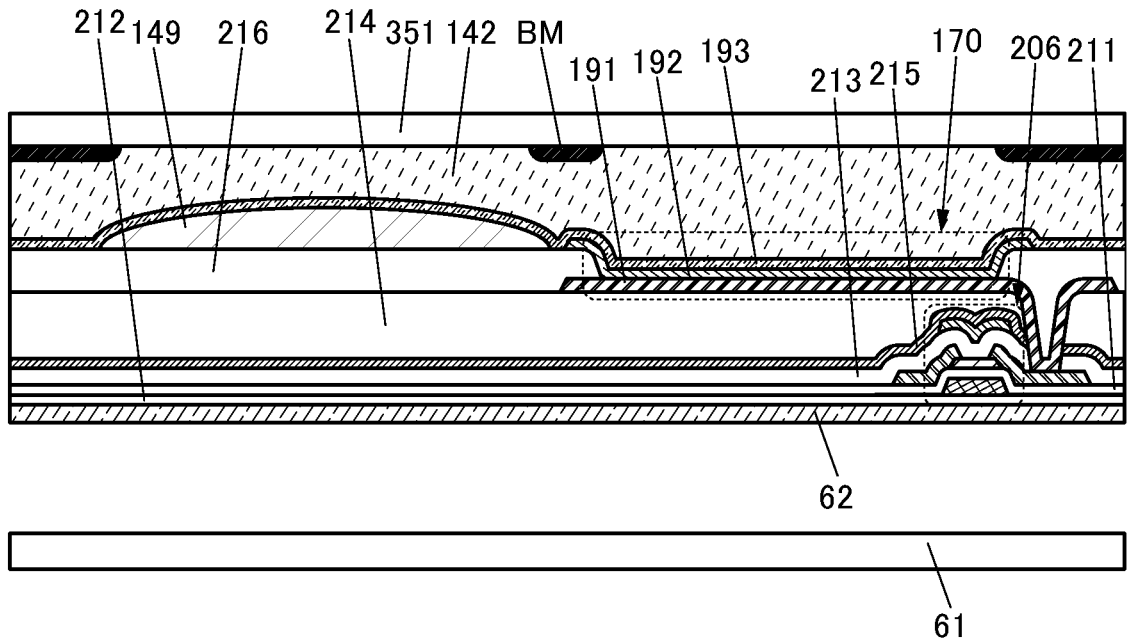

Then, the formation substrate 61 is separated (FIG. 17(B)). FIG. 17(B) shows an example in which the separation occurs at the interface between the formation substrate 61 and the separating layer 62. By the separation, the separating layer 62 is exposed. For the separation process of the substrate 61, the description of the manufacturing method of the display device 100A can be referred to.

Note that the separation layer 62 that is exposed may be removed or left in the display device 110A. In this embodiment, an example in which the separation layer 62 is removed and the insulating layer 212 is exposed is described.

Figure 18A:
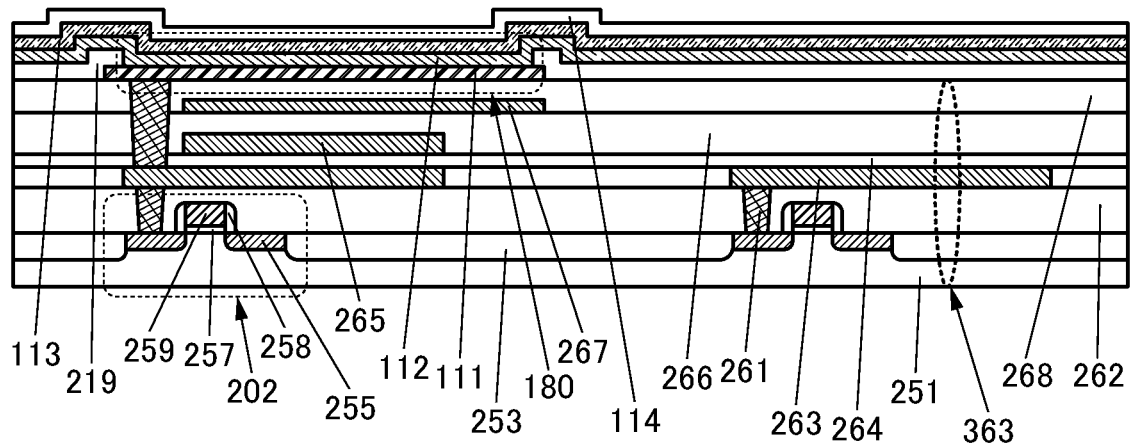
FIG. 18(A) and FIG. 18(B) are cross-sectional views showing an example of a method for manufacturing a display device.

The light-emitting element 180 and the protective layer 114 are formed over the circuit board 363 (FIG. 18(A)).

Figure 18B:
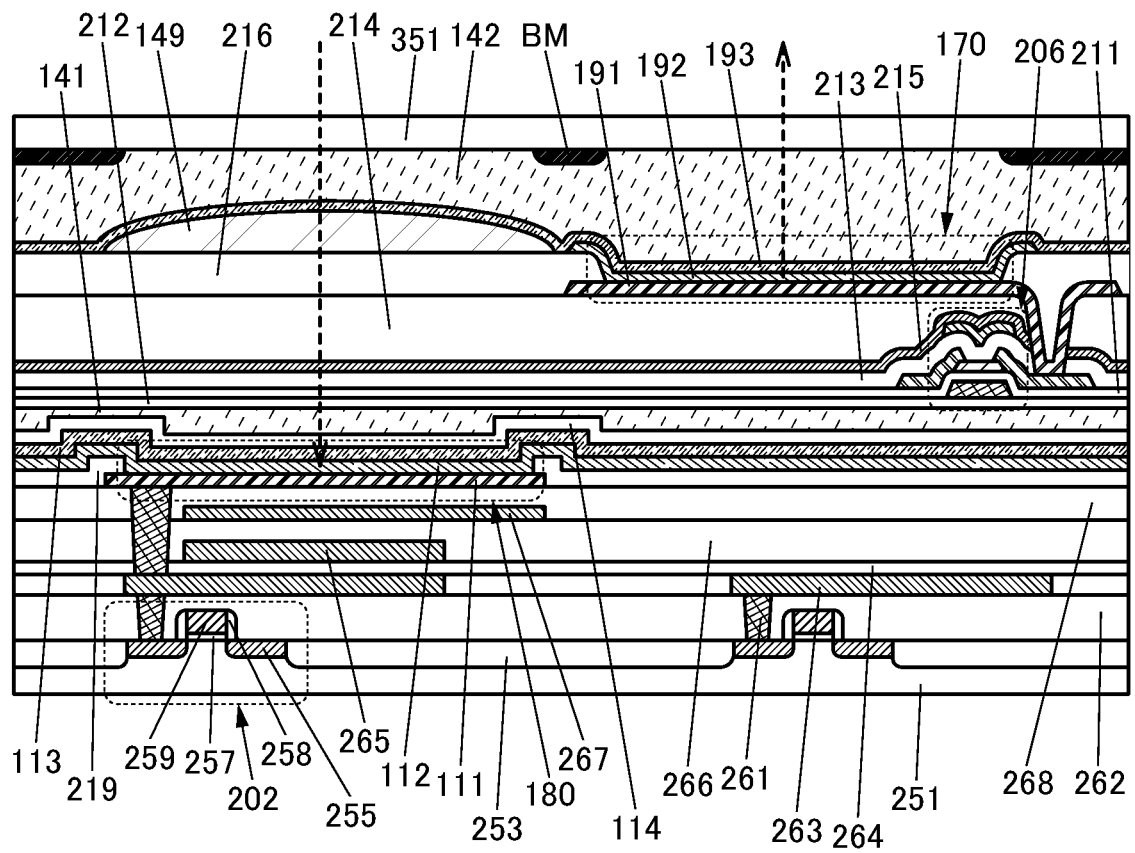

Then, the insulating layer 212 and the protective layer 114 are bonded to each other with the adhesive layer 141 (FIG. 18(B)). Through the above steps, the display device 110A shown in FIG. 18(B) can be manufactured.

As described above, the display device of this embodiment includes a light-receiving element and a light-emitting element in a display portion, and the display portion has both a function of displaying an image and a function of sensing light. Accordingly, the size and weight of an electronic device can be reduced as compared to the case where a sensor is provided outside a display portion or outside a display device. Moreover, a more multifunctional electronic device can be achieved by a combination of the display device and a sensor provided outside the display portion or outside the display device.

When a circuit electrically connected to the light-receiving element and a circuit electrically connected to the light-emitting element are manufactured using the same material and process, the manufacturing process of the display device can be simplified. Alternatively, the light-receiving element and the light-emitting element manufactured over respective substrates are bonded to each other, whereby the display device can be manufactured easily. In this manner, a highly convenient display device can be manufactured without a complicated process.

This embodiment can be combined with the other embodiments as appropriate. In this specification, in the case where a plurality of structure examples are shown in one embodiment, the structure examples can be combined as appropriate.

Embodiment 2

In this embodiment, a display device of one embodiment of the present invention is described with reference to FIG. 19.

The display device of one embodiment of the present invention includes first pixel circuits including a light-receiving element and second pixel circuits including a light-emitting element. The first pixel circuits and the second pixel circuits are each arranged in a matrix.

Figure 19A:
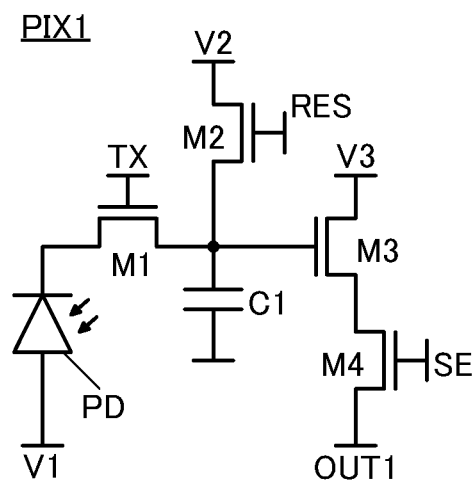
FIG. 19(A) and FIG. 19(B) are circuit diagrams each showing an example of a pixel circuit.
Figure 19B:
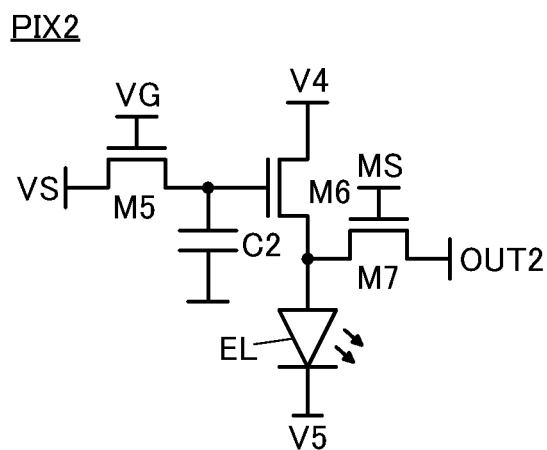

FIG. 19(A) shows an example of the first pixel circuit including a light-receiving element and FIG. 19(B) shows an example of the second pixel circuit including a light-emitting element.

A pixel circuit PIX1 shown in FIG. 19(A) includes a light-receiving element PD, a transistor M1, a transistor M2, a transistor M3, a transistor M4, and a capacitor C1. Here, an example in which a photodiode is used as the light-receiving element PD is shown.

An anode of the light-receiving element PD is electrically connected to a wiring V1 and a cathode is electrically connected to one of a source and a drain of the transistor M1. A gate of the transistor M1 is electrically connected to a wiring TX, and the other of the source and the drain is electrically connected to one electrode of the capacitor C1, one of a source and a drain of the transistor M2, and a gate of the transistor M3. A gate of the transistor M2 is electrically connected to a wiring RES, and the other of the source and the drain is electrically connected to a wiring V2. One of a source and a drain of the transistor M3 is electrically connected to a wiring V3, and the other of the source and the drain is electrically connected to one of a source and a drain of the transistor M4. A gate of the transistor M4 is electrically connected to a wiring SE, and the other of the source and the drain is electrically connected to a wiring OUT1.

A constant potential is supplied to the wiring V1, the wiring V2, and the wiring V3. In the case where the light-receiving element PD is driven with a reverse bias, the wiring V2 is supplied with a potential higher than the potential of the wiring V1. The transistor M2 is controlled by a signal supplied to the wiring RES and has a function of resetting the potential of a node connected to the gate of the transistor M3 to a potential supplied to the wiring V2. The transistor M1 is controlled by a signal supplied to the wiring TX and has a function of controlling the timing at which the potential of the node changes in accordance with a current flowing through the light-receiving element PD. The transistor M3 functions as an amplifier transistor for performing output corresponding to the potential of the node. The transistor M4 is controlled by a signal supplied to the wiring SE and functions as a selection transistor for reading an output corresponding to the potential of the node by an external circuit connected to the wiring OUT1.

A pixel circuit PIX2 shown in FIG. 19(B) includes a light-emitting element EL, a transistor M5, a transistor M6, a transistor M7, and a capacitor C2. Here, an example in which a light-emitting diode is used as the light-emitting element EL is shown. In particular, an organic EL element is preferably used as the light-emitting element EL.

A gate of the transistor M5 is electrically connected to a wiring VG, one of a source and a drain is electrically connected to a wiring VS, and the other of the source and the drain is electrically connected to one electrode of the capacitor C2 and a gate of the transistor M6. One of a source and a drain of the transistor M6 is electrically connected to a wiring V4, and the other is electrically connected to an anode of the light-emitting element EL and one of a source and a drain of the transistor M7. A gate of the transistor M7 is electrically connected to a wiring MS, and the other of the source and the drain is electrically connected to a wiring OUT2. A cathode of the light-emitting element EL is electrically connected to a wiring V5.

A constant potential can be supplied to the wiring V4 and the wiring V5. In the light-emitting element EL, the anode side can have a high potential and the cathode side can have a lower potential than the anode side. The transistor M5 is controlled by a signal supplied to the wiring VG and functions as a selection transistor for controlling a selection state of the pixel circuit PIX2. The transistor M6 functions as a driving transistor that controls a current flowing through the light-emitting element EL in accordance with a potential supplied to the gate. When the transistor M5 is in an on state, a potential supplied to the wiring VS is supplied to the gate of the transistor M6, and the emission luminance of the light-emitting element EL can be controlled in accordance with the potential. The transistor M7 is controlled by a signal supplied to the wiring MS and has a function of outputting a potential between the transistor M6 and the light-emitting element EL to the outside through the wiring OUT2.

Note that in the display device of this embodiment, the light-emitting element may be made to emit light in a pulsed manner so as to display an image. A reduction in the driving time of the light-emitting element can reduce power consumption of the display device and suppress heat generation. An organic EL element is particularly preferable because of its favorable frequency characteristics. The frequency can be higher than or equal to 1 kHz and lower than or equal to 100 MHz, for example.

Here, a transistor using a metal oxide (an oxide semiconductor) in a semiconductor layer where a channel is formed is preferably used as the transistor M1, the transistor M2, the transistor M3, and the transistor M4 included in the pixel circuit PIX1 and the transistor M5, the transistor M6, and the transistor M7 included in the pixel circuit PIX2.

A transistor using a metal oxide having a wider band gap and a lower carrier density than silicon can achieve an extremely low off-state current. Thus, such a low off-state current enables long-term retention of charges accumulated in a capacitor that is connected in series with the transistor. Accordingly, it is particularly preferable to use a transistor using an oxide semiconductor as the transistor M1, the transistor M2, and the transistor M5, each of which is connected in series with the capacitor C1 or the capacitor C2. Moreover, the use of transistors using an oxide semiconductor as the other transistors can reduce the manufacturing cost.

Alternatively, transistors using silicon as a semiconductor where a channel is formed can be used as the transistor M1 to the transistor M7. In particular, the use of silicon with high crystallinity, such as single crystal silicon or polycrystalline silicon, is preferable because high field-effect mobility can be achieved and higher-speed operation is possible.

Alternatively, a transistor using an oxide semiconductor may be used as one or more of the transistor M1 to the transistor M7, and transistors using silicon may be used as the other transistors.

Although n-channel transistors are shown as the transistors in FIG. 19(A) and FIG. 19(B), p-channel transistors can alternatively be used.

The transistors included in the pixel circuit PIX1 and the transistors included in the pixel circuit PIX2 are preferably formed side by side over the same substrate. It is particularly preferable that the transistors included in the pixel circuit PIX1 and the transistors included in the pixel circuit PIX2 be mixed and periodically arranged in one region.

One or a plurality of layers including one or both of the transistor and the capacitor are preferably provided at a position overlapping with the light-receiving element PD or the light-emitting element EL. Thus, the effective area of each pixel circuit can be reduced, and a high-definition light-receiving portion or display portion can be achieved.

This embodiment can be combined with the other embodiments as appropriate.

Embodiment 3

In this embodiment, electronic devices of one embodiment of the present invention are described with reference to FIG. 20 to FIG. 24.

The electronic devices in this embodiment each include the display device of one embodiment of the present invention. For example, the display device of one embodiment of the present invention can be used for a display portion of the electronic device. The display device of one embodiment of the present invention has a function of sensing light, and thus can perform biological authentication with the display portion or acquire data on facial expression of the user with the display portion. Accordingly, the convenience, the functionality, or the like of the electronic device can be improved.

Examples of the electronic device include a digital camera, a digital video camera, a digital photo frame, a mobile phone, a portable game console, a portable information terminal, and an audio reproducing device, in addition to electronic devices with a relatively large screen, such as a television device, a desktop or laptop personal computer, a monitor of a computer or the like, digital signage, and a large game machine such as a pachinko machine.

In particular, the display device of one embodiment of the present invention can have a high resolution, and thus can be favorably used for an electronic device having a relatively small display portion. Such an electronic device can be suitably used for, for example, a watch-type or bracelet-type information terminal device (wearable device) and a wearable device worn on a head, such as a device for VR such as a head-mounted display and a glasses-type device for AR.

The electronic devices in this embodiment may each include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic devices in this embodiment can each have a variety of functions. For example, the electronic devices can each have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 20A:
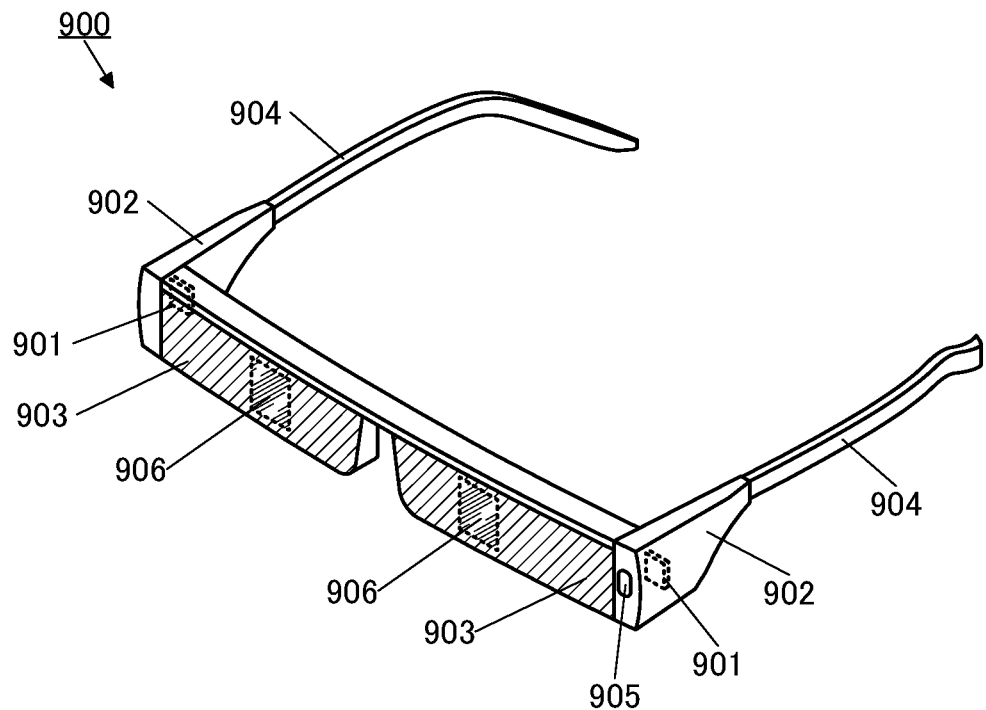
FIG. 20(A) and FIG. 20(B) are diagrams showing an example of an electronic device.

FIG. 20(A) shows a perspective view of a glasses-type electronic device 900. The electronic device 900 includes a pair of display panels 901, a pair of housings 902, a pair of optical members 903, a pair of mounting portions 904, and the like.

The electronic device 900 can project an image displayed on the display panel 901 onto a display region 906 of the optical member 903. Since the optical members 903 have a light-transmitting property, a user can see images displayed on the display regions 906, which are superimposed on transmission images seen through the optical members 903. Thus, the electronic device 900 is an electronic device capable of AR display.

The display panel 901 included in the electronic device 900 preferably has a function of capturing an image in addition to a function of displaying an image. In this case, the electronic device 900 can receive light incident on the display panel 901 through the optical member 903, and convert the light into an electric signal to be output. Thus, an image of the user's eye or the eye and its vicinity can be captured and the image can be output as image data to the outside or an arithmetic portion included in the electronic device 900.

One housing 902 is provided with a camera 905 capable of capturing an image of what lies in front thereof. Although not shown, one of the housings 902 is provided with a wireless receiver or a connector to which a cable can be connected, whereby a video signal or the like can be supplied to the housing 902. Furthermore, when the housing 902 is provided with an acceleration sensor such as a gyroscope sensor, the orientation of the user's head can be detected and an image corresponding to the orientation can be displayed on the display region 906. Moreover, the housing 902 is preferably provided with a battery and preferably charged with or without a wire.

Figure 20B:
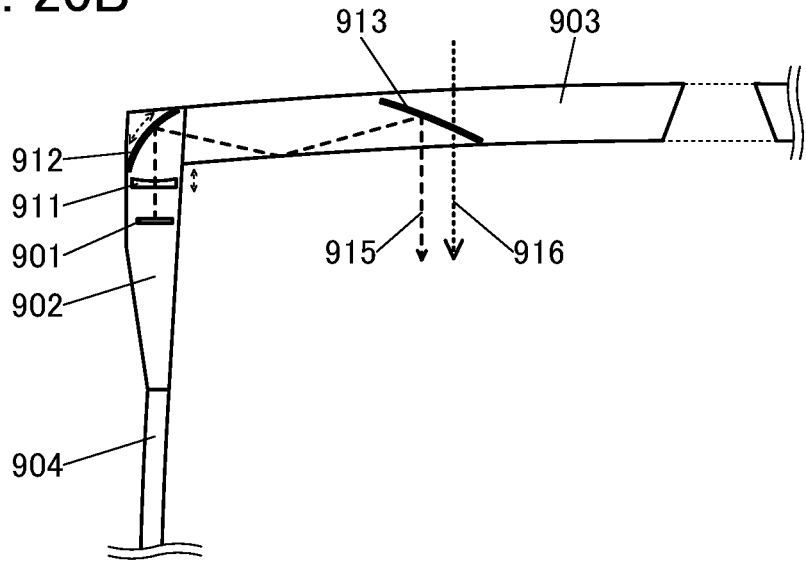

A method for projecting an image onto the display region 906 of the electronic device 900 is described with reference to FIG. 20(B). The display panel 901, a lens 911, and a reflective plate 912 are provided in the housing 902. A reflective surface 913 functioning as a half mirror is provided in a portion corresponding to the display region 906 of the optical member 903.

Light 915 emitted from the display panel 901 passes through the lens 911 and is reflected by the reflective plate 912 to the optical member 903 side. In the optical member 903, the light 915 is totally reflected repeatedly by end surfaces of the optical member 903 and reaches the reflective surface 913, whereby an image is projected onto the reflective surface 913. Accordingly, the user can see both the light 915 reflected by the reflective surface 913 and transmitted light 916 transmitted through the optical member 903 (including the reflective surface 913).

FIG. 20 shows an example in which the reflective plate 912 and the reflective surface 913 each have a curved surface. This can increase optical design flexibility and reduce the thickness of the optical member 903, compared to the case where they have flat surfaces. Note that the reflective plate 912 and the reflective surface 913 may have flat surfaces.

The reflective plate 912 can use a component having a mirror surface and preferably has high reflectivity. As the reflective surface 913, a half mirror utilizing reflection of a metal film may be used, but the use of a prism utilizing total reflection or the like can increase the transmittance of the transmitted light 916.

Here, the electronic device 900 preferably includes a mechanism for adjusting one or both of the distance and angle between the lens 911 and the display panel 901. This enables focus adjustment, zooming in/out of an image, or the like. One or both of the lens 911 and the display panel 901 are configured to be movable in the optical-axis direction, for example.

The electronic device 900 preferably includes a mechanism capable of adjusting the angle of the reflective plate 912. The position of the display region 906 where images are displayed can be changed by changing the angle of the reflective plate 912. Thus, the display region 906 can be arranged at the most appropriate position in accordance with the position of the user's eye.

The display device of one embodiment of the present invention can be used for the display panel 901. Thus, the electronic device 900 can perform display with extremely high resolution.

Figure 21A:
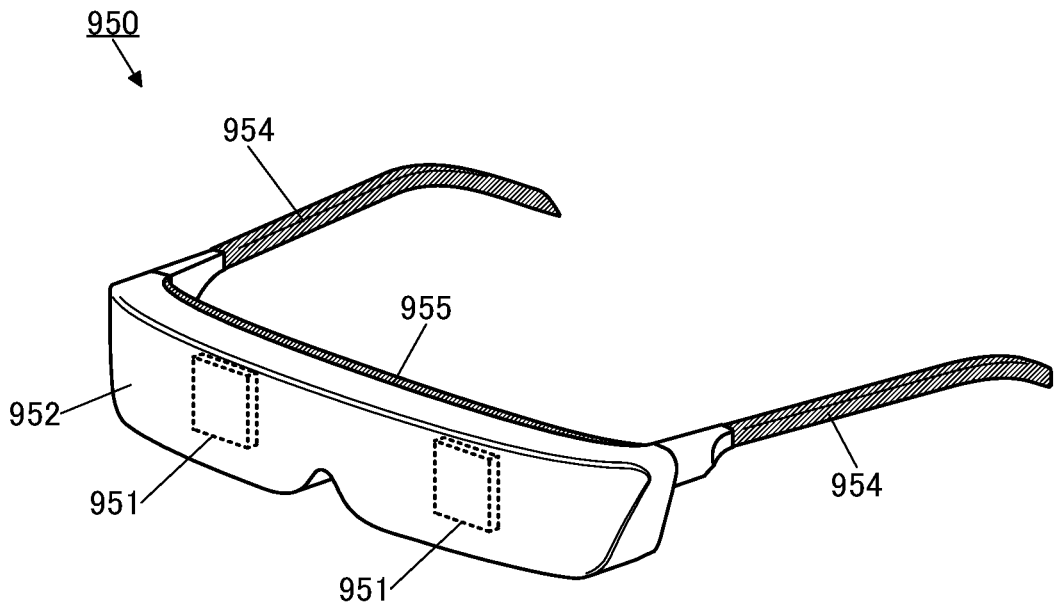
FIG. 21(A) and FIG. 21(B) are diagrams showing an example of an electronic device.
Figure 21B:
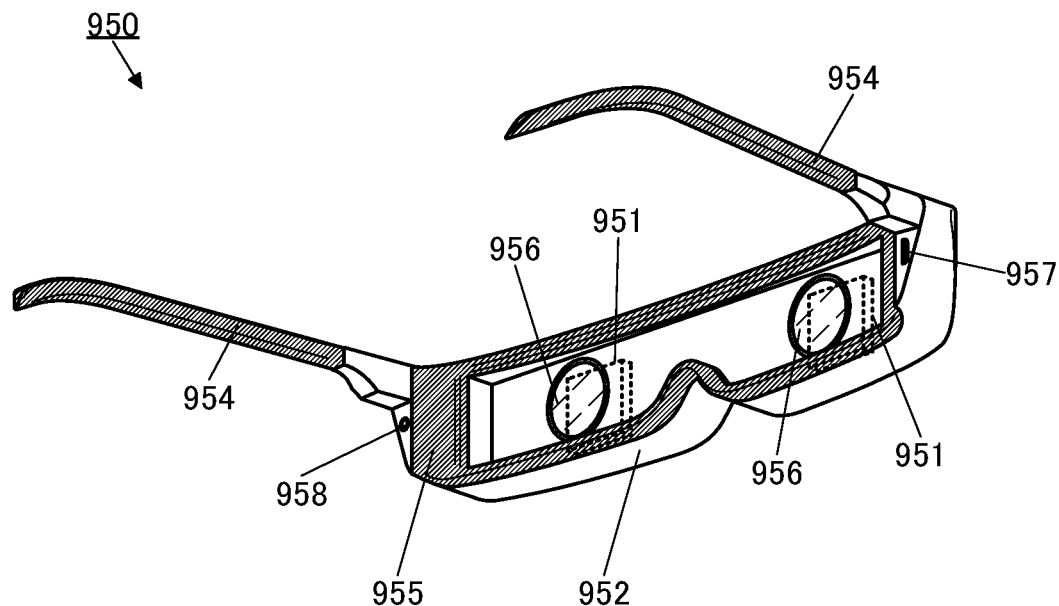

FIG. 21(A) and FIG. 21(B) show perspective views of a goggles-type electronic device 950. FIG. 21(A) is a perspective view showing a front surface, a top surface, and a left side surface of the electronic device 950, and FIG. 21(B) is a perspective view showing a back surface, a bottom surface, and a right side surface of the electronic device 950.

The electronic device 950 includes a pair of display panels 951, a housing 952, a pair of mounting portions 954, a cushion 955, a pair of lenses 956, and the like. The pair of display panels 951 is positioned to be seen through the lenses 956 inside the housing 952.

The electronic device 950 is an electronic device for VR. A user wearing the electronic device 950 can see an image displayed on the display panels 951 through the lenses 956. Furthermore, when the pair of display panels 951 displays different images, three-dimensional display using parallax can be performed.

An input terminal 957 and an output terminal 958 are provided on a back surface side of the housing 952. To the input terminal 957, a cable for supplying a video signal from a video output device or the like, power for charging a battery provided in the housing 952, or the like can be connected. The output terminal 958 can function as, for example, an audio output terminal to which earphones, headphones, or the like can be connected. Note that in the case where audio data can be output by wireless communication or sound is output from an external video output device, the audio output terminal is not necessarily provided.

In addition, the electronic device 900 preferably includes a mechanism by which the left and right positions of the lenses 956 and the display panels 951 can be adjusted to the optimal positions in accordance with the positions of the user's eyes. In addition, the electronic device 900 preferably includes a mechanism for adjusting focus by changing the distance between the lens 956 and the display panel 951.

The display device of one embodiment of the present invention can be used for the display panel 951. Thus, the electronic device 950 can perform display with extremely high resolution. This enables a user to feel high sense of immersion.

The cushion 955 is a portion in contact with the user's face (e.g., forehead or cheek). The cushion 955 is in close contact with the user's face, so that light leakage can be prevented, which further increases the sense of immersion. A soft material is preferably used for the cushion 955 so that the cushion 955 is in close contact with the user's face when the user wears the electronic device 950. For example, a material such as rubber, silicone rubber, urethane, or sponge can be used. Furthermore, when a sponge or the like whose surface is covered with cloth, leather (natural leather or synthetic leather), or the like is used as the cushion 955, a gap is unlikely to be generated between the user's face and the cushion 955, whereby light leakage can be suitably prevented. The member in contact with user's skin, such as the cushion 955 or the mounting portion 954, is preferably detachable, in which case cleaning or replacement can be easily performed.

Figure 22A:
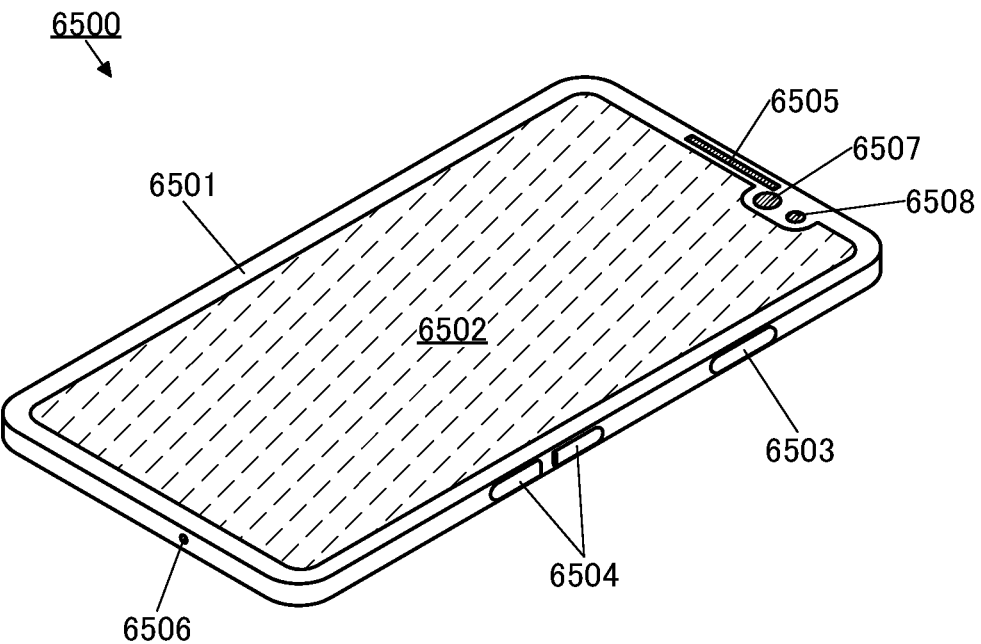
FIG. 22(A) and FIG. 22(B) are diagrams showing an example of an electronic device.

An electronic device 6500 shown in FIG. 22(A) is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display device of one embodiment of the present invention can be used for the display portion 6502.

Figure 22B:
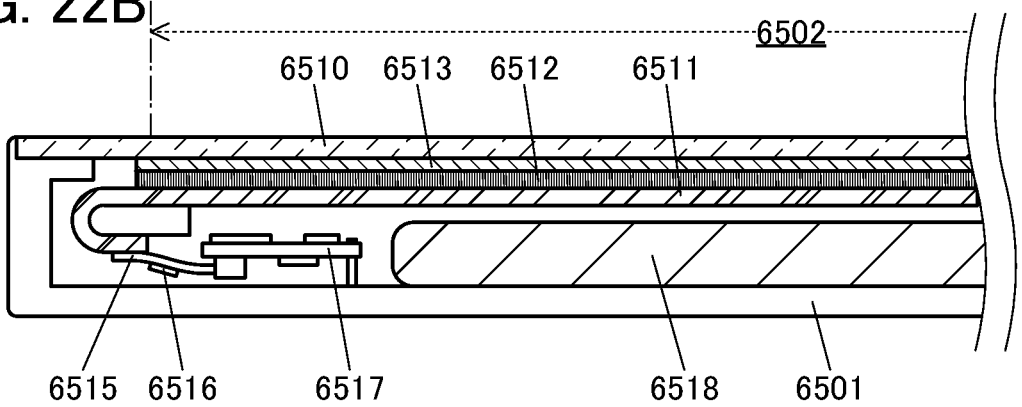

FIG. 22(B) is a schematic cross-sectional view including an end portion of the housing 6501 on the microphone 6506 side.

A protective member 6510 having a light-transmitting property is provided on a display surface side of the housing 6501, and a display panel 6511, an optical member 6512, a touch sensor panel 6513, a printed circuit board 6517, a battery 6518, and the like are arranged in a space surrounded by the housing 6501 and the protective member 6510.

The display panel 6511, the optical member 6512, and the touch sensor panel 6513 are fixed to the protective member 6510 with an adhesive layer (not shown).

Part of the display panel 6511 is folded in a region outside the display portion 6502, and an FPC 6515 is connected to the folded part. An IC 6516 is mounted on the FPC 6515. The FPC 6515 is connected to a terminal provided on the printed circuit board 6517.

The display device of one embodiment of the present invention can be used for the display panel 6511. Thus, an extremely lightweight electronic device can be achieved. Furthermore, since the display panel 6511 is extremely thin, the battery 6518 with a high capacity can be mounted without an increase in the thickness of the electronic device. Moreover, part of the display panel 6511 is folded to provide a connection portion with the FPC 6515 on a back side of the pixel portion, whereby an electronic device with a narrow bezel can be achieved.

Figure 23A:
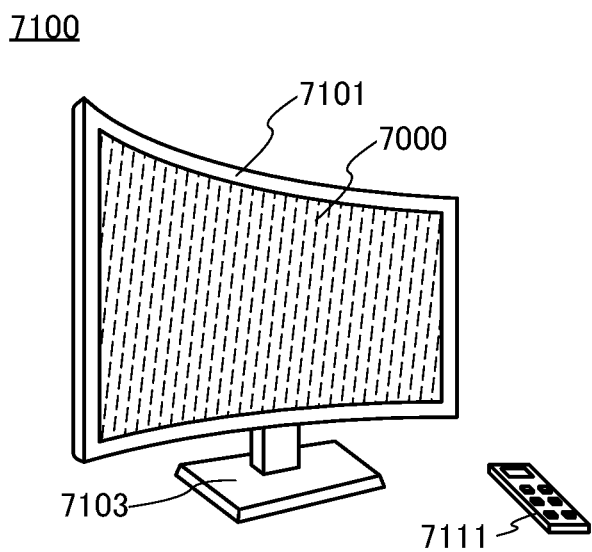
FIG. 23(A) to FIG. 23(D) are diagrams each showing an example of an electronic device.

FIG. 23(A) shows an example of a television device. In a television device 7100, a display portion 7000 is incorporated in a housing 7101. Here, a structure in which the housing 7101 is supported by a stand 7103 is shown.

The display device of one embodiment of the present invention can be used for the display portion 7000.

Operation of the television device 7100 shown in FIG. 23(A) can be performed with an operation switch provided in the housing 7101 or a separate remote controller 7111. Alternatively, the display portion 7000 may include a touch sensor, and the television device 7100 may be operated by touch on the display portion 7000 with a finger or the like. The remote controller 7111 may be provided with a display portion for displaying data output from the remote controller 7111. With operation keys or a touch panel provided in the remote controller 7111, channels and volume can be operated and videos displayed on the display portion 7000 can be operated.

Note that the television device 7100 has a structure including a receiver, a modem, and the like. A general television broadcast can be received with the receiver. When the television device is connected to a communication network with or without wires via the modem, one-way (from a transmitter to a receiver) or two-way (e.g., between a transmitter and a receiver or between receivers) data communication can be performed.

Figure 23B:
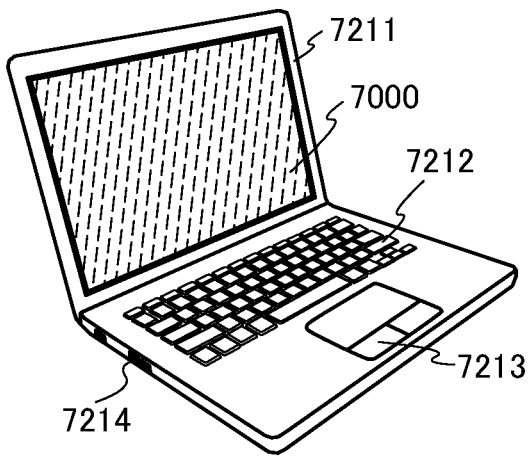

FIG. 23(B) shows an example of a laptop personal computer. A laptop personal computer 7200 includes a housing 7211, a keyboard 7212, a pointing device 7213, an external connection port 7214, and the like. In the housing 7211, the display portion 7000 is incorporated.

The display device of one embodiment of the present invention can be used for the display portion 7000.

Figure 23C:
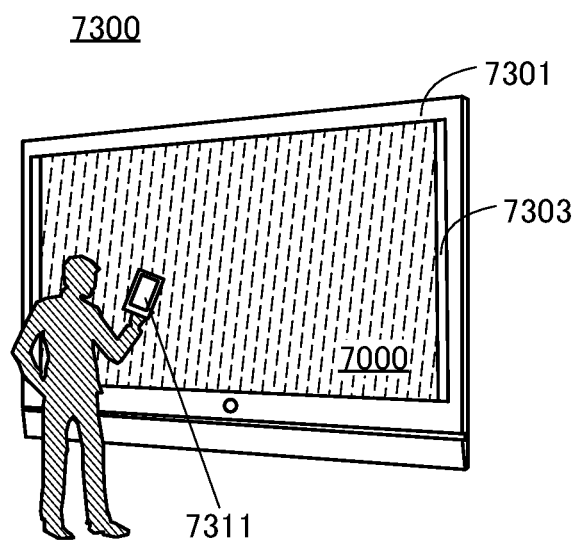
Figure 23D:
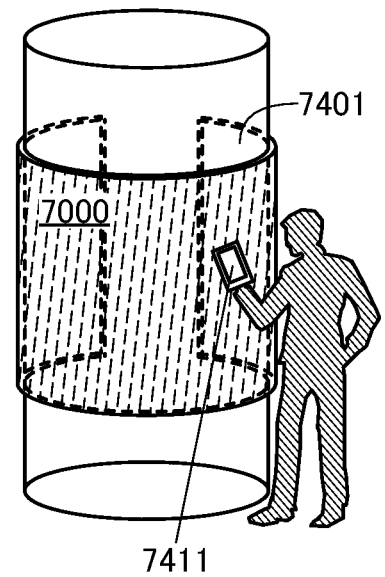

FIG. 23(C) and FIG. 23(D) show examples of digital signage.

Digital signage 7300 shown in FIG. 23(C) includes a housing 7301, the display portion 7000, a speaker 7303, and the like. Furthermore, the digital signage can include an LED lamp, operation keys (including a power switch or an operation switch), a connection terminal, a variety of sensors, a microphone, and the like.

FIG. 23(D) is digital signage 7400 attached to a cylindrical pillar 7401. The digital signage 7400 includes the display portion 7000 provided along a curved surface of the pillar 7401.

The display device of one embodiment of the present invention can be used for the display portion 7000 in FIG. 23(C) and FIG. 23(D).

A larger area of the display portion 7000 can increase the amount of data that can be provided at a time. The larger display portion 7000 attracts more attention, and thus can increase the effectiveness of the advertisement, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As shown in FIG. 23(C) and FIG. 23(D), it is preferable that the digital signage 7300 or the digital signage 7400 be capable of working with an information terminal 7311 or an information terminal 7411 such as a user's smartphone through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is also possible to make the digital signage 7300 or the digital signage 7400 execute a game with the use of the screen of the information terminal 7311 or the information terminal 7411 as an operation means (controller). Thus, an unspecified number of users can join in and enjoy the game concurrently.

Electronic devices shown in FIG. 24(A) to FIG. 24(F) include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices shown in FIG. 24(A) to FIG. 24(F) have a variety of functions. For example, the electronic devices can have a function of displaying a variety of data (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may include a camera or the like and have a function of taking a still image or a moving image and storing the taken image in a recording medium (external or incorporated in the camera), a function of displaying the taken image on the display portion, or the like.

The details of the electronic devices shown in FIG. 24(A) to FIG. 24(F) are described below.

Figure 24A:
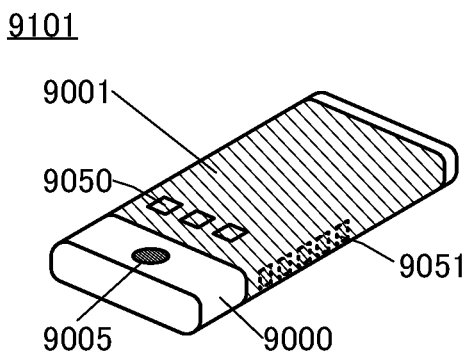
FIG. 24(A) to FIG. 24(F) are diagrams showing examples of electronic devices.

FIG. 24(A) is a perspective view showing a portable information terminal 9101. For example, the portable information terminal 9101 can be used as a smartphone. Note that the portable information terminal 9101 may be provided with the speaker 9003, the connection terminal 9006, the sensor 9007, or the like. The portable information terminal 9101 can display characters and image data on its plurality of surfaces. FIG. 24(A) shows an example where three icons 9050 are displayed. Information 9051 indicated by dashed rectangles can be displayed on another surface of the display portion 9001. Examples of the information 9051 include notification of reception of an e-mail, SNS, or an incoming call, the title and sender of an e-mail, SNS, or the like, the date, the time, remaining battery, and the reception strength of an antenna. Alternatively, the icon 9050 or the like may be displayed in the position where the information 9051 is displayed.

Figure 24C:
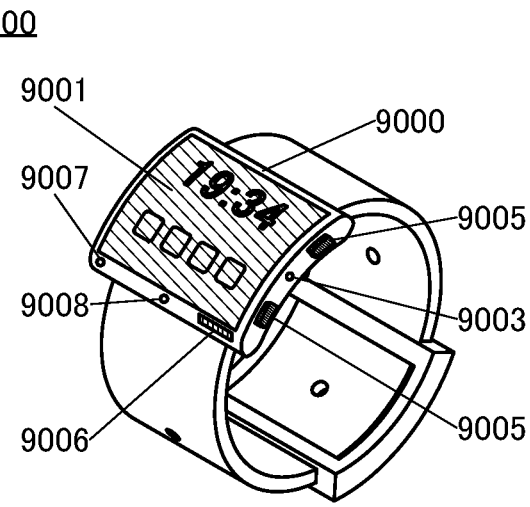
Figure 24B:
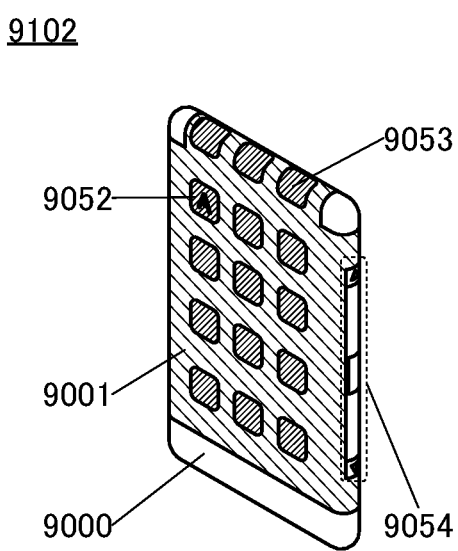

FIG. 24(B) is a perspective view showing a portable information terminal 9102. The portable information terminal 9102 has a function of displaying information on three or more surfaces of the display portion 9001. Here, an example in which information 9052, information 9053, and information 9054 are displayed on different surfaces is shown. For example, the user can check the information 9053 displayed in a position that can be observed from above the portable information terminal 9102, with the portable information terminal 9102 put in a breast pocket of his/her clothes. The user can see the display without taking out the portable information terminal 9102 from the pocket and decide whether to answer the call, for example.

FIG. 24(C) is a perspective view showing a watch-type portable information terminal 9200. The portable information terminal 9200 can be used as a smart watch, for example. The display portion 9001 is provided with its display surface curved, and display can be performed along the curved display surface. Mutual communication between the portable information terminal 9200 and, for example, a headset capable of wireless communication enables handsfree calling. With the connection terminal 9006, the portable information terminal 9200 can perform mutual data transmission with another information terminal and charging. Note that the charging operation may be performed by wireless power feeding.

Figure 24D:
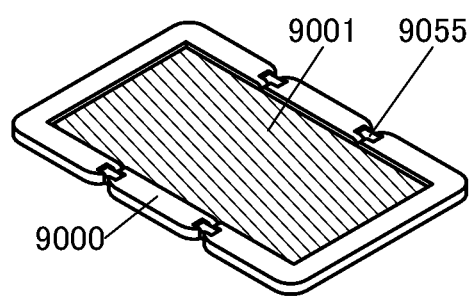
Figure 24E:
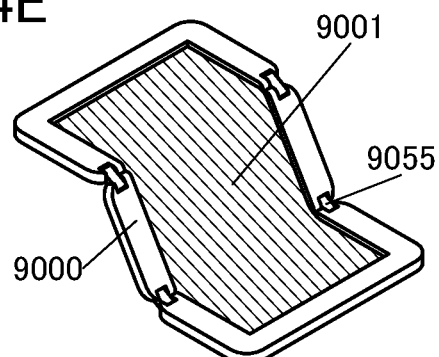
Figure 24F:
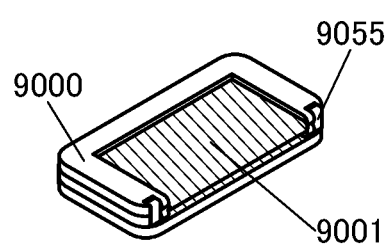

FIG. 24(D) to FIG. 24(F) are perspective views showing a foldable portable information terminal 9201. FIG. 24(D) is a perspective view of an opened state of the portable information terminal 9201, FIG. 24(F) is a perspective view of a folded state thereof, and FIG. 24(E) is a perspective view of a state in the middle of change from one of FIG. 24(D) and FIG. 24(F) to the other. The portable information terminal 9201 is highly portable in the folded state and is highly browsable in the opened state because of a seamless large display region. The display portion 9001 included in the portable information terminal 9201 is supported by three housings 9000 joined by hinges 9055. For example, the display portion 9001 can be folded with a radius of curvature of greater than or equal to 0.1 mm and less than or equal to 150 mm.

This embodiment can be combined with the other embodiments as appropriate.

REFERENCE NUMERALS

C1: capacitor, C2: capacitor, EL: light-emitting element, IR: light-emitting element, M1: transistor, M2: transistor, M3: transistor, M4: transistor, M5: transistor, M6: transistor, M7: transistor, MS: wiring, OUT1: wiring, OUT2: wiring, PIX1: pixel circuit, PIX2: pixel circuit, PD: light-receiving element, RES: wiring, SE: wiring, TX: wiring, V1: wiring, V2: wiring, V3: wiring, V4: wiring, V5: wiring, VG: wiring, VS: wiring, 10: display device, 10A: display device, 10B: display device, 11A: display device, 11B: display device, 12A: display device, 12B: display device, 20: display device, 21: emitted light, 22: light, 23a: light, 23b: reflected light, 41: transistor, 42: transistor, 51: substrate, 53: layer including a light-receiving element, 54: insulating layer, 55: layer including a transistor, 57: layer including a light-emitting element, 59: substrate, 61: formation substrate, 62: separation layer, 63: insulating layer, 100A: display device, 100B: display device, 100C: display device, 110A: display device, 110B: display device, 111: electrode, 112: organic layer, 113: electrode, 114: protective layer, 120A: display device, 120B: display device, 121: insulating layer, 141: adhesive layer, 142: adhesive layer, 143: space, 148: lens array, 149: lens, 170: light-emitting element, 180: light-receiving element, 191: electrode, 192: EL layer, 193: electrode, 194: protective layer, 201: transistor, 202: transistor, 203: transistor, 204: connection portion, 205: transistor, 206: transistor, 207: connection portion, 208: transistor, 209: transistor, 210: transistor, 211: insulating layer, 212: insulating layer, 213: insulating layer, 214: insulating layer, 215: insulating layer, 216: insulating layer, 217: insulating layer, 218: insulating layer, 219: insulating layer, 221a: conductive layer, 221b: conductive layer, 222a: conductive layer, 222b: conductive layer, 223: conductive layer, 225: insulating layer, 228: region, 231: semiconductor layer, 231i: channel formation region, 231n: low-resistance region, 240: capacitor, 242: connection layer, 245: capacitor, 251:

semiconductor substrate, 252: substrate, 253: element isolation layer, 255: low-resistance region, 257: insulating layer, 258: insulating layer, 259: conductive layer, 261: plug, 261*a*: conductive layer, 261*b*: conductive layer, 262: insulating layer, 263: conductive layer, 264: insulating layer, 265: conductive layer, 266: insulating layer, 267: plug, 271: insulating layer, 272: conductive layer, 273: insulating layer, 274: insulating layer, 275: insulating layer, 276: semiconductor layer, 277: conductive layer, 278: insulating layer, 279: conductive layer, 281: insulating layer, 282: insulating layer, 283: insulating layer, 284: insulating layer, 285: conductive layer, 286: insulating layer, 287: conductive layer, 288: insulating layer, 289: plug, 351: substrate, 361: substrate, 362: display portion, 363: circuit board, 364: circuit, 365: wiring, 366: conductive layer, 372: FPC, 373: IC, 900: electronic device, 901: display panel, 902: housing, 903: optical member, 904: mounting portion, 905: camera, 906: display region, 911: lens, 912: reflective plate, 913: reflective surface, 915: light, 916: transmitted light, 950: electronic device, 951: display panel, 952: housing, 954: mounting portion, 955: cushion, 956: lens, 957: input terminal, 958: output terminal, 6500: electronic device, 6501: housing, 6502: display portion, 6503: power button, 6504: button, 6505: speaker, 6506: microphone, 6507: camera, 6508: light source, 6510: protective member, 6511: display panel, 6512: optical member, 6513: touch sensor panel, 6515: FPC, 6516: IC, 6517: printed circuit board, 6518: battery, 7000: display portion, 7100: television device, 7101: housing, 7103: stand, 7111: remote controller, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal, 9000: housing, 9001: display portion, 9003: speaker, 9005: operation key, 9006: connection terminal, 9007: sensor, 9008: microphone, 9050: icon, 9051: information, 9052: information, 9053: information, 9054: information, 9055: hinge, 9101: portable information terminal, 9102: portable information terminal, 9200: portable information terminal, 9201: portable information terminal.

The invention claimed is:

1. A display device comprising a display portion,
wherein the display portion comprises a first substrate, a second substrate, a light-receiving element, a transistor, and a light-emitting element,
wherein the light-receiving element, the transistor, and the light-emitting element are each positioned between the first substrate and the second substrate,
wherein the light-receiving element is positioned closer to the first substrate than the transistor is,
wherein the light-emitting element is positioned closer to the second substrate than the transistor is,
wherein the light-receiving element comprises a first electrode, a first layer comprising an organic compound over the first electrode, and a second electrode over the first layer,
wherein the light-emitting element comprises a third electrode, a second layer over the third electrode, and a fourth electrode over the second layer,
wherein the second electrode is configured to transmit light,
wherein the fourth electrode is configured to transmit light, and
wherein the transistor is electrically connected to the light-emitting element.

2. The display device according to claim 1,
wherein the display portion further comprises an insulating layer,
wherein the insulating layer is positioned between the transistor and the light-receiving element, and
wherein light enters the light-receiving element through the insulating layer.

3. The display device according to claim 2,
wherein the display portion further comprises a lens,
wherein the lens is positioned over the insulating layer, and
wherein light transmitted through the lens enters the light-receiving element through the insulating layer.

4. The display device according to claim 1,
wherein the display portion further comprises an insulating layer,
wherein the insulating layer is positioned between the transistor and the light-receiving element, and
wherein light emitted from the light-emitting element is extracted to the outside through the insulating layer.

5. The display device according to claim 4,
wherein the display portion further comprises a coloring layer and a lens,
wherein the light emitted from the light-emitting element is extracted to the outside through the coloring layer, and
wherein light transmitted through the lens enters the light-receiving element.

6. The display device according to claim 1,
further comprising a lens,
wherein light transmitted through the lens enters the light-receiving element.

7. A display module comprising the display device according to claim 1 and a connector or an integrated circuit.

8. An electronic device comprising:
the display module according to claim 7; and
at least any one of an antenna, a battery, a housing, a camera, a speaker, a microphone, and an operation button.

9. A display device comprising:
a light-receiving element;
a first insulating layer over the light-receiving element;
a first transistor over the first insulating layer;
a second transistor over the first insulating layer;
a second insulating layer over the first transistor; and
a light-emitting element over the second insulating layer,
wherein the light-receiving element comprises a first electrode, a first layer comprising an organic compound over the first electrode, and a second electrode over the first layer,
wherein the light-emitting element comprises a third electrode, a second layer over the third electrode, and a fourth electrode over the second layer,
wherein the second electrode is configured to transmit light,
wherein the fourth electrode is configured to transmit light,
wherein the first insulating layer comprises a first opening,
wherein the second insulating layer comprises a second opening, and
wherein the first transistor is electrically connected to the light-receiving element through the first opening, and
wherein the second transistor is electrically connected to the light-emitting element through the second opening.

10. The display device according to claim 9,
further comprising a lens, wherein light transmitted through the lens enters the light-receiving element.

11. A display module comprising the display device according to claim 9 and a connector or an integrated circuit.

12. An electronic device comprising:
the display module according to claim 11; and
at least any one of an antenna, a battery, a housing, a camera, a speaker, a microphone, and an operation button.

13. A display device comprising:
a first transistor;
a first insulating layer over the first transistor;
a light-receiving element over the first insulating layer;
an adhesive layer over the light-receiving element;
a second insulating layer over the adhesive layer;
a second transistor over the second insulating layer;
a third insulating layer over the second transistor; and
a light-emitting element over the third insulating layer,
wherein the light-receiving element comprises a first electrode, a first layer comprising an organic compound over the first electrode, and a second electrode over the first layer,
wherein the light-emitting element comprises a third electrode, a second layer over the third electrode, and a fourth electrode over the second layer,
wherein the second electrode is configured to transmit light,
wherein the fourth electrode is configured to transmit light,
wherein the first insulating layer comprises a first opening,
wherein the third insulating layer comprises a second opening,
wherein the first transistor is electrically connected to the light-receiving element through the first opening, and
wherein the second transistor is electrically connected to the light-emitting element through the second opening.

14. The display device according to claim 13,
further comprising a lens,
wherein light transmitted through the lens enters the light-receiving element.

15. A display module comprising the display device according to claim 13 and a connector or an integrated circuit.

16. An electronic device comprising:
the display module according to claim 15; and
at least any one of an antenna, a battery, a housing, a camera, a speaker, a microphone, and an operation button.

* * * * *